US012757754B2

(12) United States Patent
Kusama et al.

(10) Patent No.: US 12,757,754 B2
(45) Date of Patent: Oct. 6, 2026

(54) SEMICONDUCTOR MODULE

(71) Applicant: DENSO CORPORATION, Kariya-city (JP)

(72) Inventors: Hirotoshi Kusama, Kariya-city (JP); Naruhiro Inoue, Kariya-city (JP); Shuna Nagai, Kariya-city (JP); Keita Fukutani, Kariya-city (JP); Yasushi Furukawa, Kariya-city (JP); Takahide Kato, Kariya-city (JP); Shunsuke Arai, Kariya-city (JP); Ryota Miwa, Kariya-city (JP); Shoichiro Omae, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 352 days.

(21) Appl. No.: 18/631,633

(22) Filed: Apr. 10, 2024

(65) Prior Publication Data

US 2024/0274511 A1 Aug. 15, 2024

Related U.S. Application Data

(63) Continuation of application No. PCT/JP2022/041140, filed on Nov. 4, 2022.

(30) Foreign Application Priority Data

Nov. 17, 2021 (JP) ................................ 2021-187168

(51) Int. Cl.
*H10W 70/40* (2026.01)
*H10W 40/25* (2026.01)
(Continued)

(52) U.S. Cl.
CPC ....... *H10W 70/467* (2026.01); *H10W 40/255* (2026.01); *H10W 74/111* (2026.01); *H10W 90/00* (2026.01); *H10W 90/736* (2026.01)

(58) Field of Classification Search
CPC .... H10W 74/11; H10W 40/778; H10W 72/30
See application file for complete search history.

(56) References Cited

U.S. PATENT DOCUMENTS

| | | | | |
|---|---|---|---|---|
| 10,720,383 | B2 * | 7/2020 | Hiramitsu | H10W 70/461 |
| 12,074,082 | B2 * | 8/2024 | Yamane | H10W 40/22 |

(Continued)

FOREIGN PATENT DOCUMENTS

| | | |
|---|---|---|
| JP | H2-089852 U | 7/1990 |
| JP | H04-025144 A | 1/1992 |

(Continued)

*Primary Examiner* — Mounir S Amer
(74) *Attorney, Agent, or Firm* — POSZ LAW GROUP, PLC

(57) ABSTRACT

A semiconductor module includes a semiconductor element, a heat dissipation member thermally connected to the semiconductor element, a resin member, a signal terminal, and a wiring member. The resin member accommodates the semiconductor element, the heat dissipation member, and the wiring member. At least a part of the heat dissipation member is exposed from the resin member. The wiring member is a member more flexible than the signal terminal, and includes an electrically insulating resin layer and a metal layer supported by the resin layer. The wiring member connects a signal pad of the semiconductor element and the signal terminal.

10 Claims, 20 Drawing Sheets

(51) Int. Cl.

*H10W 74/10* (2026.01)
*H10W 90/00* (2026.01)

(56) References Cited

U.S. PATENT DOCUMENTS

| | | | | |
|---|---|---|---|---|
| 12,476,163 | B2 * | 11/2025 | Nakano | H10W 40/22 |
| 12,482,714 | B2 * | 11/2025 | Oosawa | H10W 70/09 |
| 2006/0071314 | A1 * | 4/2006 | Ho | H10W 90/00 257/E25.023 |
| 2016/0218047 | A1 * | 7/2016 | Okumura | H10W 40/226 |
| 2017/0133308 | A1 * | 5/2017 | Inaba | H10W 70/65 |

FOREIGN PATENT DOCUMENTS

| | | | |
|---|---|---|---|
| JP | H4-214646 | A | 8/1992 |
| JP | H11-016942 | A | 1/1999 |
| JP | 2007-281378 | A | 10/2007 |
| JP | 2013-065620 | A | 4/2013 |
| JP | 2014-086659 | A | 5/2014 |
| JP | 2021-027241 | A | 2/2021 |
| JP | 2021-034701 | A | 3/2021 |
| WO | 2020/079970 | A1 | 4/2020 |

* cited by examiner

SEMICONDUCTOR MODULE

CROSS REFERENCE TO RELATED APPLICATIONS

The present application is a continuation application of International Patent Application No. PCT/JP2022/041140 filed on Nov. 4, 2022, which designated the U.S. and claims the benefit of priority from Japanese Patent Application No. 2021-187168 filed on Nov. 17, 2021. The entire disclosures of all of the above applications are incorporated herein by reference.

TECHNICAL FIELD

The present disclosure relates to a semiconductor module.

BACKGROUND

For example, JP2014-86659A describes a semiconductor module that houses a semiconductor element including a switching element. The semiconductor module includes a wiring sheet. The wiring sheet is formed of a flexible printed circuit board. The wiring sheet of JP2014-86659A includes a land portion that solder-connects an electrode and a terminal as a power path of the switching element. Further, the wiring sheet of JP2014-86659A includes a control wiring connected to a control electrode of the switching element. The disclosure of JP2014-86659A is incorporated herein by reference as an explanation of technical elements in the present disclosure.

SUMMARY

The present disclosure describes a semiconductor module that includes a semiconductor element, a heat dissipation member thermally connected to the semiconductor element, a resin member, a signal terminal, and a wiring member. The resin member accommodates the semiconductor element, the heat dissipation member, and the wiring member. At least a part of the heat dissipation member is exposed from the resin member. The wiring member is a member more flexible than the signal terminal, and includes an electrically insulating resin layer and a metal layer supported by the resin layer. The wiring member connects a signal pad of the semiconductor element and the signal terminal.

DETAILED DESCRIPTION

Figure 1:
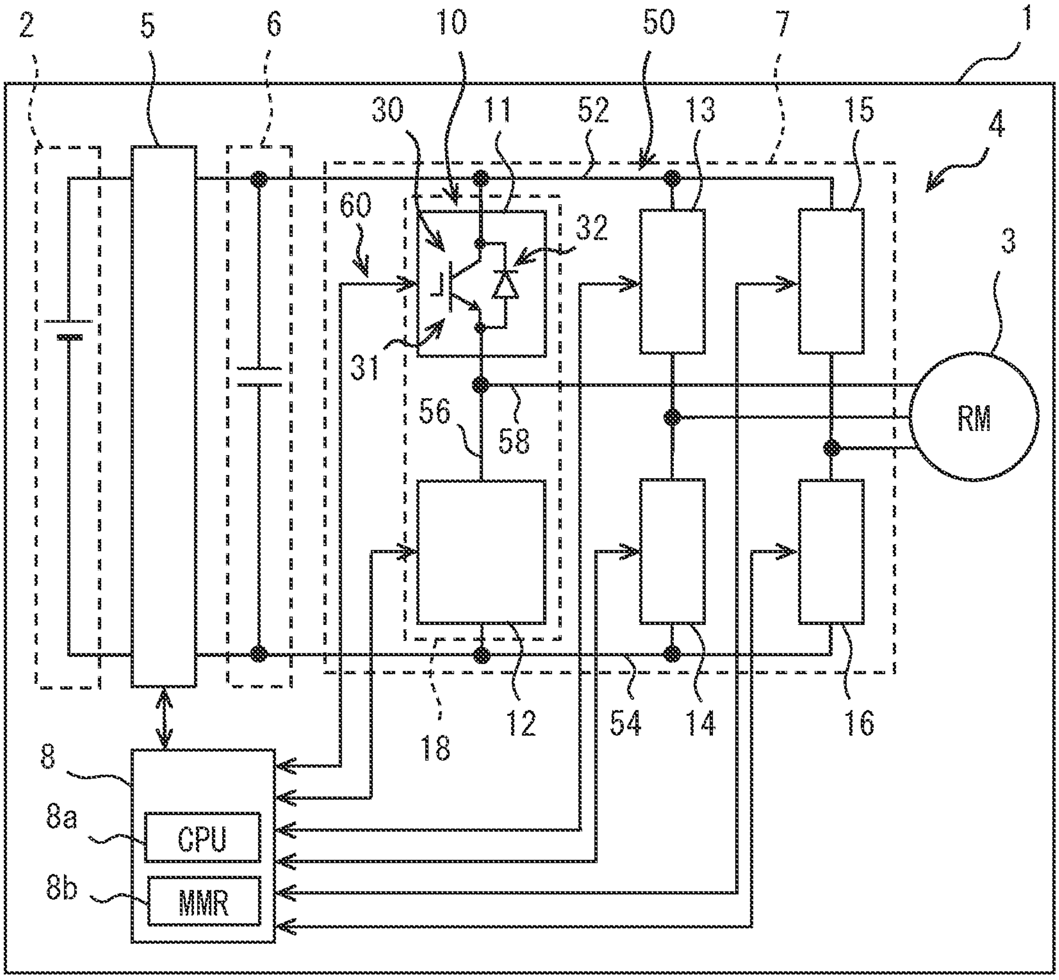
FIG. 1 is a block diagram of an electric system according to a first embodiment of the present disclosure.

In the wiring sheet of JP2014-86659A, electrical insulation between the power path and the control wiring is difficult. Therefore, it has been difficult to provide a semiconductor module satisfying a practical level in terms of electrical insulation and physical size. In view of the above, or in view of other aspects not mentioned, further improvements are required for semiconductor modules.

The present disclosure provides a semiconductor module in which electrical insulation between a power path and a signal path is reliably provided.

A semiconductor module according to an aspect includes: a semiconductor element having a signal pad for a signal path and a power pad for a power path for an electric power larger than an electric power at the signal pad; a heat dissipation member thermally bonded to the semiconductor element; a resin member accommodating the semiconductor element so as to expose a part of the heat dissipation member; a signal terminal made of metal and disposed so as to be exposed from the resin member; and a wiring member accommodated in the resin member. The wiring member is a member more flexible than the signal terminal. The wiring member includes an electrically insulating resin layer and a metal layer supported by the resin layer. The wiring member has a first bonding portion at which the metal layer is connected to the signal pad, and a second bonding portion at which the metal layer is connected to the signal terminal.

In such a configuration, the semiconductor module accommodates the semiconductor element inside the resin member. The semiconductor module further includes the signal terminal made of metal and disposed so as to be exposed from the resin member. The signal pad of the semiconductor element and the signal terminal are connected by the wiring member inside the resin member. The wiring member is accommodated in the resin member. The wiring member is a member more flexible than the signal terminal. The wiring member includes the electrically insulating resin layer and the metal layer supported by the resin layer. The wiring member includes the first bonding portion in which the metal layer is connected to the signal pad, and the second bonding portion in which the metal layer is connected to the signal terminal. The semiconductor module provides high connection workability as including the signal terminal. In addition, even inside the resin member, the wiring member can improve the connection workability of the signal path. The wiring member including the electrically insulating resin layer contributes to electrical insulation between the power path and the signal path. As a result, the semiconductor module in which the electrical insulation between the power path and the signal path is ensured is provided.

The disclosed aspects in this specification adopt different technical solutions from each other in order to achieve their respective objectives. Objects, features, and advantages disclosed in this specification will become apparent by referring to following descriptions and accompanying drawings.

Multiple embodiments of the present disclosure will be described hereinafter with reference to the drawings. In the embodiments, functionally and/or structurally corresponding and/or associated parts may be denoted by the same reference numerals or reference numerals having different hundreds or more digits. For corresponding and/or associated parts, reference may be made to the description of other embodiments.

First Embodiment

In FIG. 1, an electric system 1 includes a power supply device 2, a rotary electric machine (RM) 3, and a power conversion circuit 4. The power supply device 2 is a chargeable and dischargeable direct current (DC) power supply. The power supply device 2 may be provided by a DC power supply including a lithium ion battery, a fuel cell system, or a solar cell system. The power supply device 2 is provided by a power generation system that generates electric power by a power source such as an internal combustion engine. The rotary electric machine 3 is provided by an electric motor or a motor generator. The rotary electric machine 3 is a multi-phase alternating current (AC) rotary electric machine. In the illustrated example, the rotary electric machine 3 is a three-phase rotary electric machine. The rotary electric machine 3 is used as a power source of a moving body or a power source of a machine such as a generator or a water pump. For example, the moving object may include a vehicle, an aircraft, a ship, riding amusement equipment, and vehicle simulation equipment.

The power conversion circuit 4 is electrically connected to the power supply device 2 and the rotary electric machine 3. The power conversion circuit 4 converts at least one element of electric power between the power supply device 2 and the rotary electric machine 3. The elements of the electric power include a direction of a current, a direct or alternating current, a voltage, a current, a phase, and the like. The power conversion circuit 4 can operate in a power running direction in which power is supplied from the power supply device 2 to the rotary electric machine 3 and/or in a regeneration direction in which power is charged from the rotary electric machine 3 to the power supply device 2. In the present embodiment, the power conversion circuit 4 provides at least bidirectional voltage conversion and bidirectional DC-AC conversion.

Power conversion circuit 4 includes a converter circuit 5, a smoothing capacitor 6, an inverter circuit 7, and a control device 8. The power conversion circuit 4 may further include inductive and/or capacitive elements providing a filter circuit. The converter circuit 5 is electrically disposed between the power supply device 2 and the rotary electric machine 3. The converter circuit 5 provides the bidirectional voltage conversion. The converter circuit 5 may step up or step down the voltage output from the power supply device 2 and output the stepped-up or stepped-down voltage to the outside. The converter circuit 5 steps up or steps down the voltage supplied from the outside and supplies the stepped-up or stepped-down voltage to the power supply device 2. The inverter circuit 7 is electrically disposed between the power supply device 2 and the rotary electric machine 3. The inverter circuit 7 is electrically disposed between the converter circuit 5 and the rotary electric machine 3. The inverter circuit 7 provides the bidirectional DC-AC conversion. The inverter circuit 7 provides conversion from DC to AC when power is supplied from the power supply device 2 to the rotary electric machine 3. The inverter circuit 7 provides conversion from AC to DC when electric power is supplied from the rotary electric machine to the power supply device 23. The smoothing capacitor 6 is disposed between the converter circuit 5 and the inverter circuit 7. The smoothing capacitor 6 provides a part of a filter circuit for smoothing DC power.

The inverter circuit 7 includes a plurality of switching elements 10 (SW elements 10), a plurality of power lines 50, and a plurality of signal lines 60. The plurality of SW elements 10 include, for example, a SW element 11 and a SW element 12 for a U phase, a SW element 13 and a SW element 14 for a V phase, and a SW element 15 and a SW element 16 for a W phase. The plurality of SW elements 10 constitute a multi-phase bridge circuit together with the power lines 50. The multiphase bridge circuit includes a plurality of switching arms 18 corresponding to the plurality of phases. For example, a U-phase switching arm includes the SW element 11 that provides an upper arm and the SW element 12 that provides a lower arm. A V-phase switching arm includes the SW element 13 that provides the upper arm and the SW element 14 that provides the lower arm. A W-phase switching arm includes the SW element 15 that provides the upper arm and the SW element 16 that provides the lower arm.

The plurality of power lines 50 include a positive electrode line 52 and a negative electrode line 54. The positive electrode line 52 and the negative electrode line 54 are also referred to as a pair of DC buses. The power lines 50 further include a connection line 56 and a phase line 58. The connection line 56 connects the SW element providing the upper arm and the SW element providing the lower arm. The phase wire 58 connects the connection wire 56 and one phase winding of the rotary electric machine 3. Therefore, the inverter circuit 7 includes the plurality of switching arms 18 disposed between the pair of DC buses. The plurality of signal lines 60 are electrically connected to the plurality of SW elements 10, respectively. The signal lines 60 may include a drive signal line for causing the SW element 10 to perform a switching operation and a plurality of detection signal lines for a current value, a temperature, and the like.

The converter circuit 5 may also comprise switching arms. In this case, the converter circuit 5 is configured as a chopper circuit including an inductance element.

The plurality of SW elements 10 have the same or similar configuration. One SW element 10 includes a semiconductor element 30. The semiconductor element 30 is made of a semiconductor available at present or in the future, such as silicon (Si) or silicon carbide (SiC). The semiconductor element 30 includes a transistor element 31 and a diode element 32. The transistor element 31 is an element such as an insulated gate bipolar transistor (IGBT) element or a metal oxide semiconductor field effect transistor (MOSFET) element, which is available at present or in the future and can be switching-controlled in response to a control signal. The diode element 32 is a reverse connection diode. One SW element 10 may include one transistor element or a plurality of transistor elements connected in series and/or in parallel.

One SW element 10 is also referred to as a single semiconductor module 10 or semiconductor package. The semiconductor module 10 is provided by sealing at least one SW element 10 with a resin member 20 described later. The semiconductor module 10 may be provided by sealing one switching arm 18 with the resin member 20. In this case, the semiconductor module 10 includes a plurality of signal terminals exposed to the outside, a pair of power terminals exposed to the outside, and one power terminal that provides the phase line 58. Further, one semiconductor module 10 may accommodate a plurality of switching arms 18.

The control device 8 is configured by an electric circuit. The control device 8 controls the converter circuit 5 and the inverter circuit 7. The control device 8 is electrically connected to the converter circuit 5 and the inverter circuit 7. The control device 8 and the inverter circuit 7 are connected by the plurality of signal lines 60. The control device 8 generates and outputs a control signal for controlling at least the inverter circuit 7.

The control device 8 in the present disclosure may be referred to as an electronic control unit (ECU). The control device 8 or a control system is provided by (a) an algorithm as a plurality of logic called an if-then-else form, or (b) a learned model tuned by machine learning, e.g., an algorithm as a neural network.

The control device 8 is provided by a control system including at least one computer. The control system may include multiple computers linked by a data communication device. The computer may include at least one processor (hardware processor) that is implemented in hardware manner. The hardware processor can be provided by the following (i), (ii), or (iii).

(i) The hardware processor may be at least one processor core 8*a* (CPU) executing programs stored in at least one memory 8*b* (MMR). In this case, the computer is provided by at least one memory and at least one processor core. The processor core is referred to as a central processing unit (UPU), a graphics processing unit (GPU), a RISC-CPU, or the like. The memory is also referred to as a storage medium. The memory is a non-transitory and tangible storage medium that non-transitorily stores "program and/or data" readable by the processor. The storage medium may be a semiconductor memory, a magnetic disk, an optical disk, or the like. The program may be distributed as a single unit or as a storage medium in which the program is stored.

(ii) The hardware processor may be a hardware logic circuit. In this case, the computer is provided by a digital circuit including a number of programmed logic units (gate circuits). The digital circuit may be provided by a logic circuit array, for example, an application-specific integrated circuit (ASIC), a field programmable gate array (FPGA), a system on a chip (SoC), a programmable gate array (PGA), or a complex programmable logic device (CPLD). The digital circuit may comprise a memory storing programs and/or data. The computer may be provided by an analog circuit. The computer may be provided by a combination of a digital circuit and an analog circuit.

(iii) The hardware processor may be a combination of the above (i) and the above (ii). (i) and (ii) are disposed on different chips or on a common chip. In these cases, the part (ii) is also called an accelerator.

The control device, the signal source, and the control object provide various elements. At least some of these elements may be referred to as a block, a module, or a section. Furthermore, elements included in the control system are referred to as functional means only when intentional.

The semiconductor module 10 is described in detail below with reference to the drawings. In the drawings referred to below and the description of the specification, dimensions such as a thickness, a width, a height, and a length of a plurality of members are schematically illustrated and described in order to facilitate understanding of a relative arrangement and a mutual positional relationship of the plurality of members. The thickness of a first bonding member 71 in an X direction, which will be described later, can be set to about 0.2 millimeters as a non-limiting example. The dimensions of each part should be understood to have a numerical range understandable as being obvious to those skilled in the present and future semiconductor arts. In addition, in some of the drawings, three axial directions are illustrated. The X direction is referred to as a thickness direction, a Y direction is referred to as a width direction, and a Z direction is referred to as a height direction. These designations do not reflect the orientation of the semiconductor module 10 in use. These designations should be understood for convenience.

Figure 2:
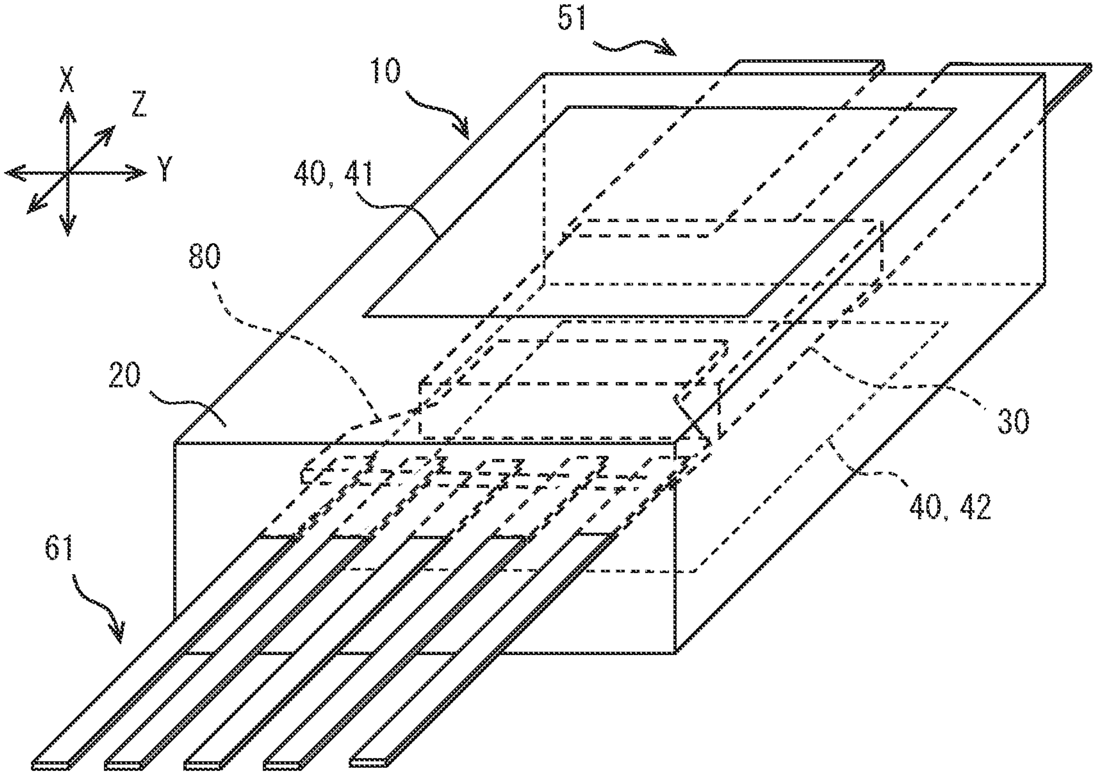
FIG. 2 is an external perspective view of a semiconductor module.

In FIG. 2, the semiconductor module 10 has a flat plate-like outer shape. The outer shape is mainly defined by a resin member 20. The resin member 20 is a member obtained by molding a resin material in a molten state into a required shape by a mold and curing the resin material again. As a non-limiting example, the resin member 20 is made of an epoxy resin. In the semiconductor module 10, the semiconductor element 30 is sealed by the resin member 20. The semiconductor element 30 is a semiconductor chip. The semiconductor element 30 is a plate-shaped member.

The semiconductor module 10 includes at least a pair of power terminals 51 exposed to the outside of the resin member 20. The pair of power terminals 51 includes a P terminal on a positive electrode side and an N terminal on a negative electrode side. The semiconductor module 10 has a plurality of signal terminals 61 exposed to the outside of the resin member 20. In addition to the pair of power terminals 51, the semiconductor module 10 may include a power terminal as an input/output end of the switching arm. The power terminal 51 and the signal terminal 61 can be clearly distinguished from each other by a difference in power flowing through them. The power terminal 51 allows the power of the rotary electric machine 3 as a control target to flow. On the other hand, the signal terminal 61 allows the power on the level of the control signals of the semiconductor element 30 and the transistor element 31, or the power on the signal level of the control device 8.

Portions of the power terminals 51 and the signal terminals 61 are embedded in the resin member 20, and the remaining portions are exposed to the outside of the resin member 20. The power terminal 51 is provided by, for example, a plate material made of metal such as copper or iron. The signal terminal 61 is provided by, for example, a plate material made of metal such as copper or iron. The power terminal 51 and the signal terminal 61 are each provided by a metal plate called a lead frame. The power terminals 51 and the signal terminals 61 extend out from an outer peripheral edge portion of the semiconductor module 10, such as from any of four side surfaces of an outer peripheral shape when the semiconductor module 10 is viewed as a plate shape. The power terminals 51 and the signal terminals 61 have hardness enough to maintain their shapes under a normal temperature environment.

The semiconductor module 10 further includes a heat dissipation member 40 exposed to the outside of the resin member 20. The heat dissipation member 40 is thermally coupled to the semiconductor element 30. The semiconductor module 10 is air-cooled or liquid-cooled. The semiconductor module 10 includes at least one heat dissipation member 40 for dissipating heat of the semiconductor element 30. The semiconductor module 10 may be disposed such that the exposed surface of the heat dissipation member 40 is in contact with a coolant pipe. In such a case, the semiconductor module 10 indirectly dissipates heat from the heat dissipation member 40 to the coolant pipe. The semiconductor module 10 may be disposed in a passage of a coolant. In such a case, the semiconductor module 10 directly dissipates heat from the contact surface (including the heat dissipation member 40) with the coolant to the coolant.

The heat dissipation member 40 includes two heat dissipation members 41 and 42 exposed on opposite surfaces of the semiconductor module 10. The heat dissipation member 41 may be referred to as a first heat dissipation member. The heat dissipation member 42 may be referred to as a second heat dissipation member. In such a case, the semiconductor module 10 is called a double-sided heat dissipation package. The semiconductor module 10 may be disposed between two coolant pipes such that the exposed surface of the first heat dissipation member 41 is in contact with one coolant pipe and the exposed surface of the second heat dissipation member 42 is in contact with the other coolant pipe. The semiconductor module 10 indirectly dissipates heat from one plate-shaped surface of the semiconductor element 30 to the coolant pipe via the first heat dissipation member 41. The semiconductor module 10 indirectly dissipates heat from the other plate-shaped surface of the semiconductor element 30 to the coolant pipe via the second heat dissipation member 42. The semiconductor module 10 may be disposed in a passage of the coolant. In such a case, the semiconductor module 10 directly dissipates heat from the contact surface (including the two heat dissipation members 41 and 42) with the coolant to the coolant.

The semiconductor module 10 includes a wiring member 80. The wiring member 80 provides at least one signal path. The wiring member 80 is also referred to as a wiring sheet. The wiring member 80 is accommodated in the resin member 20. The wiring member 80 has a plate shape. The wiring member 80 includes an electrically insulating resin layer and a metal layer supported by the resin layer. The wiring member 80 includes one metal layer or a plurality of metal layers. The thickness of the wiring member 80 is equal to or less than the thickness of the first bonding member 71. The wiring member 80 extends substantially parallel to the Y-Z plane so as to intersect the thickness direction X. The wiring member 80 is a member more flexible than the signal terminal 61. The wiring member 80 may be disposed in a slightly bent shape due to its flexibility.

The wiring member 80 electrically connects the signal pads of the semiconductor element 30 and the signal terminals 61. The wiring member 80 is positioned and fixed due to the bonding at bonding portions 80*a* and 80*b* and the contact with the resin member 20. In the illustrated example, the wiring member 80 is completely embedded in the resin member 20 and is not exposed to the outside. The wiring member 80 may be provided by a flexible printed circuit (FPC). The wiring member 80 may be provided by a single-sided FPC, a double-sided FPC, or a multilayer FPC. As a non-limiting example, the resin layer may be provided by a polyimide resin, a liquid crystal polymer resin (LPC), or the like. As a non-limiting example, the metal layer may be provided by a copper foil, a silver paste, or the like.

The wiring members 80 enables various arrangements such as approaching, dispersing, and detouring with respect to one metal layer. In addition, the wiring member 80 allows various variations with respect to the area of the metal layer. Further, the wiring member 80 provides stable electrical insulation between the electrical connection provided by the wiring member 80 and other adjacent members by the resin layer. In a typical example, one wiring member 80 includes a plurality of metal layers. The metal layers provide a plurality of electrical connections between the signal pads and the signal terminals 61. In this case, the wiring member 80 can shorten the process time in the manufacturing stage for providing the plurality of electrical connections. In addition, in this case, the wiring member 80 provides stable electrical insulation between the plurality of electrical connections. The wiring member 80 enables the metal layers to be disposed so as to pass through various paths inside the wiring member 80. The wiring member 80 enables various arrangements such as intersection, connection, and branching with respect to the plurality of metal layers. Further, the positional relationship between the plurality of metal layers is fixedly held by the resin layer. As a result, the variation in the mutual coupling inductance between the signal paths is smaller than that of the wire bonding. As a result, the wiring member 80 contributes to stable driving of the semiconductor element 30.

Figure 3:
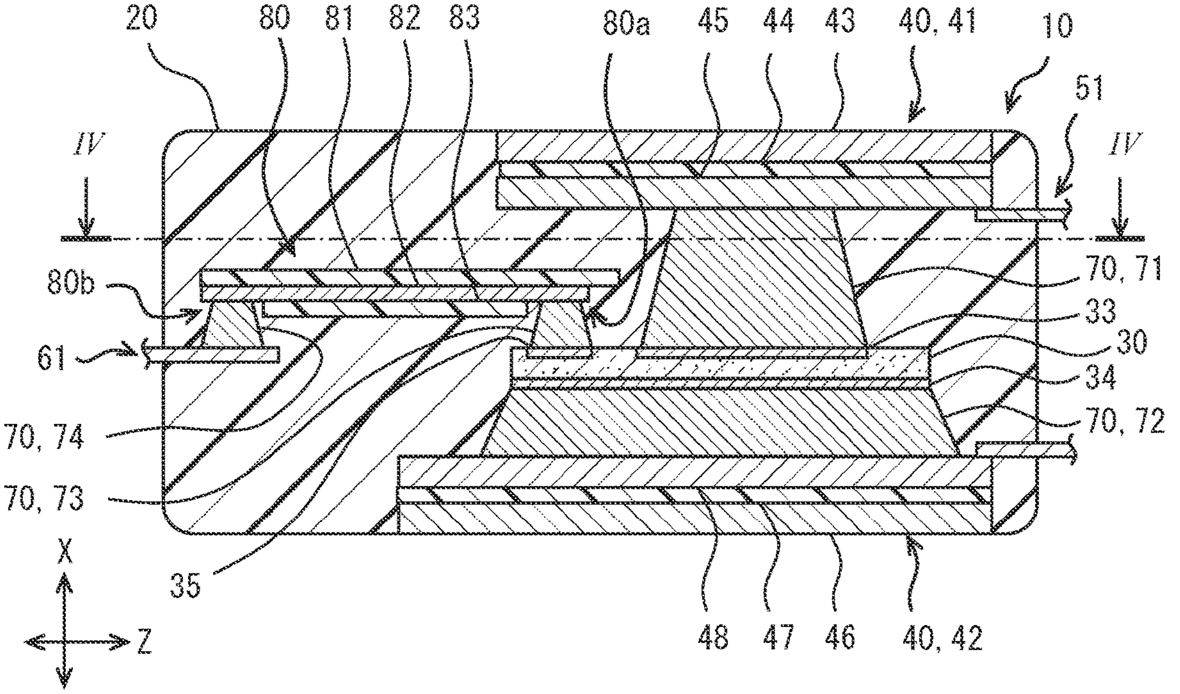
FIG. 3 is a schematic cross-sectional view of the semiconductor module.

FIG. 3 shows a cross section of the semiconductor module 10 in the X-Z plane. In the semiconductor module 10, the resin member 20 accommodates the semiconductor element 30. Both surfaces of the semiconductor element 30 are bonded to the heat dissipation member 40 through the bonding member 70. The bonding member 70 has a flat polygonal columnar shape. The bonding member 70 has a columnar shape having a slightly trapezoidal cross section. This bonding provides electrical connection and thermal coupling. The semiconductor element 30 has a power pad 33 on a first surface which is an upper surface in the drawing. The power pad 33 provides a main power path controlled by the semiconductor element 30. The power pad 33 is bonded to the first heat dissipation member 41 by the first bonding member 71. The semiconductor element 30 has a power pad 34 on a second surface which is a lower surface in the drawing. The power pad 34 provides a main power path controlled by the semiconductor device 30. The power pad 34 is bonded to the second heat dissipation member 42 by the second bonding member 72. The power pads 33 and 34 may be referred to as a power electrode, a collector electrode, an emitter electrode, or the like. The bonding member 70 can be provided by a material called solder.

The heat dissipation member 40 has a flat plate shape. The heat dissipation member 40 provides a high thermal conductivity (accurately, a heat transfer coefficient) between both surfaces thereof. The heat dissipation member 40 is also referred to as a terminal member that provides a power path. The heat dissipation member 40 provides high electrical insulation between both surfaces thereof. The heat dissipation member 40 is also referred to as an electrically insulating substrate. The heat dissipation member 40 includes an electrically insulating resin plate disposed between a pair of metal plates.

The first heat dissipation member 41 includes an outer metal plate 43 providing a heat dissipation surface and an inner metal plate 45 providing a bonding surface. The internal metal plate 45 provides a part of the power path. The internal metal plate 45 is electrically connected to one terminal that provides the power line 50. At least a part of the surface of the external metal plate 43 is exposed to the outside from the resin member 20. One surface of the outer metal plate 43 provides a heat dissipation surface. The first heat dissipation member 41 includes a resin plate 44 as an electrical insulating layer disposed between the outer metal plate 43 and the inner metal plate 45.

The second heat dissipation member 42 includes an outer metal plate 46 providing a heat dissipation surface and an inner metal plate 48 providing a bonding surface. The internal metal plate 48 provides a part of the power path. The internal metal plate 48 is electrically connected to one terminal that provides the power line 50. At least a part of the surface of the external metal plate 46 is exposed to the outside from the resin member 20. One surface of the outer metal plate 46 provides a heat dissipation surface. The second heat dissipation member 42 includes a resin plate 47 as an electrical insulating layer disposed between the outer metal plate 46 and the inner metal plate 48.

The semiconductor element 30 has a signal pad 35 on the first surface. The signal pad 35 is arranged on the outer edge portion of the semiconductor element 30 so that the power pad 33 having a relatively large area can be formed on the first surface. The signal pad 35 has a clearly smaller current conduction area than that of the power pads 33, 34. In a typical example, the semiconductor element 30 includes a plurality of signal pads 35. The signal pad 35 may be referred to as a signal electrode, a sensor electrode, a gate electrode, or the like.

The wiring member 80 is positioned away from the heat dissipation member 40. The wiring member 80 may be disposed in contact with the surface of the semiconductor element 30. The signal pad 35 and the signal terminal 61 are electrically connected by the wiring member 80. The wiring member 80 is disposed inside the resin member 20 so as to bridge between the signal pad 35 and the signal terminal 61. The wiring member 80 includes a resin layer 81 made of an electrically insulating resin material. The wiring member 80 includes a resin layer 83 made of an electrically insulating resin material. The resin layer 81 and the resin layer 83 may be made of a continuous resin material. In the wiring member 80, the outside of the resin layers 81 and 83 may be coated with an electrically insulating film. The insulating film contributes to enhancement of the electrical insulation between the wiring member 80 and other components.

The wiring member 80 includes a metal layer 82 disposed between the resin layer 81 and the resin layer 83. The metal layer 82 is arranged in the wiring member 80 in a linear shape or a ribbon shape. The metal layer 82 is made of metal. The metal layer 82 may also be referred to as a conductive member or a signal line for signal transmission. The metal layer 82 is disposed to be continuous from one end to the other end.

The wiring member 80 includes a first bonding portion 80*a* that enables electrical connection between the metal layer 82 and the signal pad 35. The first bonding portion 80*a* is provided at one end portion of the metal layer 82. The wiring member 80 has a second bonding portion 80*b* that enables electrical connection between the metal layer 82 and the signal terminal 61. The second bonding portion 80*b* is provided at the other end portion of the metal layer 82. The first bonding portion 80*a* and the second bonding portion 80*b* are partitioned by window portions formed in the resin layers 81 and 83. The window portion exposes a part of the metal layer 82 from the resin layers 81 and 83. The first bonding portion 80*a* and the second bonding portion 80*b* may be understood as a part of the metal layer 82. In the first bonding portion 80*a*, the signal pad 35 of the semiconductor element 30 and the one end portion of the metal layer 82 are electrically connected by a third bonding member 73. In the second bonding portion 80*b*, the other end portion of the metal layer 82 and the signal terminal 61 are electrically connected by a fourth bonding member 74.

Figure 4:
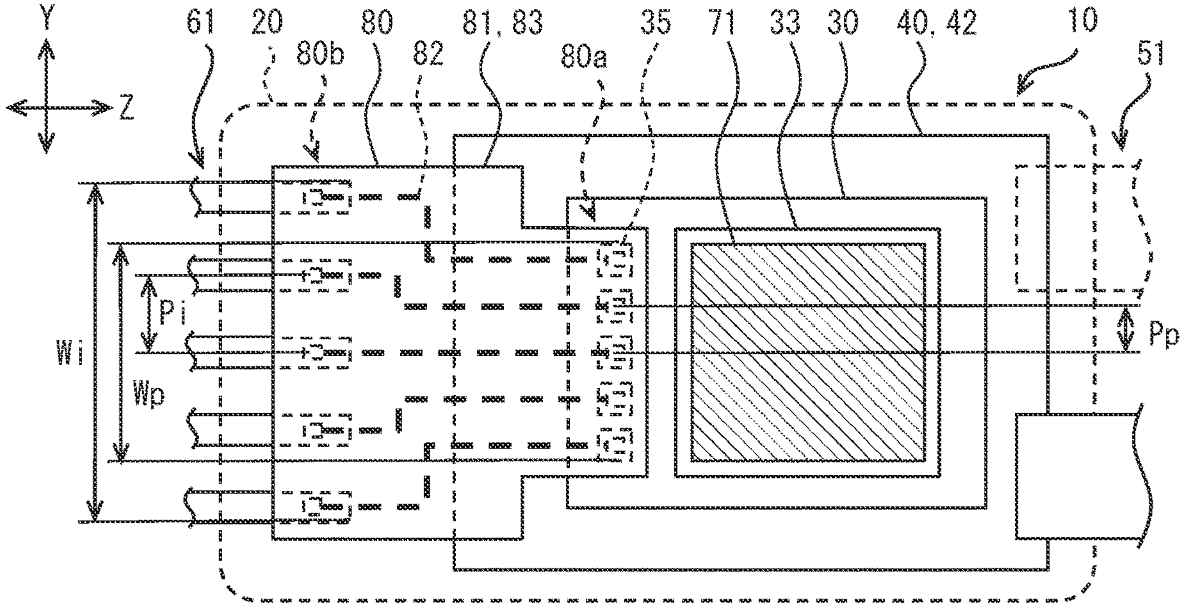
FIG. 4 is a partial cross-sectional view taken along a line IV-IV in FIG. 3.

FIG. 4 is a partial cross-sectional view taken along line IV-IV of FIG. 3 in a state where the resin member 20 is removed. The heat dissipation member 40, the semiconductor element 30, the wiring member 80, and the signal terminals 61 are stacked in the X direction. The heat dissipation member 40, the semiconductor element 30, the wiring member 80, and the signal terminal 61 are parallel to each other. The heat dissipation member 40 and the semiconductor element 30 are arranged in parallel so as to overlap each other. The semiconductor element 30 and the wiring member 80 are arranged in parallel so as to overlap each other only at the first bonding portion 80*a*. The wiring member 80 and the signal terminal 61 are arranged in parallel so as to overlap each other only at the second bonding portion 80*b*. The heat dissipation member 40, the semiconductor element 30, the wiring member 80, and the signal terminal 61 each have a plate shape. The heat dissipation member 40, the semiconductor element 30, the wiring member 80, and the signal terminals 61 are arranged such that the surfaces of the plates are parallel to the Y-Z plane. Therefore, the signal terminal 61 extends from the side surface of the resin member 20 in parallel with the Y-Z plane.

The semiconductor element 30 is disposed on and bonded to the second heat dissipation member 42. The power pad 33 of the semiconductor element 30 is bonded to the first heat dissipation member 41 by the first bonding member 71. The semiconductor element 30 has a plurality of signal pads 35. In the drawing, the power pads 33 and the signal pads 35 are represented by rectangular shapes. The pad of the semiconductor device 30 may have various shapes such as a circular shape, an elliptical shape, a rounded polygonal shape, and a polygonal shape.

The plurality of signal pads 35 are arranged apart from each other in the outer edge portion of the upper surface of the semiconductor element 30. The plurality of signal pads 35 are arranged in a row along the outer edge portion. The plurality of signal pads 35 may be disposed at corners of the upper surface of the semiconductor element 30. The plurality of signal pads 35 may be dispersedly arranged to form a plurality of groups on the upper surface of the semiconductor element 30. The signal pads 35 are arranged at a pad pitch Pp. The pad pitch Pp is the minimum pad pitch among the plurality of signal pads 35. The plurality of signal pads 35 are arranged within the range of the width Wp.

The plurality of signal terminals 61 each have a shape that can be called an elongated rod shape or a ribbon shape. The plurality of signal terminals 61 are arranged in parallel with each other. One ends of the plurality of signal terminals 61 are aligned on a straight line. The plurality of signal terminals 61 may have different widths. The plurality of signal terminals 61 may have different lengths. The plurality of signal terminals 61 are arranged at a terminal pitch Pi. The terminal pitch Pi is a minimum terminal pitch in the plurality of signal terminals 61. The plurality of signal terminals 61 are arranged within the range of the width Wi.

The terminal pitch Pi is equal to or greater than the pad pitch Pp (Pi≥Pp). In the illustrated example, the terminal pitch Pi is larger than the pad pitch Pp (Pi>Pp). The terminal pitch Pi and the pad pitch Pp are different from each other. There is a difference Dp (Dp=Pi−Pp) between the terminal pitch Pi and the pad pitch Pp. The terminal pitch Pi and the pad pitch Pp may be equal to each other.

The width Wi is equal to or greater than the width Wp (Wi≥Wp). In the illustrated example, the width Wi is larger than the width Wp (Wi>Wp). The width Wi and the width Wp are different from each other. There is a difference Dw (Dw=Wi−Wp) between the width Wi and the width Wp. The width Wi and the width Wp may be equal.

The wiring member 80 is disposed between the signal pad 35 and the signal terminal 61. The wiring member 80 is disposed so as to bridge the plurality of signal pads 35 and the plurality of signal terminals 61. The wiring member 80 includes resin layers 81 and 83 and the metal layer 82. The wiring member 80 includes the plurality of metal layers 82 electrically independent of each other. Each of the plurality of metal layers 82 electrically connects each of the plurality of signal pads 35 and each of the plurality of signal terminals 61. The plurality of metal layers 82 are insulated from other members by the resin layers 81 and 83 in portions other than the bonding portions 80*a* and 80*b*.

The wiring member 80 includes the first bonding portion 80*a* for connecting the metal layer 82 and the signal pad 35. The first bonding portion 80*a* is formed by exposing the metal layer 82 from the resin layer 81 and/or the resin layer 83. The first bonding portion 80*a* is formed by the window portion defined in the resin layer 81 and/or the resin layer 83 and the exposed portion of the metal layer 82 exposed in the window portion. The window portion is an opening portion having a predetermined area in the resin layer 81 and/or the resin layer 83. The exposed portion has an area and a shape that enable bonding with the signal pad 35.

The wiring member 80 includes the second bonding portion 80*b* for connecting the metal layer 82 and the signal terminal 61. The second bonding portion 80*b* is formed by exposing the metal layer 82 from the resin layer 81 and/or the resin layer 83. The second bonding portion 80*b* is formed by the window portion defined in the resin layer 81 and/or the resin layer 83 and the exposed portion of the metal layer 82 exposed in the window portion. The window portion is an opening portion having a predetermined area in the resin layer 81 and/or the resin layer 83. The exposed portion has an area and a shape that enable bonding with the signal terminal 61.

The laying paths of the plurality of metal layers 82 in the wiring member 80 are set to provide the electrical connection while allowing the difference Dp and/or the difference Dw. In regard to the width where the plurality of metal layers 82 are laid, the width Wi on the side adjacent to the signal terminals 61 is larger than the width Wp on the side adjacent to the signal pads 35. The shape of the wiring member 80 is also set to provide the electrical connection while allowing the difference Dp and/or the difference Dw. The width of the wiring member 80 itself is wider at the end on the side adjacent to the signal terminals 61 than at the end on the side adjacent to the signal pads 35.

The shapes of the plurality of metal layers 82 in the Y-Z plane are substantially parallel to each other. However, the shape of the plurality of metal layers 82 in the Y-Z plane is formed such that the difference between the width Wi and the width Wp is absorbed by a change in the distance between the plurality of metal layers 82. The shapes of the plurality of metal layers 82 are set so as to change the distance therebetween. The distance between the plurality of metal layers 82 can also be referred to as a metal layer pitch. The metal layer pitch is equal to the terminal pitch Pi on the side adjacent to the signal terminal 61. The metal layer pitch is equal to the pad pitch Pp on the side adjacent to the signal pads. The metal layer pitch decreases from the terminal pitch Pi toward the pad pitch Pp. In the illustrated example, the metal layer pitch changes stepwise. Alternatively, the metal layer pitch may change gradually.

The method for manufacturing the semiconductor module 10 includes a preparation process of preparing a plurality of components. The preparation process is a process for preparing main components. The preparation process includes processes of preparing a material of the resin member 20 before molding, the semiconductor element 30, the heat dissipation member 40, a lead frame for the power terminals 51, a lead frame for the signal terminals 61, the bonding member 70, and the wiring member 80.

The method for manufacturing the semiconductor module 10 includes a bonding process of electrically and/or thermally and mechanically bonding a plurality of components. The bonding process includes a semiconductor bonding process of bonding the heat dissipation member 40 and the semiconductor element 30 by the bonding members 71 and 72. The semiconductor bonding process includes a first bonding member process of bonding the first heat dissipation member 41 and the semiconductor element 30 by the first bonding member 71. The semiconductor bonding process includes a second bonding member process of bonding the second heat dissipation member 42 and the semiconductor element 30 by the second bonding member 72. In regard to the first bonding member process and the second bonding member process, the first bonding member process may be performed after the second bonding member process. In regard to the first bonding member process and the second bonding member process, the second bonding member process may be performed after the first bonding member process. The first bonding member process and the second bonding member process may be performed simultaneously.

The bonding process includes a power terminal bonding process of bonding the heat dissipation member 40 and the power terminal 51. The bonding process includes a signal path bonding process of connecting the signal pads 35 and the signal terminals 61 via the wiring member 80. The signal path bonding process includes a third bonding member process of bonding the signal pads 35 and the wiring member 80 by the third bonding member 73. The signal path bonding process includes a fourth bonding member process of bonding the signal terminals 61 and the wiring member 80 by the fourth bonding member 74. The third bonding member process and the fourth bonding member process can be performed simultaneously. The third bonding member process and the fourth bonding member process may be performed in numerical order or in reverse numerical order. The semiconductor bonding process and the signal path bonding process can be performed simultaneously. The power terminal bonding process may be performed simultaneously with these processes.

For example, when solder is used as the bonding member 70, the semiconductor bonding process, the power terminal bonding process, and the signal path bonding process can be performed by a temporary heating process in which the solder is melted and re-cured. For example, at least the second bonding member process and the third bonding member process and/or at least the second bonding member process and the fourth bonding member process may be simultaneously performed by the temporary heating process. In this case, in an arrangement process performed prior to the heating process, the second heat dissipation member 42, the second bonding member 72, and the semiconductor element 30 are arranged in a stacked manner. In the arrangement process, the signal pad 35, the third bonding member 73, and the first bonding portion 80*a* are arranged in a stacked manner. Further, in the arrangement process, the signal terminal 61, the fourth bonding member 74, and the second bonding portion 80*b* are disposed in a stacked manner. In the heating process, the bonding of the semiconductor element 30 and the second heat dissipation member 42 and the bonding of the wiring member 80 can be simultaneously performed by melting the bonding members 72, 73, and 74. In the arrangement process, the semiconductor element 30, the first bonding member 71, and the first heat dissipation member 41 may be disposed in a stacked manner. In this case, the bonding members 71,72, 73, and 74 are simultaneously melted in the heating process. The bonding process is performed so as to bond all the bonding portions. The bonding process includes a curing process of curing the bonding member. The plurality of members are bonded by the bonding process.

The method for manufacturing the semiconductor module 10 includes a resin molding process of encapsulating the intermediate product bonded by the bonding process with the resin member 20. The resin molding process is performed so as to provide the intended electrical insulation by penetration of the resin member into the gaps between the members of the intermediate product. The resin molding process is a process of molding the resin member 20 so as to cover the semiconductor element 30 while exposing the heat dissipation member 40, the power terminals 51, and the signal terminals 61. The resin molding process includes an arrangement process of arranging the plurality of bonded components in a mold. The resin molding process includes an injection process of injecting the resin member 20 in a molten state into a mold. The resin molding process includes a curing process of curing the resin member 20 in the molten state. The resin molding process includes a removal process of removing the molded article from the mold. The resin molding process further includes a finishing process including a process of cutting the lead frame and a process of removing burrs of the resin.

According to the embodiment described above, the electrical connection between the signal pads 35 of the semiconductor element 30 and the signal terminals 61 is provided by the wiring member 80. The wiring member 80 enables an easy bonding process. In addition, the wiring member 80 itself has the electrical insulation property due to the resin layers 81 and 83. Therefore, the wiring member 80 improves the reliability of electrical insulation between the metal layer 82 and other members. When the wiring member 80 includes the plurality of metal layers 82, the reliability of electrical insulation between the plurality of metal layers 82 is improved.

Further, the wiring member 80 is encapsulated, fixed, and supported by the resin member 20. Therefore, entry of foreign matters from the outside to the inside of the semiconductor module 10 is restricted. The foreign matters include a liquid such as water, a corrosive gas, and the like. In other words, the wiring member 80 and the resin member 20 provide a high sealing property.

Second Embodiment

The present embodiment is a modification example which is based on the preceding embodiment. In the embodiment described above, the plurality of signal pads 35 are dispersedly arranged along one short side of the semiconductor element 30. Alternatively, in the present embodiment, a plurality of signal pads 235 which are arranged in a concentrated manner in a part of the semiconductor element 30 is employed. The semiconductor element 30 desirably has a relatively large active region that exhibits activity as the switching element. The relatively large active area allows control of a large quantity of current. The present embodiment provides a semiconductor device 30 that can have a relatively large active region.

Figure 5:
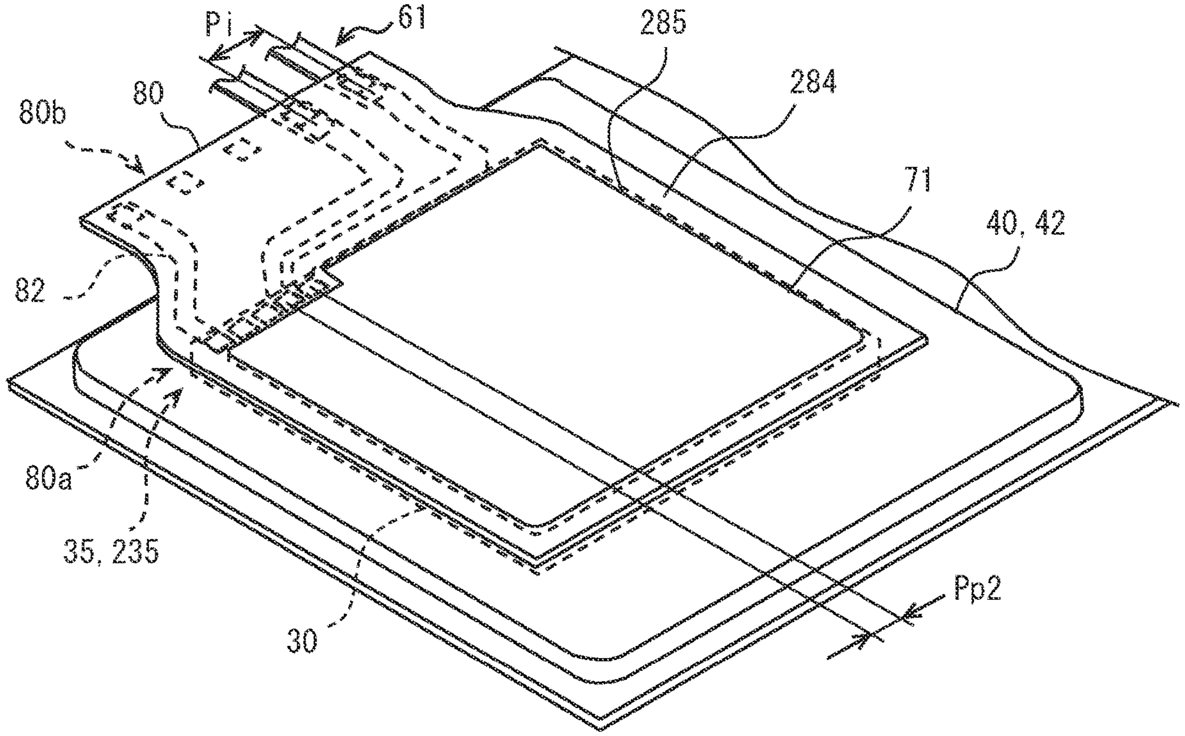
FIG. 5 is a perspective view of a semiconductor module according to a second embodiment.

FIG. 5 is a perspective view of the plurality of components in a state where the resin member 20 and the first heat dissipation member 41 are removed. The semiconductor element 30 has a plate shape having a rectangular surface. The semiconductor element 30 has a substantially square shape. The semiconductor element 30 includes the plurality of signal pads 235 in a rectangular region near a corner portion of an outer edge portion on the front surface. The plurality of signal pads 235 are intensively arranged in the rectangular region. The plurality of signal pads 235 are arranged in a row along the outer edge of the front surface. The plurality of signal pads 235 are arranged with a pad pitch Pp2 along the direction of the row. The pad pitch Pp2 is smaller than the pad pitch Pp of the preceding embodiment. The pad pitch Pp2 is set to a numerical value that can be regarded as fine, as compared with the size of the semiconductor element 30.

The wiring member 80 includes a plurality of first bonding portions 80*a* and a plurality of second bonding portions 80*b*. Each of the plurality of first bonding portions 80*a* is bonded to each of the plurality of signal pads 235. Therefore, the plurality of signal pads 35 are arranged so as to have the pad pitch Pp2 along the direction of the row. The plurality of second bonding portions 80*b* are arranged so as to have a terminal pitch Pi along the direction of the row. Each of the plurality of second bonding portions 80*b* is bonded to each of the plurality of signal terminals 61. The plurality of metal layers 82 are arranged so as to expand the fine pad pitch Pp2 to the terminal pitch Pi. The plurality of metal layers 82 are laid so as to meander between the first bonding portion 80*a* and the second bonding portions 80*b*.

The wiring member 80 has an outer edge portion 284 disposed along an outer edge of the front surface of the semiconductor element 30 where the plurality of signal pads 235 are not arranged. The outer edge portion 284 is disposed along the longitudinal direction of the outer edge portion. The outer edge portion 284 is disposed on the outer edge portions of the three sides on which the signal pads 235 are not arranged, among the outer edge portions of the four sides of the front surface of the semiconductor element 30. As a result, the wiring member 80 is disposed on the surface of the semiconductor element 30 so as to surround the power pad 33 that allows the main current to flow. In other words, the wiring member 80 is disposed so as to surround the first bonding member 71. The wiring member 80 defines an opening 285. The outer edge portion 284 is provided only by the resin layer 81 or the resin layer 83. The outer edge portion 284 may include the metal layer 82. The outer edge portion 284 facilitates positioning of the wiring member 80 with respect to the semiconductor element 30. As a result, even with the fine pad pitch Pp2, the plurality of signal pads 235 and the plurality of first bonding portions 80*a* can be accurately and easily positioned. The outer edge portion 284 improves electrical insulation at the outer periphery of the semiconductor element 30. The wiring member 80 improves electrical insulation between a member such as an electrode as the power path of the semiconductor element 30 and a portion such as an electrode as the signal path. The outer edge portion 284 may define the shape of the first bonding member 71.

The fine pad pitch Pp2 makes it possible to relatively reduce the area occupied by the plurality of signal pads 235. As a result, the area occupied by the bonding member 70 in the semiconductor element 30 and/or the area of the active region for allowing the current to flow can be relatively increased. In the example shown in the drawing, the active region substantially extends over a range in which the first bonding member 71 is disposed. The active region extends so as to be adjacent to all of the four sides of the semiconductor element 30. One side of the semiconductor element 30 is shared by a range occupied by the plurality of signal pads 235 and a range occupied by the active region. A range occupied by the plurality of signal pads 235 is ⅔ or less or ½ or less of one side of the semiconductor element 30. From one viewpoint, the fine pad pitch Pp2 makes it possible to suppress the current density and/or improve the heat conductivity by increasing the area of the bonding member 70 occupying the surface of the semiconductor element 30. From another viewpoint, the increase in the size of the active region in the semiconductor element 30 makes it possible to suppress the size of the semiconductor element 30 and/or reduce the cost by suppressing the size of the element.

Third Embodiment

The present embodiment is a modification example which is based on the preceding embodiment(s). In the embodiment(s) described above, one semiconductor module 10 includes one semiconductor element 30. Alternatively, one semiconductor module 10 may include two or more semiconductor elements. The present embodiment is an example in which one semiconductor module 10 is provided with a plurality of semiconductor elements. The present embodiment provides a semiconductor module 10 that accommodates a plurality of semiconductor elements 30 arranged in parallel or in series.

Figure 6:
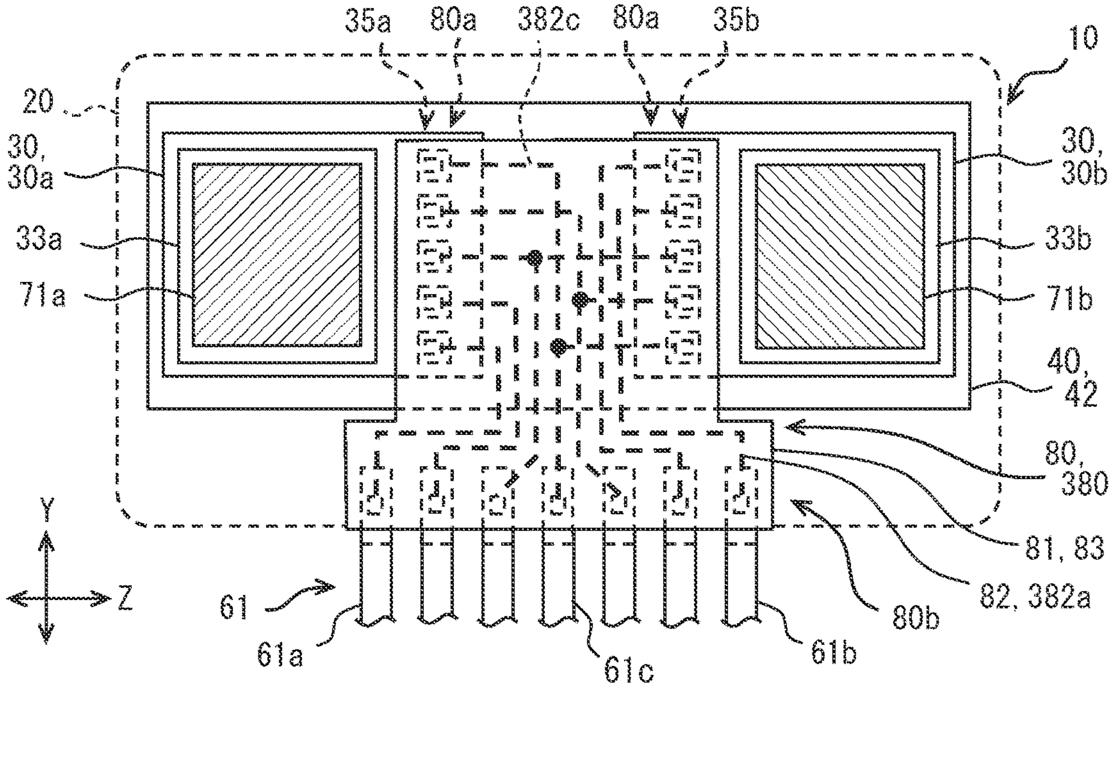
FIG. 6 is a partial cross-sectional view of a semiconductor module according to a third embodiment.

In FIG. 6, in the semiconductor module 10, two semiconductor elements 30*a* and 30*b* are stacked on the second heat dissipation member 42. The two semiconductor elements 30*a* and 30*b* have the same shape or similar shapes. The two semiconductor elements 30*a* and 30*b* are disposed rotationally symmetrically on the second heat dissipation member 42. In the present embodiment, the two semiconductor elements 30*a* and 30*b* are arranged in parallel on the power path. The semiconductor element 30*a* includes a power pad 33*a* and a plurality of signal pads 35*a*. The semiconductor element 30*a* and a bonding member 71*a* are stacked. The semiconductor element 30*b* includes a power pad 33*b* and a plurality of signal pads 35*b*. The semiconductor element 30*b* and the bonding member 71*b* are stacked.

The two semiconductor elements 30*a* and 30*b* may be arranged in series on the power path. For example, one of the semiconductor elements 30*a* and 30*b* may be an upper arm, and the other of the semiconductor elements 30*a* and 30*b* may be a lower arm. In this case, one semiconductor module 10 provides one switching arm 18.

The wiring member 80 is provided by a wiring member 380. The wiring member 380 includes a plurality of first bonding portions 80*a* for the semiconductor element 30*a*. The wiring member 380 includes a plurality of first bonding portions 80*a* for the semiconductor element 30*b*. Further, the wiring member 380 includes a common second bonding portion 80*b* for the semiconductor elements 30*a* and 30*b*. In the present embodiment, the plurality of metal layers 82 include an independent metal layer 382*a* and a common metal layer 382*c*. The independent metal layer 382*a* is bonded to only one of the plurality of signal pads 35*a* and 35*b*. The common metal layer 382*c* is commonly bonded to one signal pad 35*a* of the semiconductor element 30*a* and one signal pad 35*b* of the semiconductor element 30*b*. The metal layers 382*a* and 382*c* are bonded to the signal terminals 61 at the second bonding portion 80*b*.

The plurality of signal terminals 61 include a signal terminal 61*a* dedicated to only the semiconductor element 30*a*, a signal terminal 61*b* dedicated to only the semiconductor element 30*b*, and a signal terminal 61*c* common to the semiconductor element 30*a* and the semiconductor element 30*b*. For example, the dedicated signal terminals 61*a* and 61*b* are used as sensor terminals for sensing temperature, current, and the like of the semiconductor elements 30*a* and 30*b*. The common signal terminal 61*c* is used as a gate terminal or the like for driving the plurality of semiconductor elements 30*a* and 30*b* at the same timing. In the illustrated example, the dedicated signal terminals 61*a* and 61*b* are arranged on both sides of the row of the plurality of signal terminals 61, and the common signal terminal 61*c* is arranged at the center of the row of the plurality of signal terminals 61.

The wiring member 80 includes the independent metal layer 382*a* and the common metal layer 382*c*, so that the dedicated connection and the common connection can be provided inside the wiring member 80. The wiring member 80 can correspond to different arrangements of the plurality of signal pads 35*a* and 35*b* by changing the laying pattern of the plurality of metal layers 82. In the wiring member 80, the arrangement of the dedicated signal terminals 61*a* and 61*b* and the common signal terminal 61*c* can be changed by changing the laying pattern of the plurality of metal layers 82.

Fourth Embodiment

The present embodiment is a modification example which is based on the preceding embodiment(s). The present embodiment is an example in which a plurality of semiconductor elements are provided. One semiconductor module 10 includes a plurality of semiconductor elements 30*a*, 30*b*, 30*c*, and 30*d*.

Figure 7:
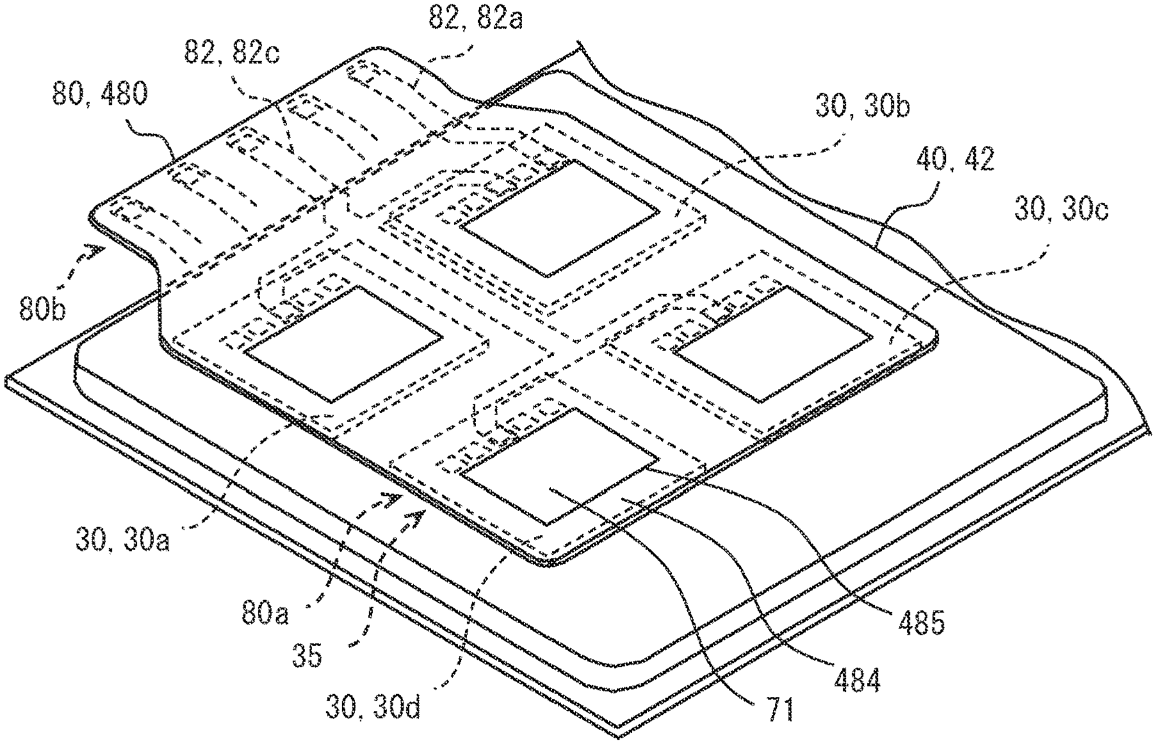
FIG. 7 is a perspective view of a semiconductor module according to a fourth embodiment.

In FIG. 7, the four semiconductor elements 30*a*, 30*b*, 30*c*, and 30*d* are stacked in parallel on the second heat dissipation member 42. The plurality of semiconductor elements 30 have the same shape or similar shapes. The plurality of semiconductor elements 30 are arranged such that the signal pads 35 are located adjacent to one of sides of the second heat dissipation member 42. The plurality of semiconductor elements 30 are dispersedly arranged in a grid pattern.

The wiring member 80 is provided by a wiring member 480. The wiring member 480 has an area extending over the plurality of semiconductor elements 30*a*, 30*b*, 30*c*, and 30*d*. The wiring member 480 has an outer edge portion 484 and an opening 485. The outer edge portion 484 extends in a lattice shape. As a result, the wiring member 480 has four openings 485. Each of the four openings 485 is opened at a position corresponding to each of the four semiconductor elements 30. The opening 485 provides an opening through which the first bonding member 71 passes.

The wiring member 480 includes a plurality of metal layers 82. The plurality of metal layers 82 include a dedicated metal layer 82*a* and a common metal layer 82*c*. The metal layer 82 is laid so as to bypass the semiconductor element 30, thereby continuously extending between the first bonding portion 80*a* and the second bonding portion 80*b*.

Fifth Embodiment

The present embodiment is a modification example which is based on the preceding embodiment(s). The present embodiment is an example in which a plurality of semiconductor elements are provided. One semiconductor module 10 includes a plurality of semiconductor elements 30*a*, 30*b*, 30*c*, and 30*d*.

Figure 8:
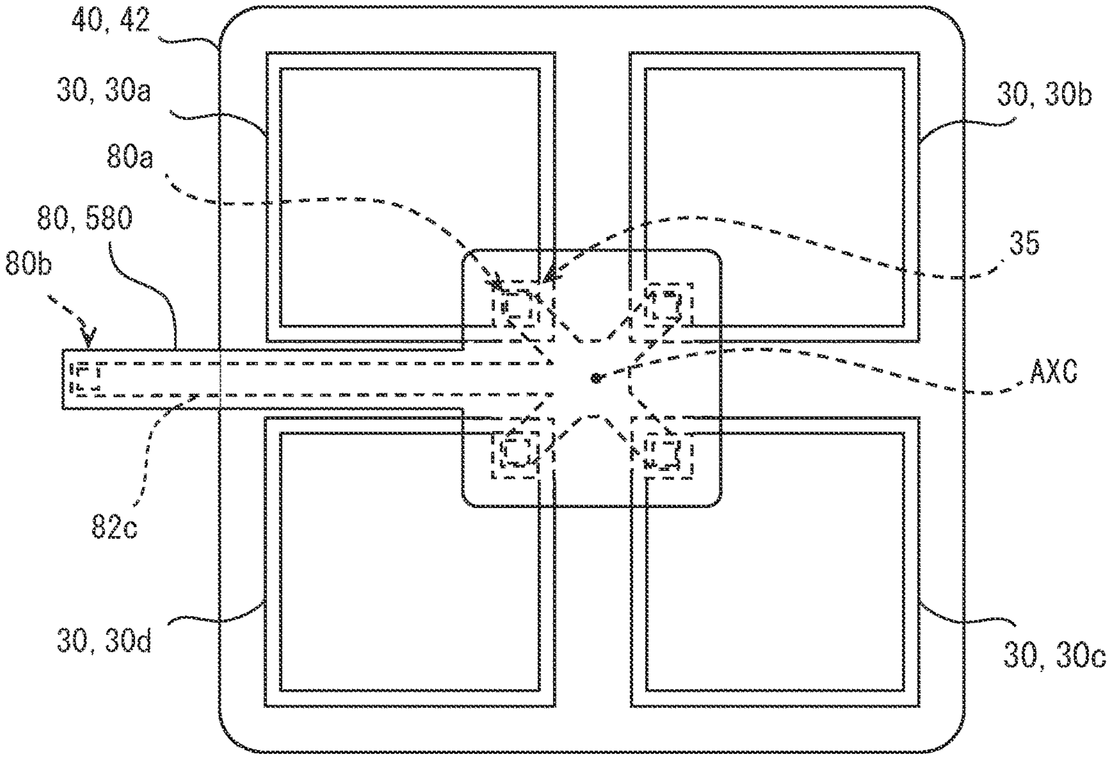
FIG. 8 is a perspective view of a semiconductor module according to a fifth embodiment.

In FIG. 8, four semiconductor elements 30*a*, 30*b*, 30*c*, and 30*d* are arranged in a form of square. Moreover, the four semiconductor elements 30*a*, 30*b*, 30*c*, and 30*d* are arranged in rotational symmetry with respect to the central axis AXC. A signal pad 35 is positioned at a corner of each of the plurality of semiconductor elements 30. The plurality of semiconductor elements 30 are arranged such that the signal pads 35 are positioned in the vicinity of the central axis AXC.

The wiring member 80 is provided by a wiring member 580. The wiring member 580 includes a metal layer 82*c*. The wiring member 580 includes four first bonding portions 80*a*. The wiring member 580 includes a second bonding portion 80*b* connected to a common terminal member. The metal layer 82*c* includes a portion extending between the second bonding portion 80*b* and the central axis AXC, and a plurality of branch portions extending radially from the central axis AXC and reaching the respective first bonding portions 80*a*. The common metal layer 82*c* provides a common electrical connection to the plurality of semiconductor elements 30*a*, 30*b*, 30*c*, and 30*d*. The common metal layer 82*c* provides signal paths having substantially equal lengths from the second bonding portion 80*b* to the plurality of signal pads 35. The substantially equal length means that the electrical characteristics are substantially equal or that any difference is substantially negligible in the nature of the signal. For example, the signal pad 35 may be a pad for a driving signal such as a gate signal. In this case, it is possible to suppress the difference between the drive signals supplied to the plurality of semiconductor elements 30.

Sixth Embodiment

The present embodiment is a modification example which is based on the preceding embodiment(s). In the preceding embodiment(s), the wiring member 80 is positioned away from the heat dissipation member 40. Alternatively, in the present embodiment, the wiring member 680 is disposed in contact with both the semiconductor element 30 and the first heat dissipation member 41. Further, the wiring member 680 includes a recess 86. The recess 86 functions as a volume adjusting portion for adjusting the volume of the first bonding member 71 to an appropriate volume for bonding the power pad 33 of the semiconductor element 30 and the first heat dissipation member 41. The recess 86 is provided by a recess 686. The present embodiment provides the semiconductor module 10 capable of stabilizing the size of the first bonding member 71.

Figure 9:
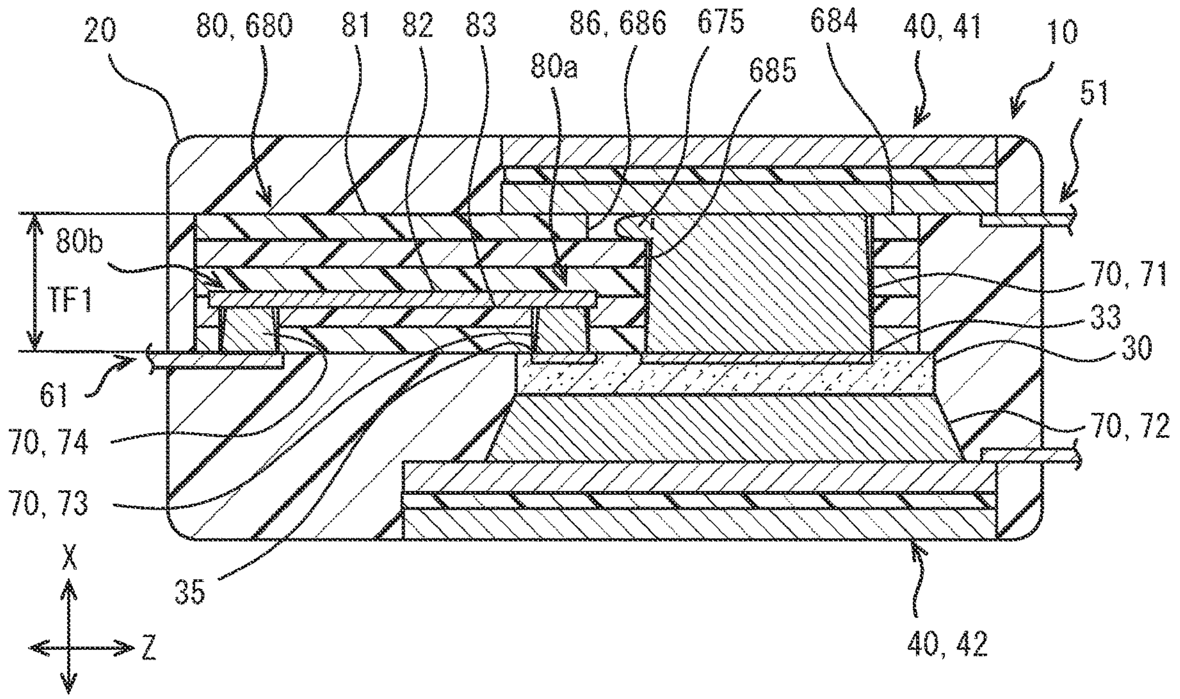
FIG. 9 is a cross-sectional view of a semiconductor module according to a sixth embodiment.

In FIG. 9, the semiconductor module 10 includes the semiconductor element 30 disposed between the first heat dissipation member 41 and the second heat dissipation member 42. The semiconductor module 10 includes a wiring member 680. The wiring member 80 is provided by the wiring member 680. The wiring member 680 is positioned between the semiconductor element 30 and the first heat dissipation member 41. The wiring member 680 is disposed in contact with both the semiconductor element 30 and the first heat dissipation member 41. The wiring member 680 electrically connects between the signal pad 35 of the semiconductor element 30 and the signal terminal 61. The wiring member 680 includes resin layers 81 and 83. Each of the resin layers 81 and 83 is formed of an aggregate in which a plurality of resin layers are stacked. The resin layers 81 and 83 may be formed of a single resin layer made of a continuous resin material.

The wiring member 680 has an outer edge portion 684 disposed along the edge of the first bonding member 71. The outer edge portion 684 surrounds the first bonding member 71 in the Y-Z plane. As a result, the outer edge portion 684 forms an opening 685 that defines the position and the maximum range of the first bonding member 71 in the Y-Z plane. The wall surface of the opening 685 may form a minute gap with the first bonding member 71 and may come into contact with the first bonding member 71. In a case where the wall surface of the opening 685 is in contact with the first bonding member 71, the opening 685 defines the range of the first bonding member 71.

The wiring member 680 includes a recess 686. The recess 686 opens in a wall surface defining the opening 685. The recess 686 is formed by a notch penetrating at least one of the plurality of resin layers forming the resin layers 81 and 83. Therefore, the recess 686 defines a thickness in the X direction corresponding to at least one resin layer. In the illustrated embodiment, the recess 686 is provided by an endmost resin layer of the plurality of resin layers. Therefore, the recess 686 is also open to the end surface of the wiring member 680 in the X direction (thickness direction). The recess 686 defines an expansion chamber in communication with the opening 685. The recess 686 provides a side wall of the expansion chamber. The wall surface of the expansion chamber in the X direction is provided by another resin layer. The recess 686 is located in only a portion of the wall of the opening 685. The recess 686 has a shape that can also be referred to as a notch of the wiring member 680. The recess 686 extends the volume of the opening 685 in only a portion of the Y-Z plane. The recess 686 extends the volume of the opening 685 in only a portion of the X-Z plane. The volume expansion chamber defined by the recess 686 may accommodate an excessive portion of the first bonding member 71. The excessive portion of the first bonding member 71 flows into the recess 686 by being pushed out or by its own fluidity, and is cured, and thus remains in the recess 686. In the drawing, an excess portion 675 remaining in the recess 686 is illustrated.

When a large number of semiconductor modules 10 are manufactured, there are a product in which the volume expansion chamber accommodates the excess portion 675 of the first bonding member 71 and a product in which the volume expansion chamber does not accommodate the excess portion 675 of the first bonding member 71. When an excessive amount of the first bonding member 71 is present in the opening 685, the volume expansion chamber functions as an escape volume for absorbing the excessive amount of the first bonding member 71.

The recess 686 is disposed so as to define the extended volume chamber by a part of the surface of the first heat dissipation member 41. The recess 686 is positioned adjacent to the first heat dissipation member 41. The recess 686 is provided only in some of the multiple resin layers. In the illustrated example, the recess 686 is provided only in the resin layer closest to the first heat dissipation member 41. As a result, one surface of the extended volume chamber provided by the recess 686 is defined by the first heat dissipation member 41. The recess 686 is provided so as not to reach the metal layer 82. The recess 686 is formed so that an electrical insulation state between the first bonding member 71 and the metal layer 82 can be maintained in a good state. The recess 686 is provided to provide a predetermined electrical insulation distance from the metal layer 82.

The wiring member 680 has a thickness TF1. The thickness TF1 is a thickness at which the wiring member 80 is in contact with the surface of the semiconductor element 30 and the first heat dissipation member 41. The thickness TF1 defines the thickness of the first bonding member 71 and is equal to the thickness of the first bonding member 71.

The method of manufacturing the semiconductor module 10 includes a first bonding process of bonding the first heat dissipation member 41 and the semiconductor element 30 by the first bonding member 71. The manufacturing method includes an arrangement process before the first bonding process. In the arrangement process, the first heat dissipation member 41, the wiring member 680, and the semiconductor element 30 are arranged in a stacked manner. At this time, the first bonding member 71 before bonding (before melting and re-curing) is disposed in the opening 685. The first bonding member 71 in the arrangement process has a thickness equal to or larger than the thickness TF1.

After the arrangement process, the first bonding process is performed. In the first bonding process, the first bonding member 71 melts and flows. In the first bonding process, the first bonding member 71 bonds the first heat dissipation member 41 and the semiconductor element 30 and is cured again. In the first bonding process, the thickness of the first bonding member 71 changes during the process in which the first bonding member 71 is melted and cured again. In many cases, the thickness of the first bonding member 71 decreases from the thickness before the bonding process to the thickness after the bonding process. Further, in the first bonding process, pressure may be applied in a direction in which the first heat dissipation member 41 and the semiconductor element 30 are brought close to each other. This pressure also reduces the thickness of the first bonding member 71.

In the first bonding process, the wiring member 680 is in contact with the first heat dissipation member 41 and the semiconductor element 30. At the same time, the opening 685 suppresses the flow of the first bonding member 71. If the first bonding member 71 is excessively present during the process in which the first bonding member 71 is melted and cured again, the distance between the first heat dissipation member 41 and the semiconductor element 30 may not be stable. At this time, the excess portion of the first bonding member 71 is pushed out toward the recess 686. The excess portion of the first bonding member 71 may flow into the recess 686 without being pushed out. The excess portion of the first bonding member 71 remains in the recess 686 as the excess portion 675 by being cured again. As a result, the excess portion 675 is retained in the recess 686. It can also be said that the recess 686 provides an escape capacity for the first bonding member 71.

At this time, the recess 686 is adjacent to the first heat dissipation member 41. For this reason, the excess portion 675 is in contact with the first heat dissipation member 41 and contributes to provide a large bonding cross-sectional area. The provision of the large bonding cross-sectional area enhances the heat conductivity in the first bonding member 71, and makes it possible to suppress the current density.

Further, a gas component may be mixed in the first bonding member 71 in the bonding process, or a gas component may be generated when the first bonding member 71 is melted. These gas components may flow into the recess 686. The gas component may generate voids inside the first bonding member 71 cured again. When the gas component flows into the recess 686, generation of voids in the first bonding member 71 may be suppressed. It can also be said that the recess 686 provides an escape capacity for the gas component in the bonding process.

In the present embodiment, the volume provided by the recess 686 is provided as an additional volume to the standard volume for the first bonding member 71 provided by the opening 685. As a result, if the first bonding member 71 attempts to overflow the standard volume, the first bonding member 71 will flow into the additional volume provided by the recess 686. Even after the first bonding member 71 is cured again, the first bonding member 71 may remain in the additional volume provided by the recess 686. As a result, an appropriate volume of the first bonding member 71 remains in the standard volume provided by the opening 685. The first bonding member 71 remaining in the opening 685 provides an appropriate bonding state between the semiconductor element 30 and the first heat dissipation member 41. For example, the recess 686 suppresses inclination of the semiconductor element 30 and the first heat dissipation member 41, unstable bonding, and unintended leakage of the first bonding member 71.

In the present embodiment, the entire wiring member 680 has the thickness TF1. Alternatively, the wiring member 680 may be configured to have the thickness TF1 only in a portion located between the semiconductor element 30 and the first heat dissipation member 41. For example, the wiring member 680 may be configured to have a thickness smaller than the thickness TF1 in a portion arranged to bridge between the semiconductor element 30 and the signal terminal 61. Such a configuration provides flexibility required for a portion arranged to bridge between the semiconductor element 30 and the signal terminal 61.

Seventh Embodiment

The present embodiment is a modification example which is based on the preceding embodiment(s). In the preceding embodiment(s), the metal layer 82 of the wiring member 80 only connects the signal pad 35 and the signal terminal 61. Alternatively, in the present embodiment, the wiring member 780 includes a metal layer 787 bonded to the first bonding member 71. In one aspect, the present embodiment provides the semiconductor module 10 capable of stably adjusting the thickness of the bonding member to a predetermined value. From another aspect, the present embodiment provides the semiconductor module 10 capable of stably setting the position of the wiring member 780.

Figure 10:
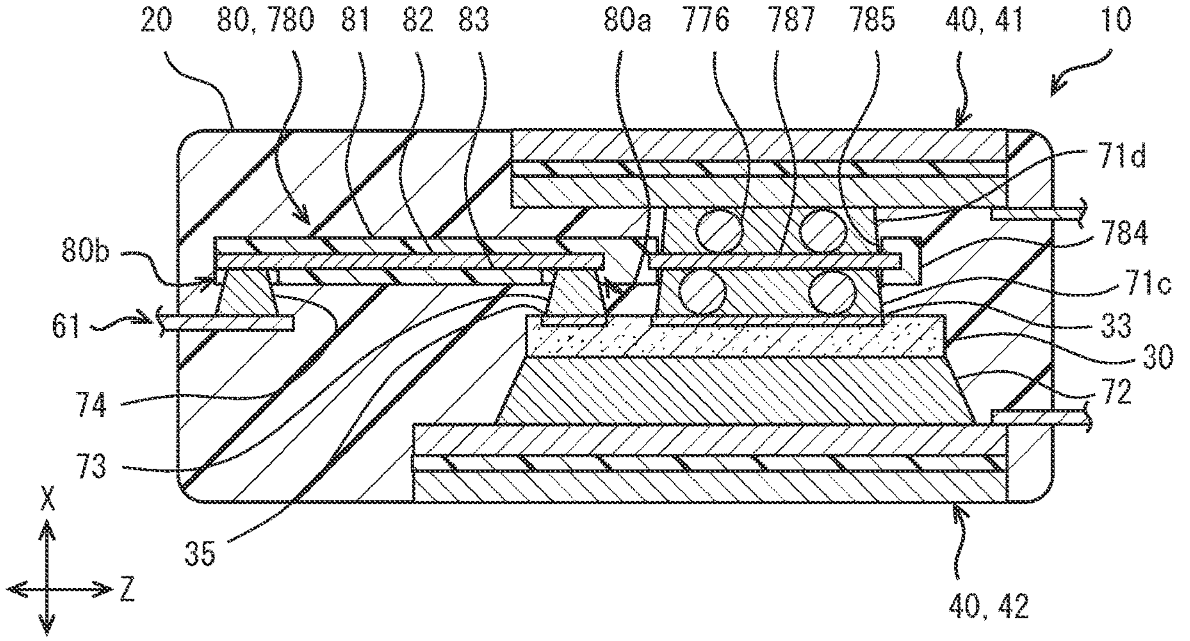
FIG. 10 is a cross-sectional view of a semiconductor module according to a seventh embodiment.

In FIG. 10, the wiring member 80 is provided by a wiring member 780. The wiring member 780 is disposed between the signal pad 35 and the signal terminal 61. The wiring member 780 is disposed so as to overlap the signal pad 35 in the X direction. Further, the wiring member 780 is disposed so as to also overlap the power pad 33 in the X direction. The wiring member 780 extends so as to overlap both the signal pad 35 and the power pad 33. In other words, the wiring member 780 extends to a region where the first bonding member 71 is disposed.

The wiring member 780 has an outer edge portion 784 disposed along the first bonding member 71. The outer edge portion 784 surrounds a range in which the first bonding member 71 is to be installed. The outer edge portion 784 defines an opening 785 in the resin layers 81 and 83 corresponding to the range of the first bonding member 71. The wiring member 780 includes a metal layer 787 exposed to the opening 785. The opening 785 is also referred to as a notch for exposing the metal layer 787 from the resin layers 81 and 82. The metal layer 787 is formed of the same material as the metal layer 82. The metal layer 787 providing the power path is electrically insulated from the metal layer 82 providing the signal path. The metal layer 787 is exposed from the wiring member 780 over at least the region of the first bonding member 71 in the Y-Z plane.

The metal layer 787 is disposed in and bonded to the first bonding member 71. As a result, the metal layer 787 partitions the first bonding member 71 into a first layer 71*c* and a second layer 71*d*. The first layer 71*c* bonds the power pad 33 of the semiconductor element 30 and the metal layer 787. The second layer 71*d* bonds the metal layer 787 and the first heat dissipation member 41. In other words, the metal layer 787 is embedded in the first bonding member 71. The metal layer 787 or the opening 785 may have a communication opening for forming the first layer 71*c* and the second layer 71*d* as a continuous bonding member. For example, the opening 785 can form a communication opening between the resin layers 81 and 83 and the metal layer 787. Alternatively or additionally, the metal layer 787 may include a notch or a hole as a communication opening communicating both surfaces of the metal layer 787.

The metal layer 787 is positioned so as to be embedded in the first bonding member 71. As a result, the position of the wiring member 780 is stabilized by the first bonding member 71. Further, the wiring member 780 receives the flow of the resin and the pressure of the resin in the molding process of molding the resin member 20. However, the wiring member 780 in which the metal layer 787 is embedded in the first bonding member 71 is not easily deformed even in the molding process and maintains a predetermined shape. For example, the wiring member 780 is less likely to be warped and deformed even when receiving the pressure of the resin.

A thickness adjustment member 776 for adjusting the thickness of the first layer 71*c* is disposed between the metal layer 787 and the first heat dissipation member 41. The thickness adjustment member 776 may be provided by a nickel ball (Ni ball), a bonding pad, or wire bonding. The thickness adjustment member 776 is provided by a conductive member or a conductive metal member that functions as the first bonding member 71 together with the first layer 71*c*. The thickness adjustment member 776 is also disposed between the metal layer 787 and the semiconductor element 30. The thickness adjustment member 776 contributes to adjusting the thickness of the first layer 71*c* and the second layer 71*d* to a predetermined thickness. As a result, an excessive increase in the thickness of the first layer 71*c* and the second layer 71*d*, that is, an excessive increase in the thickness of the first bonding member 71 is suppressed. As a result, for example, a variation in thermal resistance and/or a variation in electrical resistance are suppressed. The stabilization of the thicknesses of the first layer 71*c* and the second layer 71*d* improves the reliability of the aluminum-silicon electrode (Al—Si electrode) in the power pad 33 on the semiconductor element 30. In addition, the deformation direction of the metal layer 787 and the deformation direction of the resin member 20 when a thermal repetition cycle is applied become the same direction, and the reliability of the aluminum-silicon electrode may be improved.

Eighth Embodiment

The present embodiment is a modification example which is based on the preceding embodiment(s). In the preceding embodiment(s), the wiring member 80 has a plate shape providing a continuous surface. In an aspect, the plate-shaped wiring member 80 may affect the flow of the resin, for example, obstruct the flow of the resin in the molding process of the resin member 20. In another aspect, the plate-shaped wiring member 80 may receive a force from the flow of the resin, such as being deformed by the flow of the resin. Alternatively, in the present embodiment, the wiring member 880 has a communication portion 88 that allows the flow of the resin member 20 in the molding process. As a result, the resin member 20 penetrates the plate-shaped wiring member 880 through the communication portion 88, and exists as a continuous resin material. In one aspect, the present embodiment provides the semiconductor module 10 capable of improving the flow of the resin in the molding process. From another aspect, the present embodiment provides the semiconductor module 10 capable of suppressing the force acting on the wiring member 880 in the molding process.

Figure 11:
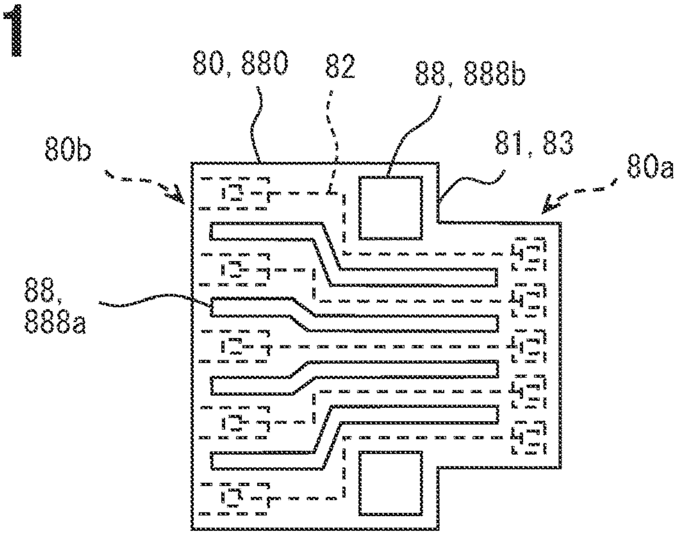
FIG. 11 is a plan view of a wiring member according to an eighth embodiment.

In FIG. 11, the wiring member 80 is provided by a wiring member 880. The wiring member 880 may be utilized in one of the embodiments described herein. The wiring member 880 includes a communication portion 88 that allows communication between both surfaces of the wiring member 880. The resin member 20 penetrates the communication portion 88. The communication portion 88 is formed by a hole located adjacent to the metal layer 82. The hole penetrates the resin layers 81 and 83 in the front-back direction. The wiring member 880 has one or a plurality of communication portions 88. The wiring member 880 may have a hole 888*a* positioned between the plurality of metal layers 82. The wiring member 880 may have a hole 888*b* positioned between the metal layer 82 and the outer edge of the wiring member 880.

The communication portion 88 allows the resin member 20 to flow through the communication portion 88 in the molding process. The resin member 20 can flow from the front surface to the back surface and from the back surface to the front surface of the wiring member 880 even when the wiring member 880 is present. As a result, the molding quality of the resin member 20 is improved. Further, the force acting on the wiring member 880 from the flow of the resin member 20 is suppressed. As a result, misalignment of the wiring member 880 or deformation of the wiring member 880 is suppressed. In addition, an occurrence of bonding failure including bonding failure in the first bonding portion 80*a* and/or the second bonding portion 80*b* is suppressed.

Ninth Embodiment

The present embodiment is a modification example which is based on the preceding embodiment(s). The present embodiment(s) shows an example of the communication portion 88.

Figure 12:
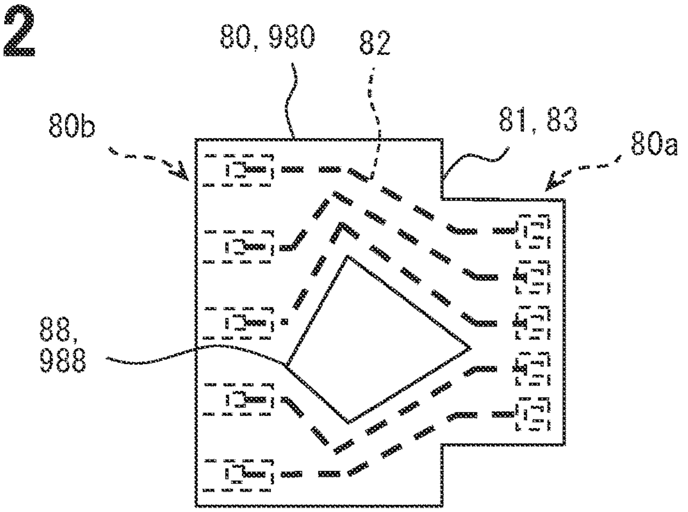
FIG. 12 is a plan view of a wiring member according to a ninth embodiment.

In FIG. 12, the wiring member 80 is provided by a wiring member 980. The wiring member 980 includes a communication portion 88. The communication portion 88 is provided by a single hole 988 provided in the wiring member 980. In the present embodiment, the plurality of metal layers 82 are arranged to bypass the hole 988. According to the present embodiment, the hole 988 having a relatively large area can be provided at a predetermined position of the wiring member 980. As a result, in the molding process, a relatively large amount of the resin member 20 can be caused to flow at a position where the resin member 20 needs to flow. Note that the position of the hole 988 is set so as to obtain a necessary flow of the resin material. For example, the position of the hole 988 is set in consideration of a gate position for injecting the resin member 20 into the mold in the molding process. In addition, also in the present embodiment, the same effects as those of the preceding embodiments can be obtained.

Tenth Embodiment

The present embodiment is a modification example which is based on the preceding embodiment(s). The present embodiment(s) shows an example of the communication portion 88.

Figure 13:
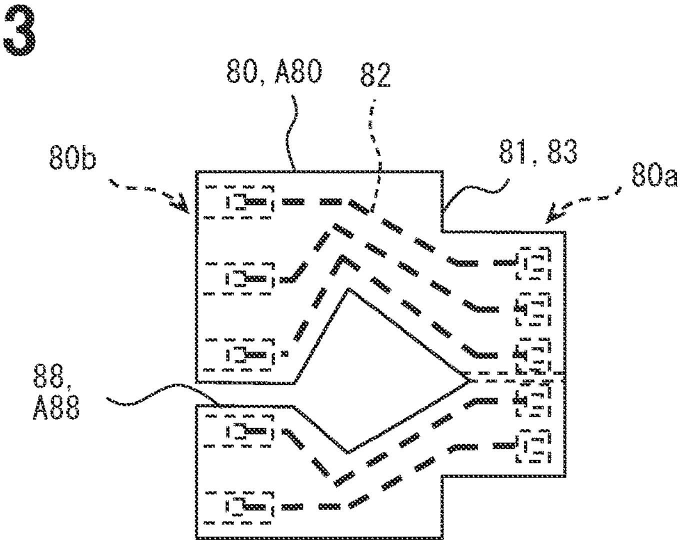
FIG. 13 is a plan view of a wiring member according to a tenth embodiment.

In FIG. 13, the wiring member 80 is provided by a wiring member A80. The wiring member A80 includes a communication portion 88. The communication portion 88 is provided by a cutout portion A88 provided in the wiring member A80. The cutout portion A88 is formed as an omega-shaped cutout continuous from the outer edge of the wiring member A80. The cutout portion A88 opens toward the outer edge. The cutout portion A88 may divide the wiring member A80 into a plurality of partial members as indicated by broken lines. The communication portion 88 is formed between the plurality of partial members to allow the resin to flow in the molding process. Also in the present embodiment, the same effects as those of the preceding embodiments can be obtained.

Eleventh Embodiment

The present embodiment is a modification example which is based on the preceding embodiment(s). In the preceding embodiment(s), the thickness of the wiring member 80 is equal to or less than the thickness of the first bonding member 71. Alternatively, in the present embodiment, the thickness of the wiring member B80 is larger than the thickness of the first bonding member 71. Further, the thickness of the wiring member B80 is equal to or less than the distance between the first heat dissipation member 41 and the second heat dissipation member 42. In the preceding embodiment(s), a jig may be used to appropriately maintain the distance between the plurality of members in the bonding process. In the bonding process, the bonding member 70 may adhere to an unintended position due to leakage, scattering, or the like of the bonding member 70. In the present embodiment, the wiring member B80 is in contact with both the first heat dissipation member 41 and the second heat dissipation member 42. Further, the wiring member B80 includes an opening B85 for defining the positions and shapes of the first bonding member 71 and the second bonding member 72. In one aspect, the present embodiment provides the semiconductor module 10 capable of accurately managing the shapes of the first bonding member 71 and the second bonding member 72. In another aspect, the present embodiment provides the semiconductor module 10 capable of accurately managing the interval between the first heat dissipation member 41 and the second heat dissipation member 42.

Figure 14:
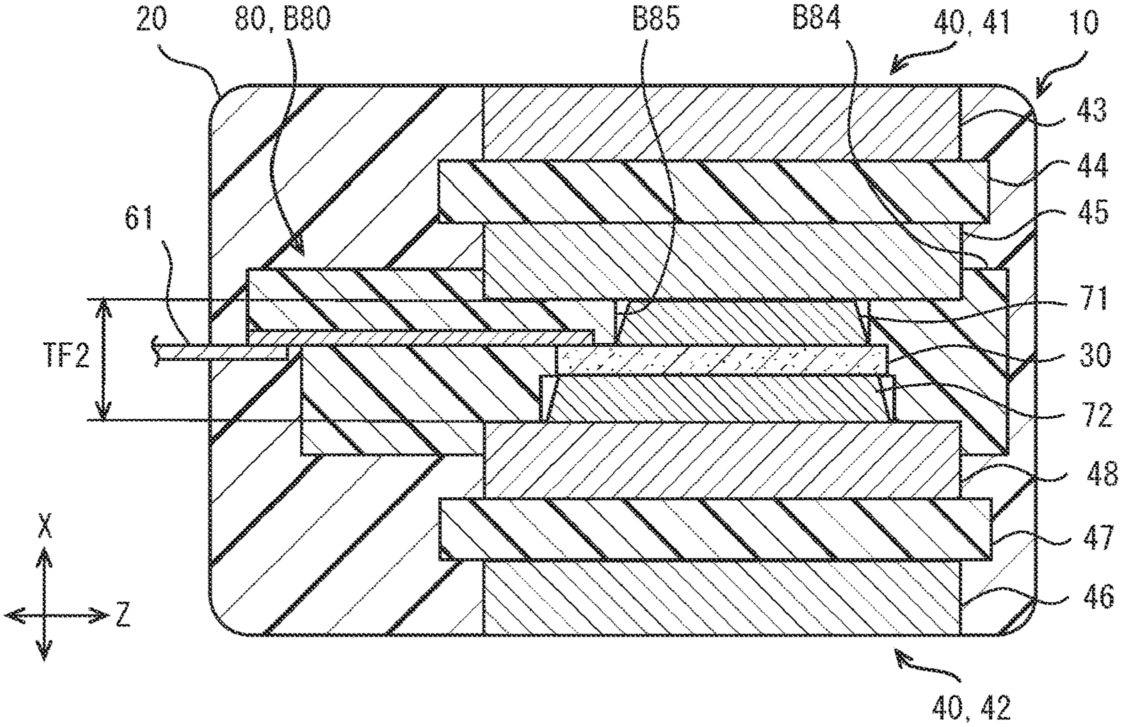
FIG. 14 is a cross-sectional view of a semiconductor module according to an eleventh embodiment.

In FIG. 14, the semiconductor module 10 includes the first heat dissipation member 41 and the second heat dissipation member 42. The wiring member 80 is provided by a wiring member D80. The wiring member B80 has a thickness TF2. The thickness TF2 is a thickness that brings the wiring member B80 and the first heat dissipation member 41 into contact with each other and brings the wiring member B80 and the second heat dissipation member 42 into contact with each other. The gap between the first heat dissipation member 41 and the second heat dissipation member 42 is defined by the thickness TF2 of the wiring member B80.

The wiring member B80 has an outer edge portion B84. The wiring member B80 has an opening B85. The outer edge portion B84 extends so as to surround the opening B85. The opening B85 has a stepped inner wall surface. The inner wall surface is a stepped surface in which a side surface facing the Y direction or the Z direction and a flat surface facing the X direction are alternately repeated. The inner wall surface enables the first heat dissipation member 41, the first bonding member 71, the semiconductor element 30, the second bonding member 72, and the second heat dissipation member 42 to be stacked in this order inside the opening B85.

The inner wall surface of the opening B85 is in contact with at least the side surface of the first heat dissipation member 41 on a side adjacent to the first heat dissipation member 41. Specifically, the inner wall surface of the opening B85 is in contact with at least the side surface of the internal metal plate 45 on the side adjacent to the first heat dissipation member 41. Thus, the wiring member B80 positions the first heat dissipation member 41 in the Y direction and the Z direction. The inner wall surface of the opening B85 is in contact with the outer edge portion of the surface (lower surface in the drawing) of the internal metal plate 45 of the first heat dissipation member 41. Thus, the wiring member B80 positions the first heat dissipation member 41 in the X direction.

The inner wall surface of the opening B85 is in contact with at least the side surface of the second heat dissipation member 42 on a side adjacent to the second heat dissipation member 42. Specifically, the inner wall surface of the opening B85 is in contact with at least the side surface of the internal metal plate 48 on the side adjacent to the second heat dissipation member 42. Thus, the wiring member B80 positions the second heat dissipation member 42 in the Y direction and the Z direction. The inner wall surface of the opening B85 is in contact with the outer edge portion of the surface (upper surface in the drawing) of the internal metal plate 48 of the second heat dissipation member 42. Thus, the wiring member B80 positions the second heat dissipation member 42 in the X direction.

The inner wall surface of the opening B85 is in contact with the side surface of the semiconductor element 30 at a substantially central portion. Thus, the wiring member B80 positions the semiconductor element 30 in the Y direction and the Z direction. The inner wall surface of the opening B85 is in contact with the outer edge portion of the surface (upper surface in the drawing) of the semiconductor element 30 at a substantially central portion. Thus, the wiring member B80 positions the semiconductor element 30 in the X direction.

The inner wall surface of the opening B85 is in contact with at least the side surface of the first bonding member 71 at the position where the first bonding member 71 is disposed. This contact is realized by the inner wall surface blocking the flow of the first bonding member 71 in the molding process. At the same time, the inner wall surface defines the shape of the first bonding member 71. The wiring member B80 positions the first bonding member 71 in the Y direction and the Z direction. The inner wall surface of the opening B85 is in contact with at least the side surface of the second bonding member 72 at the position where the second bonding member 72 is disposed. This contact is realized by the inner wall surface blocking the flow of the second bonding member 72 in the molding process. At the same time, the inner wall surface defines the shape of the second bonding member 72. The wiring member B80 positions the second bonding member 72 in the Y direction and the Z direction.

The inner wall surface in the portion where the first bonding member 71 is disposed defines a volume chamber having a size that defines the size of the first bonding member 71. The inner wall surface in the portion where the second bonding member 72 is disposed defines a volume chamber having a size that defines the size of the second bonding member 72. In the process in which the bonding member 70 is melted and cured again in the bonding process, the inner wall surface of the opening B85 suppresses leakage and scattering of the first bonding member 71. The inner wall surface of the opening B85 defines the size and shape of the first bonding member 71 in the process in which the first bonding member 71 is melted and cured. In the process in which the bonding member 70 is melted and cured again in the bonding process, the inner wall surface of the opening B85 suppresses leakage and scattering of the second bonding member 72. The inner wall surface of the opening B85 defines the size and shape of the second bonding member 72 in the process in which the second bonding member 72 is melted and cured.

According to the present embodiment, the gap between the first heat dissipation member 41 and the second heat dissipation member 42 is defined by the wiring member B80. As a result, the use of an additional jig can be suppressed, and the wiring member B80 can be effectively used to define the shape of the semiconductor module 10. It should be noted that the present embodiment does not exclude the use of a jig. The present embodiment may be used in combination with the recess 686 described in the sixth embodiment. Also in the present embodiment, the wiring member B80 may be configured to have the thickness TF2 only in a portion located between the first heat dissipation member 41 and the second heat dissipation member 42. For example, the wiring member 680 may be configured to have a thickness smaller than the thickness TF2 in a portion arranged to bridge between the semiconductor element 30 and the signal terminal 61. Such a configuration provides flexibility required for a portion arranged to bridge between the semiconductor element 30 and the signal terminal 61.

Twelfth Embodiment

The present embodiment is a modification example which is based on the preceding embodiment(s). In the preceding embodiment(s), the wiring member 80 only reaches the periphery of the semiconductor element 30. In a case where the semiconductor module 10 is used as a device that handles a large amount of current, arranging a member through which a current on the positive electrode side flows and a member through which a current on the negative electrode side flows close to each other contributes to suppression of an inductance component. However, when the member through which the current on the positive electrode side flows and the member through which the current on the negative electrode side flows are arranged close to each other, electrical insulation between the members may be impaired. In the present embodiment, the wiring member C80 is disposed as an insulating member between the pair of power terminals 51. In one aspect, the present embodiment provides a semiconductor module 10 with improved electrical insulation. In another aspect, the present embodiment provides the semiconductor module 10 in which the inductance component is suppressed.

Figure 15:
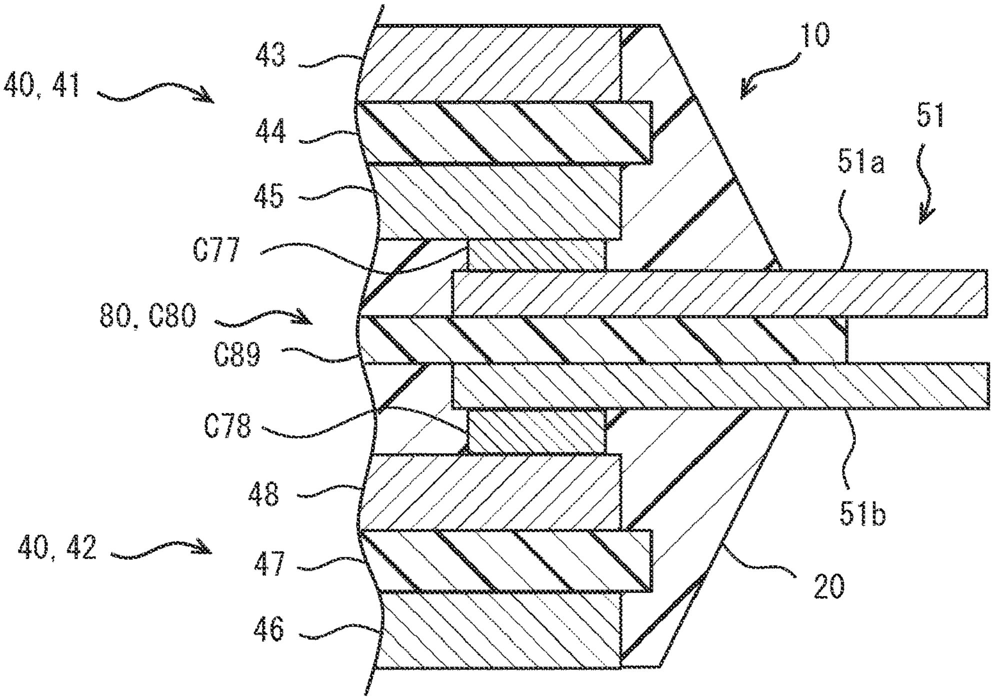
FIG. 15 is a cross-sectional view of a semiconductor module according to a twelfth embodiment.

FIG. 15 illustrates the vicinity of the pair of power terminals 51 of the semiconductor module 10. The pair of power terminals 51 are electrically connected to the first heat dissipation member 41 and the second heat dissipation member 42, respectively. One power terminal 51*a* is bonded to the internal metal plate 45 by a bonding member C77. The other power terminal 51*b* is bonded to the internal metal plate 48 by a bonding member C78. One power path is provided by the power terminal 51*a*, the bonding member C77, and the internal metal plate 45. The other power path is provided by the power terminal 51*b*, the bonding member C78, and the internal metal plate 48. For example, the power terminal 51*a* is connected to the positive electrode line 52, and the power terminal 51*b* is connected to the negative electrode line 54. The relationship between the power terminals 51*a* and 51*b* and the positive and negative electrodes may be reversed.

In the present embodiment, the wiring member 80 is provided by a wiring member C80. The wiring member C80 connects the signal pad 35 of the semiconductor element 30 and the signal terminal 61. Further, the wiring member C80 also reaches between the pair of power terminals 51*a* and 51*b*. A part of the wiring member C80 is disposed between the pair of power terminals 51*a* and 51*b*. In the wiring member C80, the pair of power terminals 51*a* and 51*b* are positioned in a stacked manner so as to overlap both surfaces of the wiring member C80. A resin layer C89 of the wiring member C80 is disposed between the pair of power terminals 51*a* and 51*b*. The resin layer C89 is formed as an extension portion extending from a main portion of the wiring member C80 that is disposed so as to bridge between the signal pad 35 and the signal terminal 61. The resin layer C89 extends in a tongue shape from the main portion including the metal layer 82. Each of the power terminals 51*a* and 51*b* has an embedded portion embedded in the resin member 20 and an exposed portion exposed from the resin member 20. The resin layer C89 is disposed between the power terminal 51*a* and the power terminal 51*b* over the entire region of the embedded portion of the power terminals 51*a* and 51*b*. The resin layer C89 slightly extends to the exposed portions of the power terminals 51*a* and 51*b*.

In the embedded portion, electrical insulation between the power terminal 51*a* and the power terminal 51*b* is provided by the resin layer C89. In the embedded portion, the resin member 20 does not enter between the power terminal 51*a* and the power terminal 51*b*. Further, also in the exposed portion, the resin member 20 does not enter between the power terminal 51*a* and the power terminal 51*b*. In order to provide this state, the resin layer C89 is positioned so as to be exposed from the resin member 20 between the power terminals 51*a* and 51*b*. The resin member 20, which is molded by flowing and curing in the molding process, includes many unstable elements with respect to electrical insulation properties such as a thickness, a density, and the amount of foreign substance mixed thereto, as compared with the resin layer C89. In the present embodiment, the electrical insulation between the pair of power terminals 51*a* and 51*b* is provided solely by the resin layer C89 of the wiring member C80. As a result, even when the pair of power terminals 51*a* and 51*b* are disposed close to each other, the electrical insulation is stably provided.

The power terminal 51*a* and the power terminal 51*b* are disposed so close to each other as to exert mutual electromagnetic effects. The power terminal 51*a* and the power terminal 51*b* are disposed by arranging the resin layer C89 in a stacked manner. The power terminal 51*a* and the power terminal 51*b* are disposed close to each other with a distance corresponding to the thickness of the resin layer C89. Since currents flow in opposite directions in the power terminal 51*a* and the power terminal 51*b*, the mutual electromagnetic action acts to suppress the inductance component. The inductance component causes a surge in high-speed switching of the semiconductor module 10. Therefore, it is necessary to use the semiconductor module 10 while suppressing the switching speed. The suppression of the inductance component suppresses surge and enables high-speed switching. As a result, the present embodiment provides the semiconductor module 10 capable of high-frequency driving.

The configuration of the present embodiment can be adopted in the semiconductor module 10 having a single semiconductor element 30. Further, the configuration of the present embodiment can also be adopted in the semiconductor module 10 having a plurality of semiconductor elements 30 and accommodating one switching arm. In this case, the plurality of semiconductor elements 30 in the semiconductor module 10 can be arranged to provide various conduction paths. For example, the plurality of semiconductor elements 30 can adopt an arrangement in which a current flows in an N-shape in the semiconductor module 10, an arrangement in which a current flows in a U-shape in the semiconductor module 10, or the like.

Figure 16:
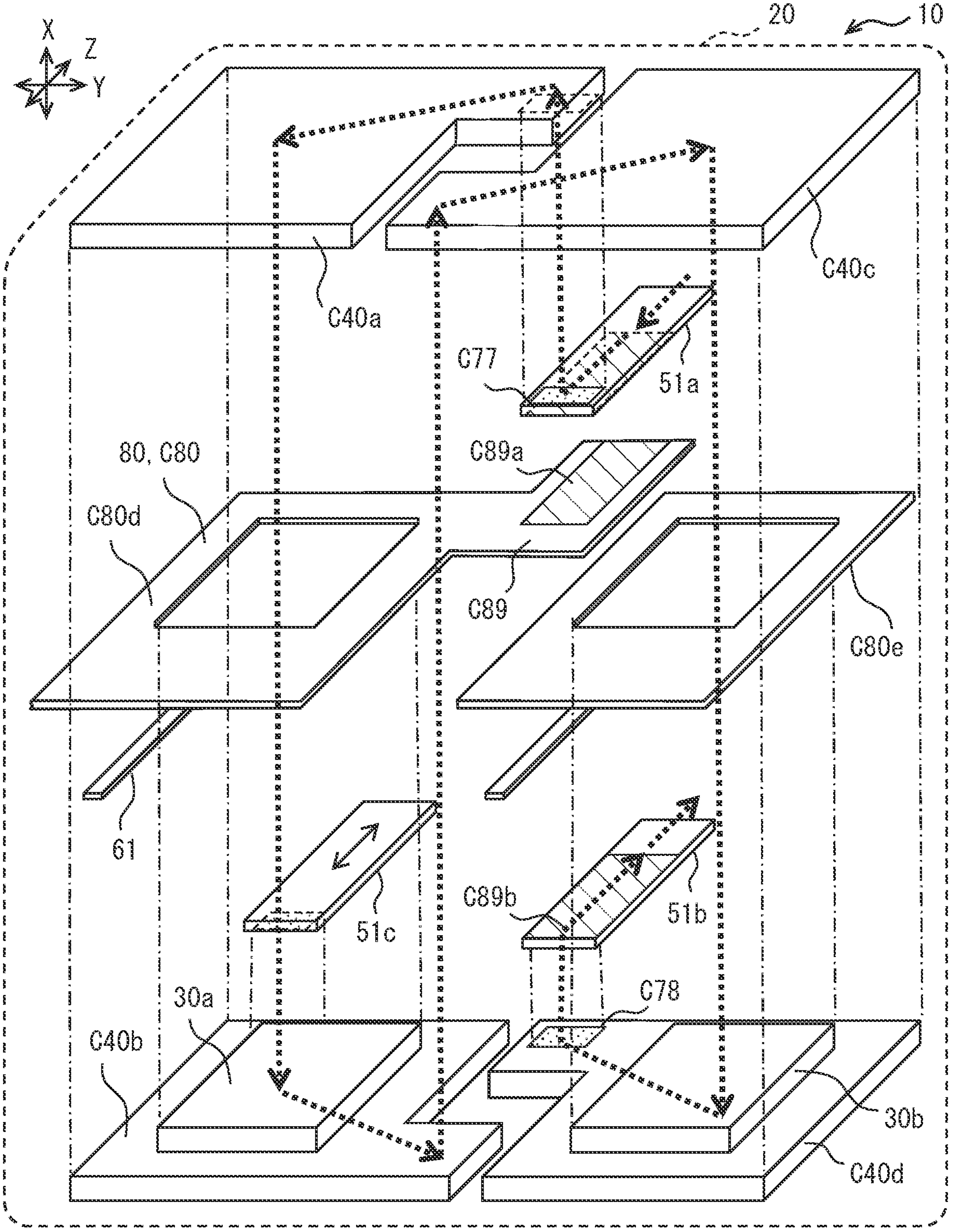
FIG. 16 is an exploded perspective view of the semiconductor module.

FIG. 16 is an exploded perspective view showing the semiconductor module 10 that provides one switching arm. The illustrated example is an arrangement in which a current flows in the semiconductor module 10 in an N-shape. The semiconductor module 10 includes four heat dissipation members C40*a*, C40*b*, C40*c*, and C40*d* in the resin member 20. These heat dissipation members may be given first to fourth names. The semiconductor module 10 includes, as the power terminals 51, a power terminal 51*a* on the positive electrode side, a power terminal 51*b* on the negative electrode side, and a power terminal 51*c* as an AC terminal. These power terminals may be given first to third names. The semiconductor module 10 includes two semiconductor elements 30*a* and 30*b*. The semiconductor module 10 further includes a wiring member C80*d* for the semiconductor element 30*a* and a wiring member C80*e* for the semiconductor element 30*b*. The wiring member C80*d* and the wiring member C80*e* may be integrally formed of a continuous resin material. In the drawing, one signal terminal 61 is illustrated.

The heat dissipation member C40*a* and the heat dissipation member C40*b* are bonded via the semiconductor element 30*a*. The heat dissipation member C40*c* and the heat dissipation member C40*d* are bonded via the semiconductor element 30*b*. These bonds are provided by the bonding member 70. The heat dissipation member C40*b* and the heat dissipation member C40*c* have an overlapping portion positioned to overlap in the stacking direction (X direction). The overlapping portion is provided by a protruding portion protruding from a part of the heat dissipation members C40*b* and C40*c*. In the overlapping portion, the heat dissipation member C40*b* and the heat dissipation member C40*c* are bonded by the bonding member 70. The heat dissipation member C40*a* and the power terminal 51*a* are bonded by a bonding member C77. The heat dissipation member C40*c* and the power terminal 51*b* are bonded by a bonding member C78.

The wiring member C80 for the semiconductor element 30*a* has a tongue-shaped resin layer C89. The resin layer C89 is interposed between the power terminal 51*a* and the power terminal 51*b*. The resin layer C89 and the power terminal 51*a* face each other at a facing surface C89*a*. The resin layer C89 and the power terminal 51*a* are in close contact with each other at the facing surface C89*a*. The resin layer C89 and the power terminal 51*b* face each other at a facing surface C89*b*. The resin layer C89 and the power terminal 51*b* are in close contact with each other at the facing surface C89*b*. The close contact between the resin layer C89 and the power terminals 51*a* and 51*b* restricts the resin member 20 from entering in the molding process. The close contact between the resin layer C89 and the power terminals 51*a* and 51*b* restricts entry of foreign substances even after completion of the semiconductor module 10.

In the drawing, for example, a current path in a case where a current flows from the power terminal 51*a* to the power terminal 51*b* is illustrated by a thick broken line arrow. The power terminal 51*a* and the power terminal 51*b* are electrically insulated from each other by the resin layer C89. Since the current flowing through the power terminal 51*a* and the current flowing through the power terminal 51*b* are disposed close to each other by the resin layer C89, the inductance component is suppressed by the mutual electromagnetic action. The heat dissipation member C40*a* and the heat dissipation member C40*d* have an overlapping portion positioned to overlap in the stacking direction (X direction). The overlapping portion is provided by a protruding portion protruding from a part of the heat dissipation members C40*a* and C40*d*. In the overlapping portion, the resin layer C89 is disposed between the heat dissipation member C40*a* and the heat dissipation member C40*d*. As a result, the resin layer C89 improves electrical insulation between the heat dissipation member C40*a* and the heat dissipation member C40*d* in the overlapping portion.

According to the present embodiment, the inductance component in the pair of power terminals 51 is suppressed.

As a result, the present embodiment provides the semiconductor module 10 capable of high-frequency driving.

Thirteenth Embodiment

The present embodiment is a modification example which is based on the preceding embodiment(s). In the preceding embodiment(s), the semiconductor element 30 and the first heat dissipation member 41 are bonded to each other only by the bonding member 70. In this case, if the thickness of the bonding member 70 is small, the flow of the resin member 20 in the molding process may be inhibited. In addition, the thickness of the bonding member 70 may allow inclination of the semiconductor element 30, and electrical insulation may be impaired. In the present embodiment, a spacer member D77 having a predetermined thickness is disposed between the semiconductor element 30 and the first heat dissipation member 41 in addition to the bonding member 70. In one aspect, the present embodiment provides the semiconductor module 10 appropriately molded by the resin member 20. In another aspect, the present embodiment provides the semiconductor module 10 in which the thickness of the bonding member 70 is suppressed and the inclination of the semiconductor element 30 is suppressed.

Figure 17:
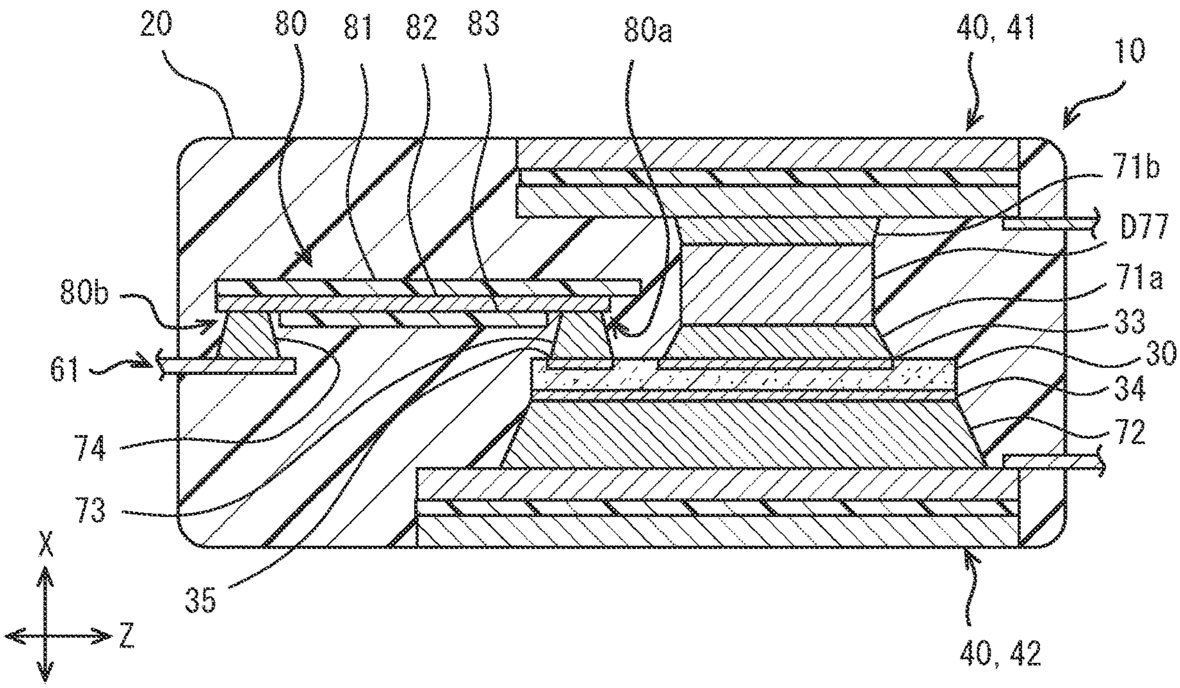
FIG. 17 is a cross-sectional view of a semiconductor module according to a thirteenth embodiment.

In FIG. 17, the semiconductor module 10 includes the bonding member 70 and the spacer member D77 between the semiconductor element 30 and the first heat dissipation member 41. The spacer member D77 is made of a material having high electrical conductivity and high thermal conductivity. In the present embodiment, the spacer member D77 is provided by a metal plate made of copper or aluminum. The spacer member D77 is provided in the first bonding member 71 between the semiconductor element 30 and the first heat dissipation member 41. The spacer member D77 may also be referred to as a terminal member for the semiconductor element 30. The first bonding member 71 includes a first layer 71*c* located between the power pad 33 of the semiconductor element 30 and the spacer member D77, and a second layer 71*d* located between the spacer member D77 and the first heat dissipation member 41. It can also be said that the spacer member D77 partitions the first bonding member 71 into the first layer 71*c* and the second layer 71*d*. The first layer 71*c* and the second layer 71*d* may be continuous on the side surface of the spacer member D77.

The spacer member D77 adjusts the distance between the semiconductor element 30 and the first heat dissipation member 41 to a predetermined value or more. The predetermined value is a gap to the extent that the fluidity of the resin member 20 in the molding process is favorably maintained. By providing the gap of the predetermined value or more, the resin member 20 can flow into the gap between the semiconductor element 30 and the first heat dissipation member 41. For example, the resin member 20 can flow into the vicinity of the first bonding portion 80*a* of the wiring member 80. As a result, generation of voids in the resin member 20 is suppressed, and the resin member 20 is appropriately molded. The appropriately molded resin member 20 stably supports and fixes a plurality of components at predetermined positions. In addition, the appropriately molded resin member 20 provides required electrical insulation.

The spacer member D77 suppresses the thickness of the bonding member 70 between the semiconductor element 30 and the first heat dissipation member 41. The thickness of the first bonding member 71 is limited to the thickness of the first layer 71*c* and the thickness of the second layer 71*d*. Accordingly, the inclination of the semiconductor element 30 and the inclination of the first heat dissipation member 41 are suppressed.

Fourteenth Embodiment

The present embodiment is a modification example which is based on the preceding embodiment(s). In the preceding embodiment(s), the wiring member 80 includes the resin layers 81 and 83 and the metal layer 82. The wiring member 80 may be deformed in the molding process. For example, the wiring member 80 may be warped and deformed such that residual stress is generated in the bonding portions 80*a* and 80*b*. In addition, the flexible wiring member 80 may cause unintended deterioration in the electrical insulation property due to deformation in a molding process. In the present embodiment, a wiring member E80 including an additional metal layer E90 is used so as to cause plastic deformation to such an extent that a predetermined shape is maintained. The additional metal layer E90 imparts mechanical strength capable of maintaining a predetermined shape to the wiring member E80 while having flexibility deformable by reversible plastic deformation. The present embodiment provides the semiconductor module 10 in which unintended deformation of the wiring member 80 is suppressed.

Figure 18:
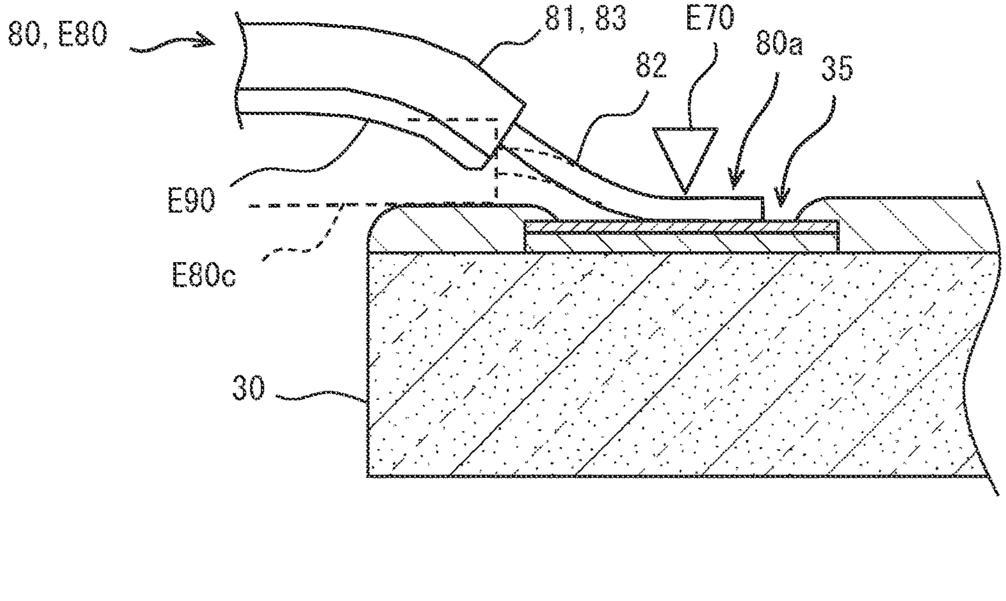
FIG. 18 is an enlarged cross-sectional view of a semiconductor module according to a fourteenth embodiment.

FIG. 18 is an enlarged cross-sectional view of the first bonding portion 80*a*. The wiring member 80 is provided by the wiring member E80. The semiconductor element 30 has a signal pad 35. The metal layer 82 is bonded to the signal pad 35 at the first bonding portion 80*a*. In the drawing, a bonding means E70 for bonding the metal layer 82 and the signal pad 35 is illustrated by a triangular symbol. The bonding means E70 includes various bonding means available for electrical connection of the metal layer 82. The bonding means E70 includes the bonding member 70 described in the preceding embodiment(s). The bonding means E70 includes welded-joining such as laser welding and electric welding.

The wiring member E80 further includes an additional metal layer E90 in addition to the resin layers 81 and 82 and the metal layer 82 as a conductive member. The additional metal layer E90 is additionally provided to the wiring member E80. The additional metal layer E90 is made of, for example, stainless steel. The additional metal layer E90 is bonded to the resin layer 83. The additional metal layer E90 is located only on the surface of the resin layer 83 and is not added to the exposed portion of the metal layer 82. The additional metal layer E90 is electrically insulated from the metal layer 82 as a signal path. A resin layer may be additionally provided so as to cover the additional metal layer E90.

The additional metal layer E90 has rigidity capable of reversible plastic deformation. As a result, although the wiring member E80 is more flexibly deformable than the signal terminals 61, the wiring member E80 has rigidity enough to maintain its shape under the pressure of the resin member 20 in the molding process. The wiring member E80 suppresses deformation in the molding process. As a result, warping deformation in the first bonding portion 80*a* or the second bonding portion 80*b* is suppressed. The suppression of the warpage deformation suppresses stress that may destabilize the bonding in the first bonding portion 80*a* or the second bonding portion 80*b* or break the bonding. As a result, the present embodiment provides the semiconductor module 10 having high reliability.

The wiring member E80 is deformed so as to be curved in a direction away from the surface of the semiconductor element 30. In the drawing, a wiring member E80*c* of a comparative example is illustrated by a broken line. The wiring member E80*c* of the comparative example has a flat plate shape. The wiring member E80*c* of the comparative example is disposed in contact with the surface of the semiconductor element 30. In this case, the wiring member E80*c* of the comparative example may cause dielectric breakdown. The wiring member E80 having a shape curved in a direction away from the surface of the semiconductor element 30 can suppress the possibility of dielectric breakdown. For example, the curved shape of the wiring member E80 allows the resin member 20 to flow into the gap between the wiring member E80 and the surface of the semiconductor element 30. The resin member 20 flowing into the gap suppresses the possibility of dielectric breakdown.

Fifteenth Embodiment

The present embodiment is a modification example which is based on the preceding embodiment(s). In the preceding embodiment(s), the wiring member E80 includes an additional metal layer E90 that undergoes plastic deformation. When the wiring member E80 is used, the end surface of the wiring member E80 is disposed in the vicinity of the semiconductor element 30. In this case, noise may be generated in the metal layer 82 due to the influence of a large amount of current flowing through the semiconductor element 30. The present embodiment uses the additional metal layer E90 as a shield layer against electromagnetic noise.

Figure 19:
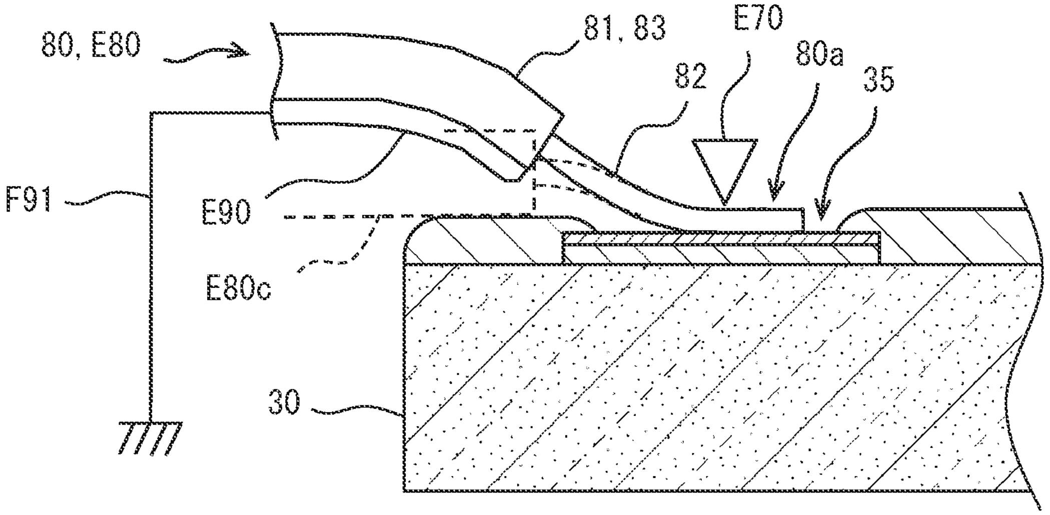
FIG. 19 is a cross-sectional view of a semiconductor module according to a fifteenth embodiment.

In FIG. 19, the wiring member 80 is provided by a wiring member E80. The additional metal layer E90 is disposed so as to overlap the metal layer 82 for the signal path. The additional metal layer E90 extends over the entire plate-shaped range of the wiring member E80. The wiring member E80 includes a grounding member F91 that electrically grounds the additional metal layer E90. A non-limiting example of the grounding member F91 grounds the additional metal layer E90 to the reference potential of the semiconductor element 30. When the semiconductor element 30 includes the signal pad 35 of the reference potential, the grounding member F91 grounds the additional metal layer E90 to the signal pad 35 of the reference potential. The reference potential is a Kelvin emitter potential (KE potential) when the SW element is an IGBT, and is given by a Kelvin source potential (KS potential) when the SW element is a MOSFET. The additional metal layer E90 functions as an electromagnetic shield layer for the metal layer 82. The additional metal layer E90 suppresses noise related to the metal layer 82 included in the wiring member E80. As a result, according to the present embodiment, the semiconductor module 10 in which noise is suppressed is provided.

Sixteenth Embodiment

The present embodiment is a modification example which is based on the preceding embodiment(s). In the preceding embodiment(s), the bonding process is performed after the bonding member 70 is disposed between the signal pad 35 and the metal layer 82 or between the signal terminal 61 and the metal layer 82. In this case, it is difficult to accurately manage the volume of the bonding member 70. If the volume of the bonding member 70 is insufficient with respect to an appropriate amount, bonding failure occurs. If the volume of the bonding member 70 is excessive with respect to the appropriate amount, unintended bonding may occur. In addition, the disposed bonding member 70 may leak before the bonding process. The present embodiment makes it possible to reliably and easily manage the volume of the bonding member 70 in the first bonding portion 80*a* and/or the second bonding portion 80*b*.

Figure 20:
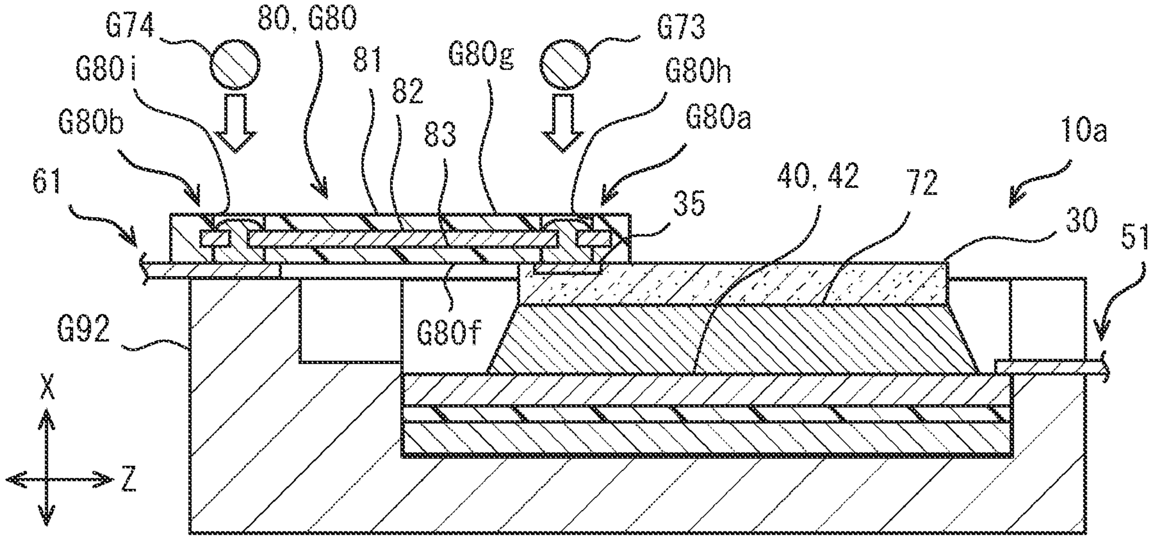
FIG. 20 is a cross-sectional view in a bonding process according to a sixteenth embodiment.

In FIG. 20, the wiring member 80 is provided by a wiring member G80. The drawing shows an intermediate state in the manufacturing method showing the third bonding process and/or the fourth bonding process related to the wiring member G80. The intermediate product 10*a* is placed and held on a jig G92 used in the manufacturing method. The jig G92 is provided by a holder that can be positioned in a melting furnace that melts the bonding member 70, or a conveyor that conveys the intermediate product 10*a*. The intermediate product 10*a* includes the second heat dissipation member 42 and the semiconductor element 30 bonded to the second heat dissipation member 42 by the second bonding member 72. The intermediate product 10*a* further includes a power terminal 51 and a signal terminal 61. The power terminal 51 and the signal terminal 61 are held by a jig G92. The intermediate product 10*a* further includes a wiring member G80. The wiring member G80 is arranged and held at a prescribed position using an alignment mark provided on the wiring member G80 and the semiconductor element 30. The alignment mark can be provided in the vicinity of the signal pad 35 of the semiconductor element 30.

The wiring member G80 has a first surface G80*f* facing the semiconductor element 30 and a second surface G80*g* opposite to the first surface G80*f*. In the first bonding portion 80*a*, the wiring member G80 has an opening G80*h* through which the third bonding member G73 can be supplied from the top in the gravity direction. In the second bonding portion 80*b*, the wiring member G80 has an opening G80*i* through which the fourth bonding member G74 can be supplied from the top in the gravity direction.

Figure 21:
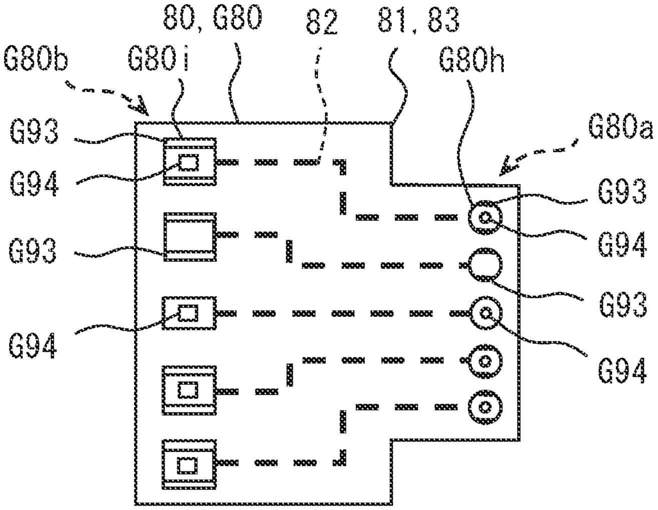
FIG. 21 is a plan view of a wiring member.

FIG. 21 is a plan view showing a wiring member G80 in the present embodiment. The wiring member G80 has an opening G80*h* and a metal layer 82 exposed to the opening G80*h* in the first bonding portion 80*a*. The metal layer 82 has a gap G93 as a communication portion between the metal layer 82 and the opening G80*h*. A part of the third bonding member G73 supplied from the top passes through the gap G93 and bonds the metal layer 82 and the signal pad 35. The metal layer 82 has a hole G94 as a communicating portion that communicates with the opening G80*h* and opens on both surfaces of the metal layer 82. A part of the third bonding member G73 supplied from the top passes through the hole G94 and bonds the metal layer 82 and the signal pad 35. As illustrated, only one of the gap G93 and the hole G94 may be provided. In any of the configurations, the communication portion that allows the front and back surfaces of the metal layer 82 to communicate with each other is provided in the opening G80*h*.

The wiring member G80 has an opening G80*i* and a metal layer 82 exposed to the opening G80*i* in the second bonding portion 80*b*. The metal layer 82 has the gap G93 as a communication portion between the metal layer 82 and the opening G80*i*. A part of the fourth bonding member G74 supplied from the top passes through the gap G93 and bonds the metal layer 82 and the signal terminal 61. The metal layer 82 has the hole G94 as the communication portion that communicates with the opening G80*i* and is open on both surfaces of the metal layer 82. A part of the fourth bonding member G74 supplied from the top passes through the hole G94 and bonds the metal layer 82 and the signal terminal 61. As illustrated, only one of the gap G93 and the hole G94 may be provided. In any of the configurations, the communication portion that allows the front and back surfaces of the metal layer 82 to communicate with each other is provided in the opening G80*i*.

Returning to FIG. 20, in the bonding process, the third bonding member G73 can be supplied from the top in the gravity direction by a manufacturing method of dropping the third bonding member G73 in a molten state. After being dropped, the third bonding member G73 flows between the metal layer 82 and the signal pad 35 through the communication portion, bonds them, and is cured. In the bonding process, the fourth bonding member G74 can be supplied from the top in the gravity direction by a manufacturing method of dropping the fourth bonding member G74 in a molten state. After being dropped, the fourth bonding member G74 flows between the metal layer 82 and the signal terminal 61 through the communication portion, bonds the metal layer 82 and the signal terminal 61, and is cured.

The bonding process may include a supplying process and a heating process. In the supply process, the paste-like or solid-like third bonding member G73 is supplied to the opening G80*h* from the top in the gravity direction. In the heating process, the third bonding member G73 is melted. Accordingly, the third bonding member G73 flows between the metal layer 82 and the signal pad 35 through the communication portion, bonds the metal layer 82 and the signal pad 35, and is cured. In the supply process, the fourth bonding member G74 in a paste form or a solid form is supplied to the opening G80*i* from the top in the gravity direction. In the heating process, the fourth bonding member G74 is melted. Accordingly, the fourth bonding member G74 flows between the metal layer 82 and the signal terminal 61 through the communication portion, bonds the metal layer 82 and the signal terminal 61, and is cured.

According to the present embodiment, the third bonding member G73 or the fourth bonding member G74 can be supplied to the opening G80*h* or the opening G80*i* from the top in the gravity direction. This makes it easy to manage the volume.

Seventeenth Embodiment

The present embodiment is a modification example which is based on the preceding embodiment(s). In the preceding embodiment(s), the wiring member 80 is bonded by the bonding member 70 cured after being melted. Alternatively, the present embodiment employs a contact welding method as the bonding means.

Figure 22:
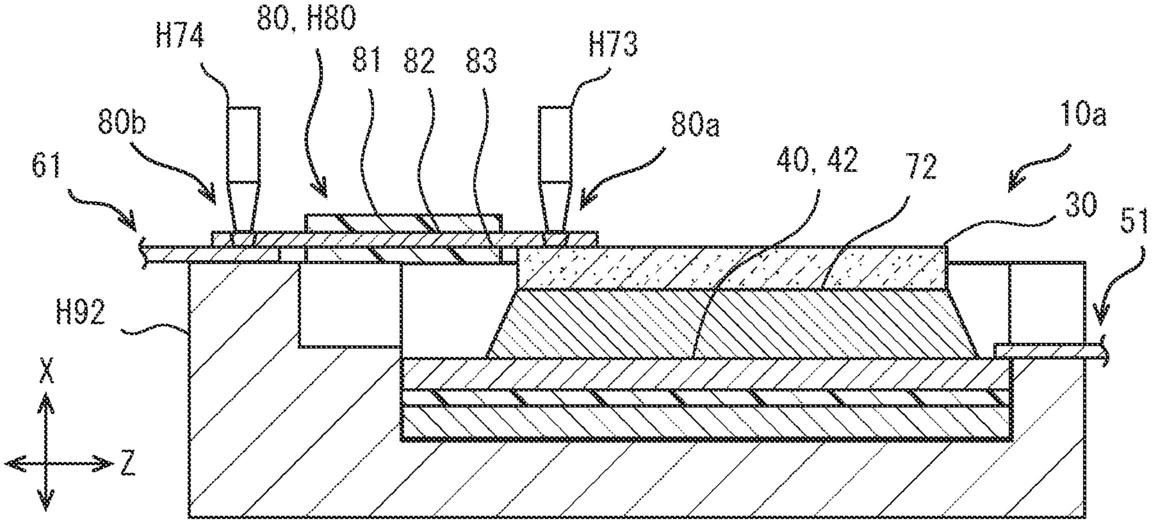
FIG. 22 is a cross-sectional view in a bonding process according to a seventeenth embodiment.

In FIG. 22, the wiring member 80 is provided by a wiring member H80. The intermediate product 10*a* is placed and held on a jig H92 used in the manufacturing method. The jig H92 is provided by a holder suitable for welding the metal layer 82 of the wiring member H80 to the signal pad 35 and the signal terminal 61, or a conveyor that conveys the intermediate product 10*a*. The welding of the metal layer 82 is performed by the welding tools H73 and H74. The welding tools H73 and H74 are welding tools with physical contact. In a case where the welding is ultrasonic welding, the welding tools H73 and H74 are provided by an ultrasonic oscillator and a horn. The ultrasonic welding welds the metal layer 82 and the signal pad 35. The ultrasonic welding welds the metal layer 82 and the signal terminal 61. In a case where the welding is electric welding, the welding tools H73, H74 are provided by welding electrodes. The jig H92 provides a current path through which a welding current flows. The electric welding welds the metal layer 82 and the signal pad 35. The electric welding welds the metal layer 82 and the signal terminal 61.

Eighteenth Embodiment

The present embodiment is a modification example which is based on the preceding embodiment(s). In the preceding embodiment(s), the wiring member 80 is bonded by the bonding member 70 cured after being melted. Alternatively, the present embodiment employs a non-contact welding method as the bonding means.

Figure 23:
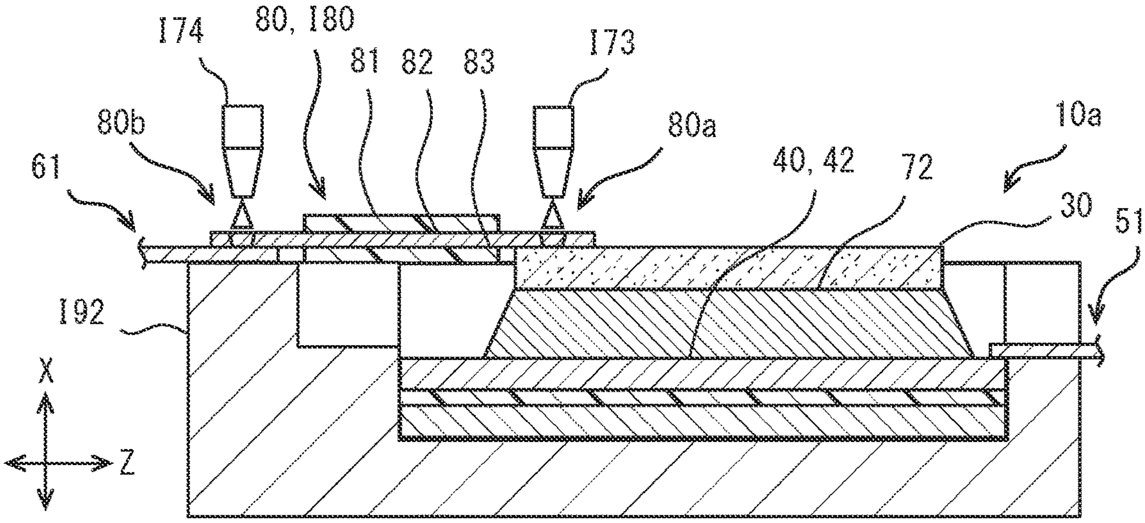
FIG. 23 is a cross-sectional view in a bonding process according to an eighteenth embodiment.

In FIG. 23, the wiring member 80 is provided by a wiring member I80. The intermediate product 10*a* is placed and held on a jig I92 used in the manufacturing method. The jig I92 is provided by a holder suitable for welding the metal layer 82 of the wiring member I80 to the signal pad 35 and the signal terminal 61, or a conveyor that conveys the intermediate product 10*a*. The welding of the metal layer 82 is performed by the supply of high energy supplied from the welding tools I73, I74. The welding instruments I73 and I74 are non-contact welding instruments that do not involve physical contact. In a case where the welding is laser welding, the welding tools I73, I74 are provided by a laser oscillator and a laser guide. The laser welding welds the metal layer 82 and the signal pad 35. The laser welding welds the metal layer 82 and the signal terminal 61.

Nineteenth Embodiment

The present embodiment is a modification example which is based on the preceding embodiment(s). In the preceding embodiment(s), the semiconductor element 30 may be bonded only by the bonding member 70. The bonding member 70 is a material that is cured after being melted. Therefore, the semiconductor element 30 may be fixed in an inclined state. The inclination of the semiconductor element 30 may cause a decrease in electrical insulation or a decrease in thermal conductivity. The present embodiment provides the semiconductor module 10 having desired electrical characteristics by suppressing the inclination of the semiconductor element 30 with respect to the heat dissipation member 40.

Figure 24:
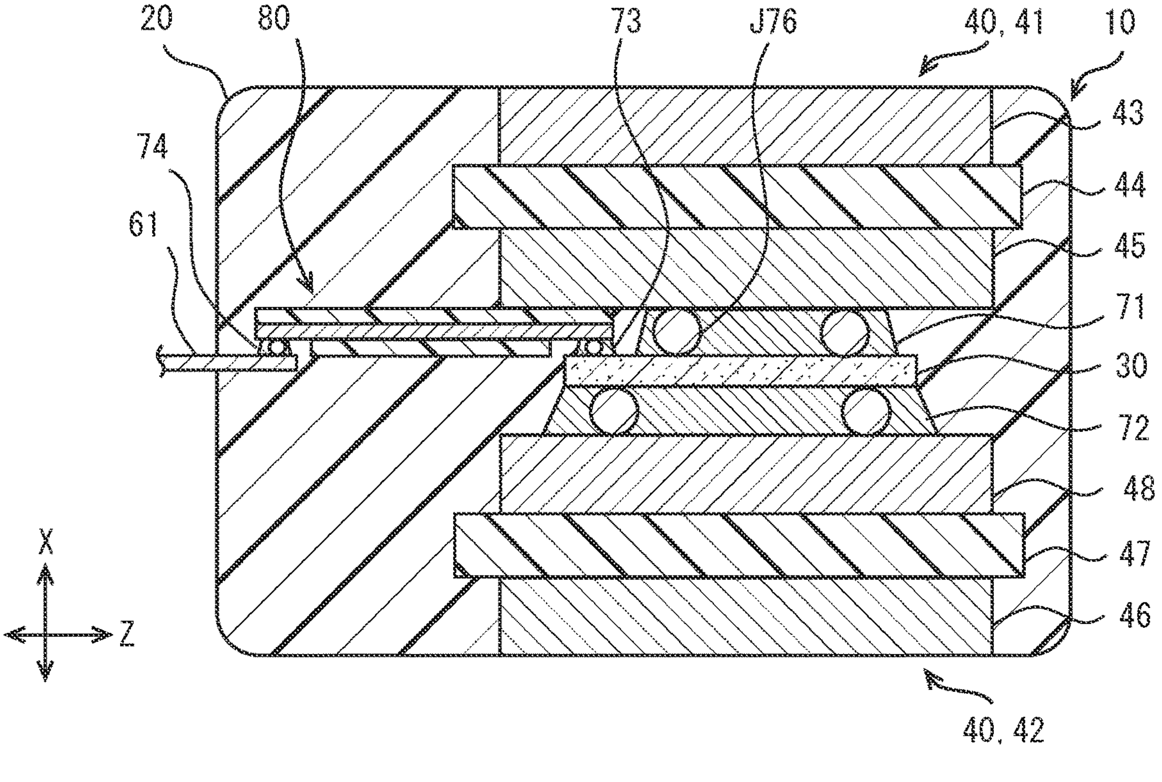
FIG. 24 is a cross-sectional view of a semiconductor module according to a nineteenth embodiment.

In FIG. 24, an inclination suppression member J76 for suppressing the inclination of the semiconductor element 30 is disposed in the bonding member 70 between the semiconductor element 30 and the heat dissipation member 40. The inclination suppression member J76 can be provided by a metal ball or the like having high electrical conductivity and high thermal conductivity. The metal ball may be made of copper, nickel, or the like. These metal balls do not hinder melting and curing of the bonding member 70. In the illustrated example, the inclination suppression members J76 are provided in the first bonding member 71, the second bonding member 72, the third bonding member 73, and the fourth bonding member 74. From the viewpoint of suppressing the inclination of the semiconductor element 30, the inclination suppression member J76 is preferably provided in the first bonding member 71 and/or the second bonding member 72. Since the inclination suppression member J76 adjusts the thickness of the bonding member 70 within a predetermined range, the inclination suppression member J76 can also be referred to as a thickness setting member.

A non-limiting example of the inclination suppression member J76 is provided by the metal ball described in the present embodiment. A non-limiting example of the inclination suppression member J76 can be provided by the wiring member 80 disposed outside the semiconductor element 30. In this case, the wiring member 80 may include a frame-shaped portion surrounding the semiconductor element 30. A non-limiting example of the inclination suppression member J76 can be provided by a protrusion that partially protrudes from the heat dissipation member 40 toward the semiconductor element 30. In this case, the heat dissipation member 40 may include a plurality of protrusions. The inclination suppression member J76 is provided by, for example, stud bonding protruding from the heat dissipation member 40 toward the semiconductor element 30. A non-limiting example of the inclination suppression member J76 can be provided by a groove provided corresponding to the outer peripheral portion of the semiconductor element 30 in the heat dissipation member 40. A non-limiting example of the inclination suppression member J76 can be provided by an insulating film disposed on the surface of the heat dissipation member 40 facing the semiconductor element 30.

The wiring member 80 illustrated in FIG. 9 or FIG. 14 is also effective as the inclination suppression member J76. In these examples, the wiring member 80 is positioned so as to surround the semiconductor element 30, thereby defining the thickness of the bonding member 70. Therefore, the wiring member 80 in these examples acts as the inclination suppression member J76.

Twentieth Embodiment

The present embodiment is a modification example which is based on the preceding embodiment(s). The present embodiment shows an example of the inclination suppression member.

Figure 25:
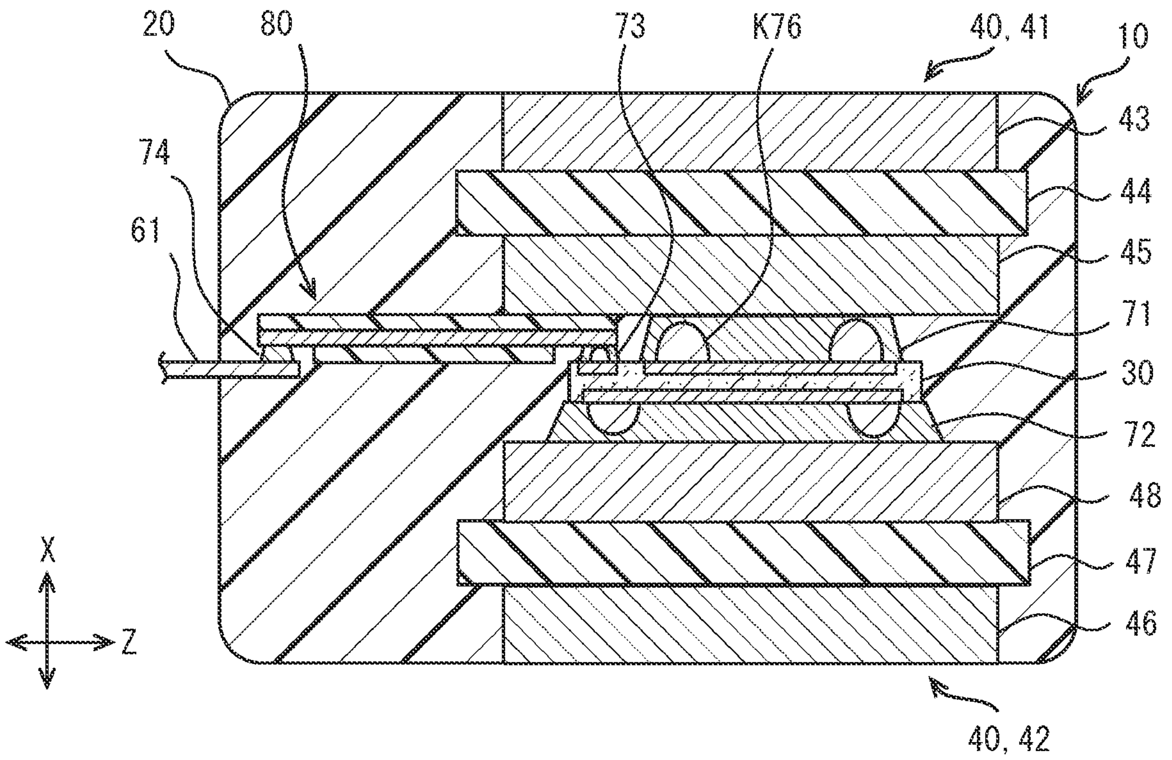
FIG. 25 is a cross-sectional view of a semiconductor module according to a twentieth embodiment.

In FIG. 25, the semiconductor element 30 includes an inclination suppression member K76 on at least one surface. The inclination suppression member K76 suppresses inclination of the semiconductor element 30 with respect to the heat dissipation member 40. The inclination suppression member K76 is provided by stud bonding formed on at least one surface of the semiconductor element 30. The stud bonding provides a conductive protrusion on the surface of the semiconductor element 30. The stud bonding may also be referred to as a stud bump. The stud bonding is made of metal such as gold, copper, or aluminum.

In the illustrated example, the semiconductor element 30 includes a plurality of inclination suppression members K76 on both surfaces thereof. On one surface of the semiconductor element 30, the inclination suppression member K76 is formed to be positioned in the first bonding member 71. The inclination suppression member K76 is provided by, for example, a plurality of stud bondings which are formed within the range of the power pad 33 and protrude from the semiconductor element 30 toward the first heat dissipation member 41. On the other surface of the semiconductor element 30, the inclination suppression member K76 is formed so as to be positioned in the second bonding member 72. The inclination suppression member K76 is provided by, for example, a plurality of stud bondings which are formed within the range of the power pad 34 and protrude from the semiconductor element 30 toward the second heat dissipation member 42.

In the bonding process of the manufacturing method, excessive approach between the heat dissipation member 40 and a portion other than the power pads 33 and 34, such as the side surface of the semiconductor element 30, may cause unintended deterioration of the insulation state or destruction. In a case where the thickness of the bonding member 70 in contact with the semiconductor element 30 is partially or entirely smaller than a predetermined minimum thickness, there is a concern about the excessive approach.

According to the present embodiment, when the bonding member 70 is in the molten state, the inclination suppression member K76 suppresses the inclination of the semiconductor element 30 with respect to the heat dissipation member 40. In another aspect, the inclination suppression member K76 is also referred to as a thickness defining member that defines the thickness of the bonding member 70. Further, the inclination suppression member K76 is positioned in the bonding member 70. The inclination suppression member K76 is made of a metal that easily conforms to the bonding member 70 in a molten state and is easily bonded to the bonding member 70. Therefore, the inclination suppression member K76 restricts the bonding member 70 from flowing away from the surface of the semiconductor element 30 in the bonding process of the manufacturing method. In other words, the inclination suppression member K76 acts to hold the bonding member 70 above and/or below the surface of the semiconductor element 30. In this aspect, the inclination suppression member K76 is also referred to as a flow suppression member that suppresses the flow of the bonding member 70.

In the bonding process of the manufacturing method, when the bonding member 70 is in a molten state, the inclination suppression member K76 suppresses the thickness of the bonding member 70 in contact with the semiconductor element 30 from becoming smaller than a predetermined minimum thickness. As a result, the inclination of the semiconductor element 30 is suppressed. In other words, a situation in which a portion other than the power pads 33 and 34, such as the side surface of the semiconductor element 30, excessively approaches the heat dissipation member 40 is suppressed.

Twenty-First Embodiment

The present embodiment is a modification example which is based on the preceding embodiment(s). In the preceding embodiment(s), the wiring member 80 electrically connects the signal pad 35 and the signal terminal 61 in the semiconductor element 30. In a manufacturing method, the wiring member 80 may be positioned with reference to the signal pad 35. In this case, the signal terminal 61 and the wiring member 80 may not be positioned in an intended positional relationship due to a positional deviation, a dimensional error, or the like of the semiconductor element 30, the signal terminal 61, the wiring member 80, and the like. An opposite situation is also assumed. In a manufacturing method, the wiring member 80 may be positioned with reference to the signal terminal 61. In this case, the signal pad 35 and the wiring member 80 may not be positioned in an intended positional relationship due to a positional deviation, a dimensional error, or the like of the semiconductor element 30, the signal terminal 61, the wiring member 80, and the like. In particular, in a case where the plurality of signal pads 35 are arranged at a relatively small pad pitch, the above-described problem becomes significant. In the present embodiment, an opening L80*h* of the first bonding portion 80*a* is formed to be smaller than an opening L80*i* of the second bonding portion 80*b*. This shape allows for a relatively small pad pitch while allowing for component misalignment and dimensional errors. As a result, the semiconductor module 10 capable of forming electrical connection by the wiring member 80 while allowing error components including positional deviation and dimensional error of components is provided.

Figure 26:
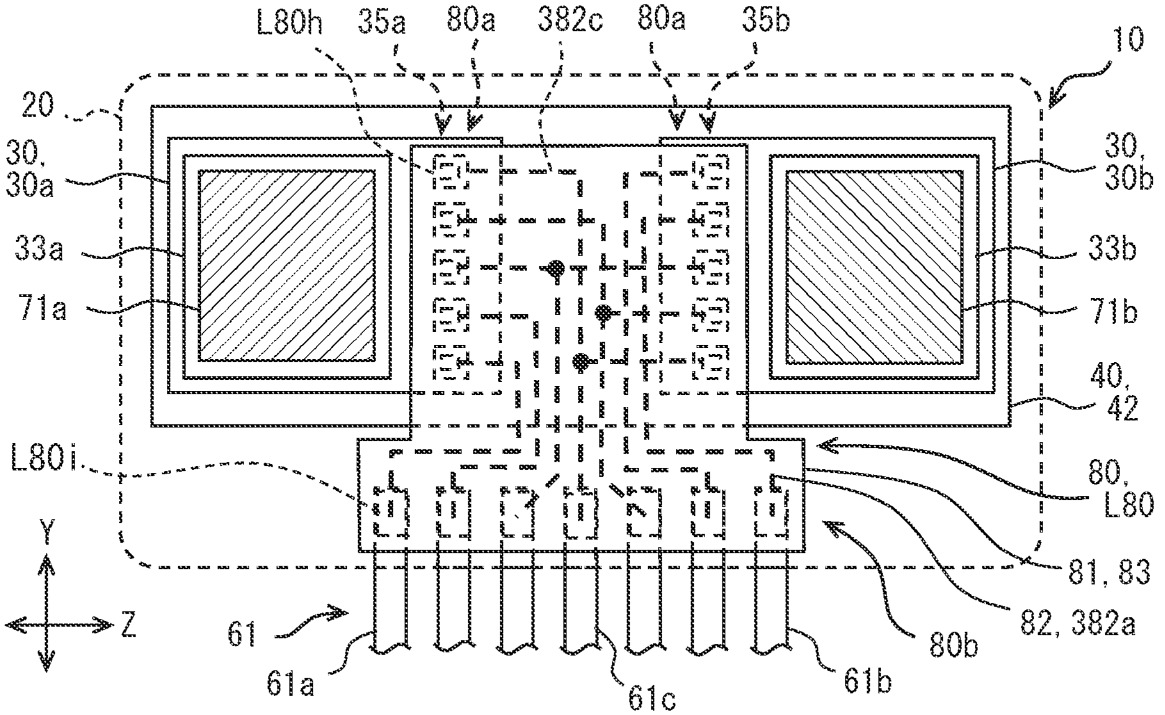
FIG. 26 is a plan view of a semiconductor module according to a twenty-first embodiment.

In FIG. 26, the present embodiment is a modification based on the embodiment shown in FIG. 6 as a basic form. The wiring member 80 is provided by a wiring member L80. The wiring member L80 includes the openings L80*h* for bonding the signal pads 35*a* and 35*b* to the metal layers 82. The wiring member L80 includes the openings L80*i* for bonding the signal terminals 61 and the metal layers 82. The openings L80*h* and L80*i* are window portions provided in the resin layers 81 and 83, and partially expose the metal layers 82. The openings L80*h* and L80*i* are provided as holes. The openings L80*h* and L80*i* may be provided as notches. The area Ah of the opening L80*h* is smaller than the area Ai of the opening L80*i* (Ah<Ai). The difference between the area Ah and the area Ai allows an error component of a plurality of components in the bonding process and enables bonding at the second bonding portion 80*b*. Here, the shape of the opening L80*i* is set according to the error component. For example, when the error components include many error components in the Y direction, the shape of the opening L80*i* is set to a shape having a longitudinal direction in the Y direction. As another example, when the error components include many error components in the Z direction, the shape of the opening L80*i* is set to a shape having a longitudinal direction in the Z direction. As the error components, a positional deviation of the component in the arrangement process and/or a dimensional error of the component in the preparation process can be assumed.

The arrangement process of the manufacturing method is performed so that the first bonding portion 80*a* coincides with the plurality of signal pads 35*a* and 35*b*. That is, the arrangement process is performed such that the openings L80*h* of the wiring member L80 are accurately positioned with respect to the signal pads 35*a* and 35*b*. As a result, when the bonding process is performed after the arrangement process, the plurality of signal pads 35*a* and 35*b* and the plurality of metal layers 82 can be bonded to each other even when the pad pitch is small. Further, in the arrangement process, the second bonding portion 80*b* is disposed in the vicinity of the plurality of signal terminals 61. At this time, the second bonding portion 80*b* having the openings L80*i* with a relatively large area is arranged so as to coincide with the plurality of signal terminals 61 even if there is an error component. At this time, the openings L80*i* having a large area allow an error component and allow the plurality of signal terminals 61 and the plurality of metal layers 82 to be positioned in a positional relationship in which the plurality of signal terminals 61 and the plurality of metal layers 82 can be bonded to each other. For example, a single signal terminal 61 is positioned within the range of the opening L80*i*. Thus, when the bonding process is performed after the arrangement process, even if there is an error component, the plurality of bonding portions between the plurality of signal terminals 61 and the plurality of metal layers 82 are formed while allowing the error component.

According to the present embodiment, even if there is an error component, a plurality of electrical connections between the plurality of signal pads 35*a* and 35*b* and the plurality of signal terminals 61 can be provided by the wiring member L80. In particular, the present embodiment can enable bonding at the plurality of signal pads 35*a*, 35*b* with high positional accuracy even when the plurality of signal pads 35*a*, 35*b* have a small pad pitch. This configuration is effective, for example, when an active region as an element of the semiconductor element 30 is made relatively large by a small pad pitch.

Twenty-Second Embodiment

The present embodiment is a modification example which is based on the preceding embodiment(s). In the preceding embodiment(s), the wiring member 80 includes the metal layer 82 for electrical connection. The wiring member 80 may be flexibly deformed in each of the arrangement process, the bonding process, and the molding process. On the other hand, when the wiring member 80 is excessively deformed, an unintended decrease in electrical insulation may occur. In an aspect, even when the deformation amount of the wiring member 80 is less than the intended deformation amount, there is a concern that desirable electrical characteristics may not be obtained. The present embodiment imparts appropriate rigidity to the wiring member 80. Accordingly, excessive deformation of the wiring member 80 is suppressed. In another aspect, in the present embodiment, different rigidities are imparted to the respective portions of the wiring member 80. Accordingly, it is possible to cause desirable deformation in one portion of the wiring member 80 and suppress deformation in the other portion.

Figure 27:
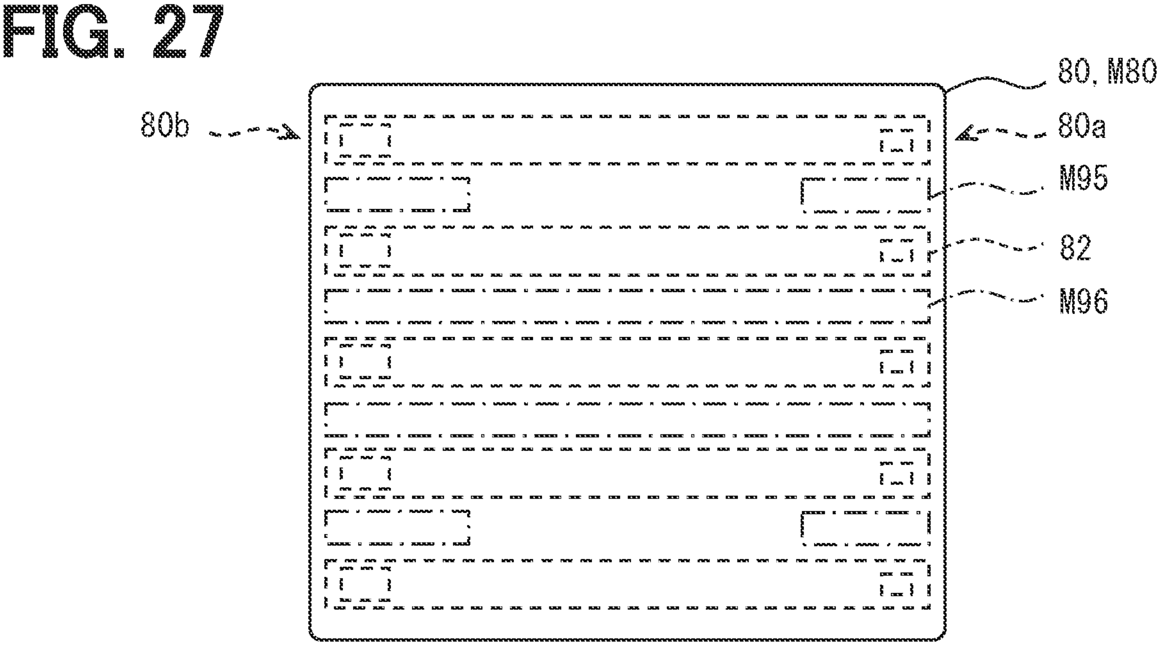
FIG. 27 is a plan view of a wiring member according to a twenty-second embodiment.

In FIG. 27, the wiring member 80 is provided by a wiring member M80. The wiring member M80 includes the metal layers 82 for electrical connection. Further, the wiring member M80 includes additional metal layers M95 and M96 on one side of each metal layer 82, on opposite sides of the metal layer 82, or between the plurality of metal layers 82. The additional metal layers M95 and M96 increase the rigidity of the wiring member M80, as compared to the wiring member 80 that does not include the additional metal layers M95 and M96.

The wiring member M80 may have the additional metal layer only in a part of the wiring member M80 and may not have the additional metal layer in the remaining part. As a non-limiting example, an additional metal layer M95 is illustrated. The additional metal layer M95 is disposed only in the first bonding portion 80*a* and/or the second bonding portion 80*b*. In this case, the additional metal layer M95 adjusts the rigidity of the wiring member M80 in the first bonding portion 80*a* and/or the second bonding portion 80*b* to be higher than the rigidity of the wiring member M80 in the other portions. The high rigidity of the wiring member M80 only in the first bonding portion 80*a* and/or the second bonding portion 80*b* improves the accuracy of positioning in the arrangement process in the first bonding portion 80*a* and/or the second bonding portion 80*b*. The high rigidity of the wiring member M80 only at the first bonding portion 80*a* and/or the second bonding portion 80*b* improves the reliability of the bonding process. As a result, the high rigidity of the wiring member M80 only in the first bonding portion 80*a* and/or the second bonding portion 80*b* improves the reliability of the bonding portion and improves the reliability of the semiconductor module 10.

The wiring member M80 may include an additional metal layer parallel to the metal layer 82. As a non-limiting example, an additional metal layer M96 is illustrated. The additional metal layer M96 adjusts the rigidity of the wiring member M80 to be high over the entire region between the first bonding portion 80*a* and the second bonding portion 80*b*.

In one aspect, the present embodiment provides the wiring member M80 having desirable rigidity. In another aspect, the present embodiment provides the wiring member M80 having partially different rigidity. These configurations make it possible to deliberately set the deformation of the wiring member M80. As a result, the present embodiment provides the semiconductor module 10 having high reliability related to the wiring member M80.

Twenty-Third Embodiment

The present embodiment is a modification example which is based on the preceding embodiment(s). In the preceding embodiment(s), the wiring member 80 includes the plurality of metal layers 82 arranged at equal intervals. The shape of the plurality of metal layers 82 in the wiring member 80 affects the inductance component in the signal path. A wiring member N80 of the present embodiment includes signal lines N82*g* and N82*s* arranged close to each other so as to suppress an inductance component. The present embodiment provides the semiconductor module 10 capable of increasing the switching speed.

Figure 28:
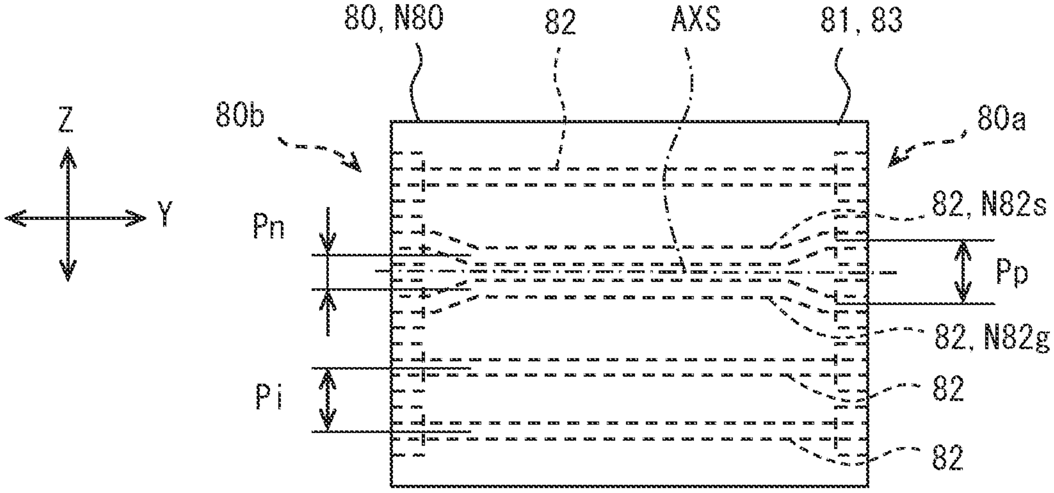
FIG. 28 is a plan view of a wiring member according to a twenty-third embodiment.

In FIG. 28, the wiring member 80 is provided by the wiring member N80. The wiring member N80 includes a plurality of metal layers 82. The plurality of metal layers 82 include a metal layer 82 providing a drive signal line N82*g* and a metal layer 82 providing a reference potential signal line N82*s*. When the semiconductor element 30 provides a MOSFET, the drive signal line N82*g* is a gate line. In this case, the reference potential signal line N82*s* is a source line. When the semiconductor element 30 provides an IGBT, the drive signal line N82*g* is a base line. In this case, the reference potential signal line N82*s* is an emitter line. When the speed of the switching operation of the semiconductor element 30 is increased, the inductance of a loop circuit including the drive signal line and the reference potential signal line hinders the increase in speed. In particular, in the case of the semiconductor element 30 made of SiC, which is expected to increase the speed, it is an important issue to suppress the inductance in the signal path.

The plurality of metal layers 82 are arranged so as to provide the pad pitch Pp of the plurality of signal pads in the first bonding portion 80*a*. The plurality of metal layers 82 are arranged so as to provide the terminal pitch Pi of the plurality of signal terminals 61 in the second bonding portion 80*b*. Further, the drive signal line N82*g* and the reference potential signal line N82*s* are arranged so as to form an inter-line pitch Pn between the first bonding portion 80*a* and the second bonding portion 80*b*. The line pitch Pn is smaller than the terminal pitch Pi (Pi>Pn). The line-to-line pitch Pn is smaller than the pad pitch Pp (Pp>Pn). At least one of the drive signal line N82*g* and the reference potential signal line N82*s* is disposed in a detour shape in the Y-Z plane so as to form an inter-line pitch Pn by transitioning to approach the other. In the present embodiment, both the drive signal line N82*g* and the reference potential signal line N82*s* are arranged in a detour shape so as to be close to each other. Both the drive signal line N82*g* and the reference potential signal line N82*s* are arranged so as to be line-symmetrical to each other with respect to an intermediate line CTL located in the middle of the two signal lines. The detour-shaped arrangement is provided by a shape including an oblique portion extending obliquely in the vicinity of the first bonding portion 80*a*, a linear portion extending linearly between the first bonding portion 80*a* and the second bonding portion 80*b*, and an oblique portion extending obliquely in the vicinity of the second bonding portion 80*b*.

In the present embodiment, the line pitch Pn increases the mutual inductance M between the drive signal line N82*g* and the reference potential signal line N82*s*. The mutual inductance M is larger than that when the line pitch is equal to the terminal pitch Pi or the pad pitch Pp. This reduces the inductance component of the loop circuit formed by the drive signal line N82*g* and the reference potential signal line N82*s*.

Further, the drive signal line N82*g* and the reference potential signal line N82*s* are provided by the metal layer 82 fixed by the resin layers 81 and 83. Therefore, the distance between the drive signal line N82*g* and the reference potential signal line N82*s* is less likely to vary than in wire bonding. Therefore, the inductance of the signal line is stabilized, and as a result, the SW element provided by the semiconductor element 30 can stably operate at high speed.

Twenty-Fourth Embodiment

The present embodiment is a modification example which is based on the preceding embodiment(s). In the preceding embodiment(s), the drive signal line N82*g* and the reference potential signal line N82*s* merely suppress the inductance of the loop circuit by increasing the mutual inductance M. In the present embodiment, the drive signal line N82*g* and the reference potential signal line N82*s* are provided by a stack of a plurality of metal layers electrically connected in parallel so as to reduce the inductance of the loop circuit. Also in the present embodiment, the semiconductor module 10 capable of increasing the switching speed is provided.

Figure 29:
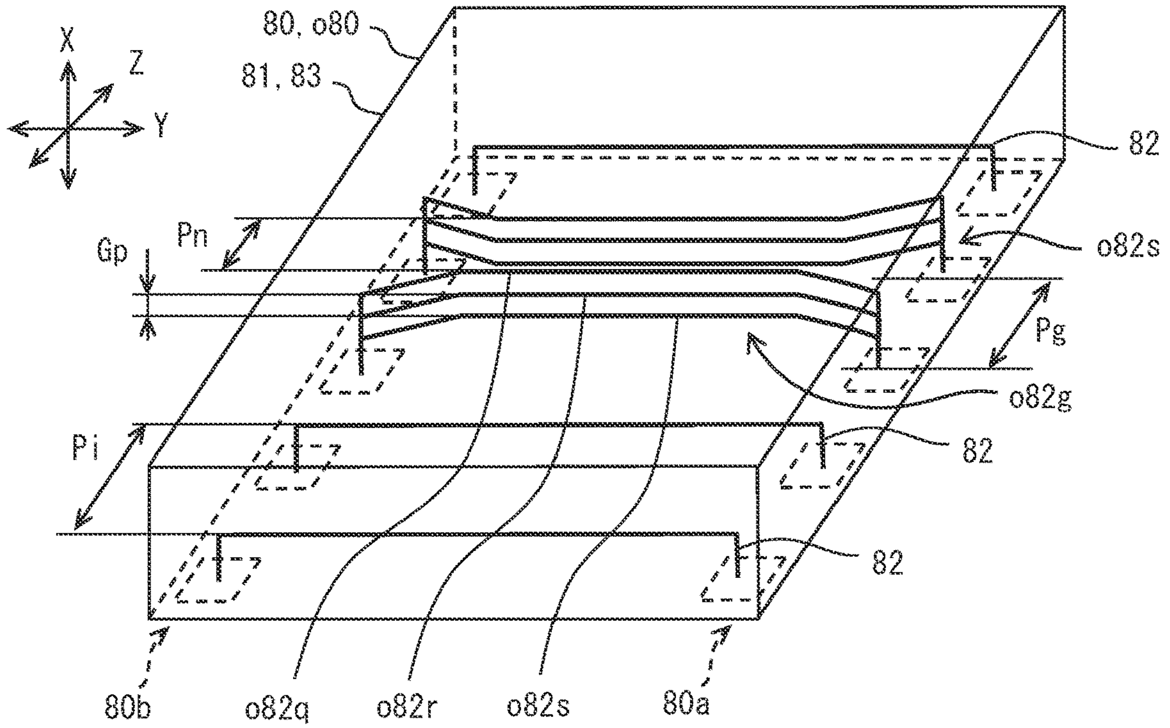
FIG. 29 is a perspective view of a wiring member according to a twenty-fourth embodiment.

In FIG. 29, the wiring member 80 is provided by a wiring member o80. The drive signal line o82*g* and the reference potential signal line o82*s* are provided by a stacked body of a plurality of metal layers electrically connected in parallel. Each of the drive signal line N82*g* and the reference potential signal line N82*s* includes a plurality of metal layers 82 stacked in the thickness direction X of the wiring member 80. The plurality of metal layers 82 are connected in parallel at the first bonding portion 80*a* and the second bonding portion 80*b*. As a non-limiting example, three metal layers 82 are illustrated. For example, the drive signal line o82*g* is provided by a stacked body of a metal layer o82*p*, a metal layer o82*q*, and a metal layer o82*r*. The plurality of metal layers o82*p*, o82*q*, and o82*r* are stacked at a distance Gp by the insulating layers provided by the resin layers 81 and 83. Similarly, the reference potential signal line o82*s* is also provided by a stacked body of three metal layers. Further, in the present embodiment, the stacked body of the plurality of metal layers providing the drive signal line o82*g* and the stacked body of the plurality of metal layers providing the reference potential signal line o82*s* are arranged so as to form the inter-line pitch Pn.

According to the present embodiment, the inductance of the loop circuit can be suppressed. One configuration for suppressing the inductance is a configuration in which the drive signal line o82*g* and the reference potential signal line o82*s* are brought close to the inter-line pitch Pn. Thus, the inductance of the loop circuit is suppressed by increasing the mutual inductance between the drive signal line o82*g* and the reference potential signal line o82*s*. Another configuration for suppressing the inductance is a configuration in which each of the drive signal line o82*g* and the reference potential signal line o82*s* is provided by a stacked body of a plurality of electrically parallel metal layers. This suppresses both the inductance of the drive signal line o82*g* itself and the inductance of the reference potential signal line o82*s* itself. As a result, in the present embodiment, the SW element provided by the semiconductor element 30 can be operated at high speed.

In the present embodiment, the drive signal line o82*g* and the reference potential signal line o82*s* may be arranged without being close to each other. Also in this case, the stack of metal layers suppresses the inductance.

Twenty-Fifth Embodiment

The present embodiment is a modification example which is based on the preceding embodiment(s). In the embodiment illustrated in FIG. 9, the recess 686 has a thickness of at least one resin layer. In the present embodiment, the wiring member P80 is formed of a single resin layer 81. The wiring member P80 defines the recess 86 only by a part of the resin layer 81. The recess 86 includes a recess P86*a* and a recess P86*b*. Also in the present embodiment, the recesses P86*a* and P86*b* allow excessive intrusion of the bonding member 70 in the bonding process. As a result, the semiconductor module 10 in which performance degradation due to the excessive bonding member 70 is suppressed is provided.

Figure 30:
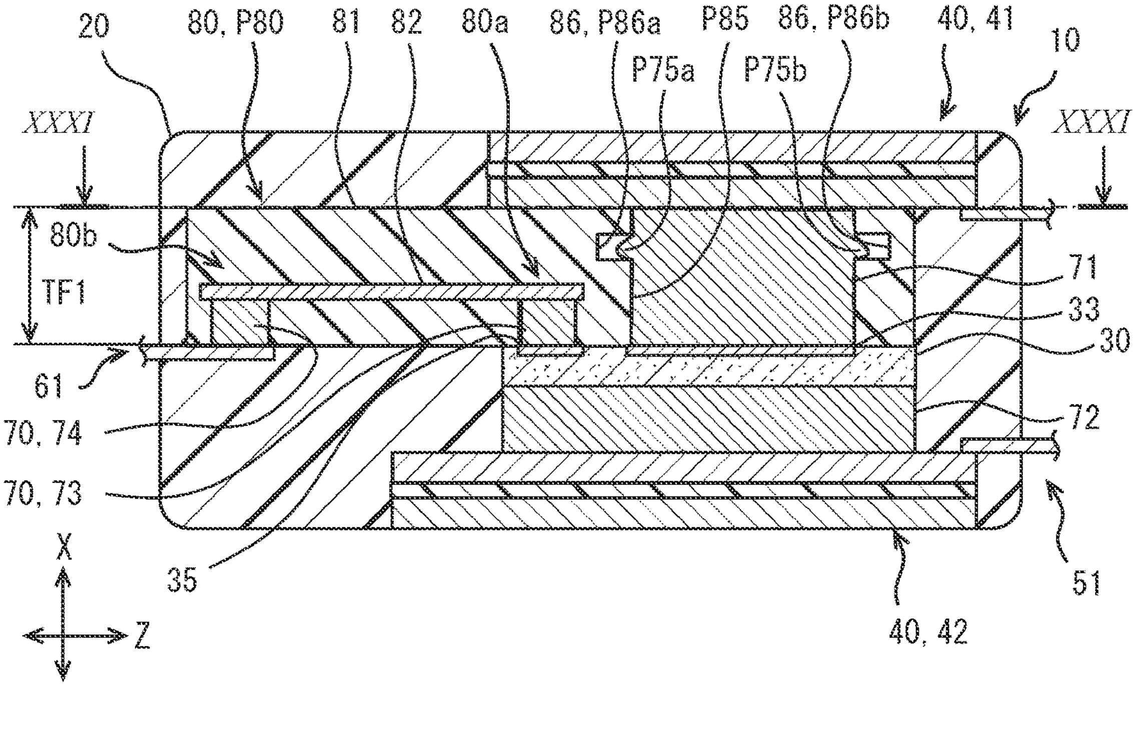
FIG. 30 is a cross-sectional view of a semiconductor module according to a twenty-fifth embodiment.

In FIG. 30, the semiconductor module 10 includes a wiring member P80. The wiring member 80 is provided by a wiring member P80. The wiring member P80 is disposed between the semiconductor element 30 and the first heat dissipation member 41. The wiring member P80 includes a metal layer 82 that electrically connects the signal pad 35 and the signal terminal 61. The wiring member P80 is formed of a single resin layer 81. The resin layer 81 defines an opening P85 for the first bonding member 71. In the bonding process, the opening P85 defines the shape of the first bonding member 71 in a fluid state, and functions as a molding wall that defines the shape of the first bonding member 71 when the first bonding member 71 is cured again. The first bonding member 71 has a polygonal columnar shape.

The resin layer 81 has a recess P86*a* that opens to the opening P85 and communicates with the opening P85. The resin layer 81 has a recess P86*b* that opens to the opening P85 and communicates with the opening P85. The recess P86*a* and the recess P86*b* open at different positions toward the opening P85. The recess P86*a* and the recess P86*b* are positioned so as to face each other and open.

Figure 31:
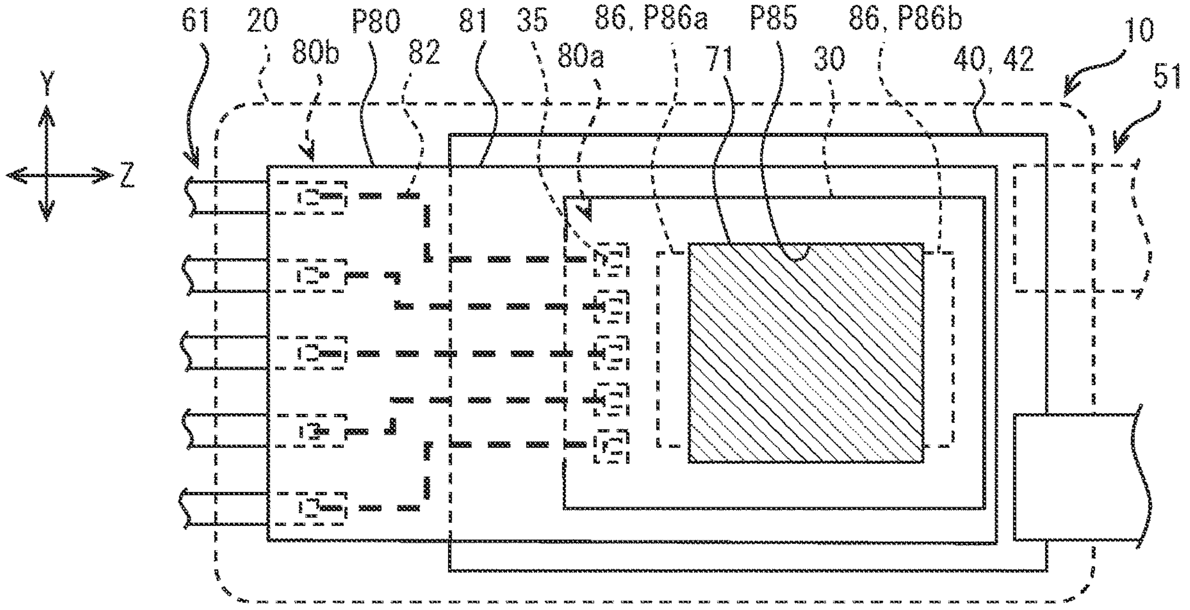
FIG. 31 is a partial cross-sectional view of the semiconductor module.

FIG. 31 is a partial cross-sectional view taken along line XXXI-XXXI of FIG. 30 in a state where the resin member 20 is removed. The opening P85 defined by the wiring member P80 has a polygonal columnar shape. In the illustrated example, an opening P85 that can be referred to as a quadrangular prism or a quadrangular prism is defined. The recess P86*a* and the recess P86*b* are arranged on different wall surfaces among the plurality of wall surfaces defining the opening P85. At least one of the recesses P86*a* and P86*b* is open over substantially the entire width of the wall surface defining the opening P85 in the Y direction (width direction). Alternatively, at least one of the recesses P86*a* and P86*b* may be open only in a part of the entire width of the wall surface defining the opening P85. The concave portions P86*a* and P86*b* are formed in a groove shape having a longitudinal direction in the Y direction by being elongated only in the Y direction.

The recess P86*a* and the recess P86*b* surround the opening P85 and are disposed on wall surfaces facing each other. The recessed P86*a* and the recess P86*b* can be formed in at least one wall surface among a plurality of wall surfaces defining the opening P85. Further, the recess P86*a* and the recess P86*b* may be opened in a continuous groove shape so as to surround the opening P85.

The method of manufacturing the semiconductor module 10 includes an arrangement process of arranging the semiconductor element 30, the wiring member P80, and the first heat dissipation member 41 in a stacked manner. In the arrangement process, the first bonding member 71 is arranged in the opening P85. The method of manufacturing the semiconductor module 10 further includes a bonding process of bonding the semiconductor element 30 and the first heat dissipation member 41 to each other by melting the first bonding member 71 and curing the first bonding member 71 again after the arrangement process. In the bonding process, the opening P85 forms the shape of the first bonding member 71. When the amount of the first bonding member 71 is appropriate in the bonding process, the first bonding member 71 bonds the semiconductor element 30 and the first heat dissipation member 41 without flowing into the recesses P86*a* and P86*b*. On the other hand, when an excessive amount of the first bonding member 71 is disposed, the first bonding member 71 melted in the bonding process flows into the recesses P86*a* and P86*b* so as to be pushed out toward the recesses P86*a* and P86*b*.

Further, in the present embodiment, the wiring member P80 defines the distance and parallelism between the semiconductor element 30 and the first heat dissipation member 41. Therefore, unintended inclination of the semiconductor element 30 with respect to the first heat dissipation member 41 is suppressed. The wiring member P80 makes it possible to manage the distance and parallelism of the semiconductor element 30 with respect to the first heat dissipation member 41 with high accuracy. As a result, good electrical connection can be provided at the power pads 33 and the signal pads 35.

According to the present embodiment, performance degradation of the semiconductor module 10 due to an excessive amount of the first bonding member 71 is suppressed. As a result, the semiconductor module 10 in which performance degradation due to the excessive first bonding member 71 is suppressed is provided.

Twenty-Sixth Embodiment

The present embodiment is a modification example which is based on the preceding embodiment(s). In the preceding embodiment(s), the recesses P86*a* and P86*b* have a groove shape elongated in the Y direction. The recess 86 can be provided by a variety of shapes. In the present embodiment, the recess 86 is provided by a recess Q86. The recess Q86 includes two grooves having longitudinal directions in both the Y direction (width direction) and the X direction (thickness direction). The present embodiment shows a non-limiting example of the opening shape of the recess. The recesses can have a variety of opening shapes, such as circular, polygonal, and cross-shaped as shown.

Figure 32:
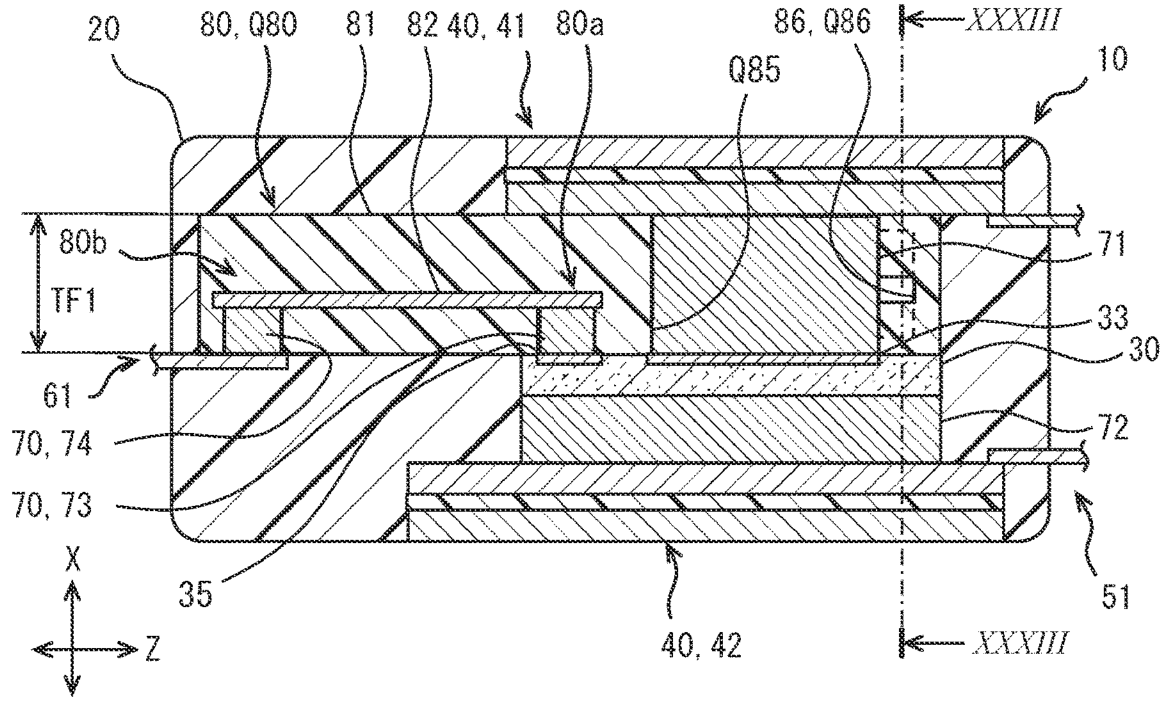
FIG. 32 is a cross-sectional view of a semiconductor module according to a twenty-sixth embodiment.

In FIG. 32, the wiring member 80 is provided by a wiring member Q80. The wiring member Q80 is disposed between the semiconductor element 30 and the first heat dissipation member 41 so as to overlap the semiconductor element 30 and the first heat dissipation member 41. The wiring member Q80 defines an opening Q85 for accommodating the first bonding member 71. Further, the wiring member Q80 includes a recess Q86 in the wall surface of the opening Q85.

Figure 33:
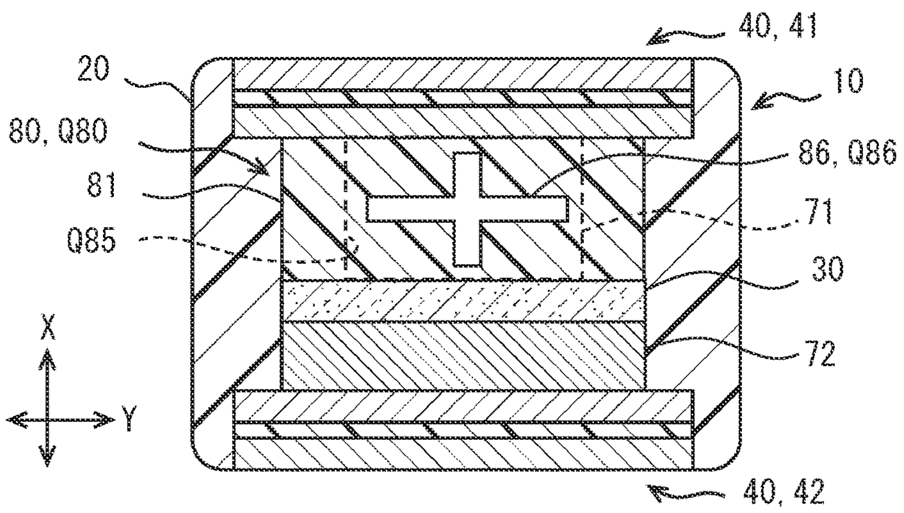
FIG. 33 is a cross-sectional view of the semiconductor module.

FIG. 33 shows a cross section taken along line XXXIII-XXXIII of FIG. 32. The recess Q86 has a horizontal groove portion elongated in the Y direction and a vertical groove portion elongated in the X direction. Note that the vertical and horizontal designations are for convenience and do not indicate the installation state of the semiconductor module 10. The horizontal groove portion is a groove having a longitudinal direction in the Y direction, and communicates with the opening Q85 through an elongated opening. The vertical groove portion is a groove having a longitudinal direction in the X direction, and communicates with the opening Q85 through an elongated opening. The horizontal groove portion and the vertical groove portion intersect with each other. The horizontal groove portion and the vertical groove portion communicate with each other at these groove portions.

Twenty-Seventh Embodiment

The present embodiment is a modification example which is based on the preceding embodiment(s). In the preceding embodiment(s), the recess Q86 extends straight in a primary direction away from the opening, i.e. in a depth direction. In the present embodiment, the recess 86 is provided by a recess R86. The recess R86 also extends in a secondary direction intersecting the primary direction away from the opening R85. The recess R86 includes two grooves having longitudinal directions in both the Y direction (width direction) and the X direction (thickness direction). The present embodiment shows a non-limiting example of the internal shape of the recess. The recess may have various branched internal shapes such as an F shape, a T shape, and a cross shape, or various curved internal shapes such as a J shape and an L shape.

Figure 34:
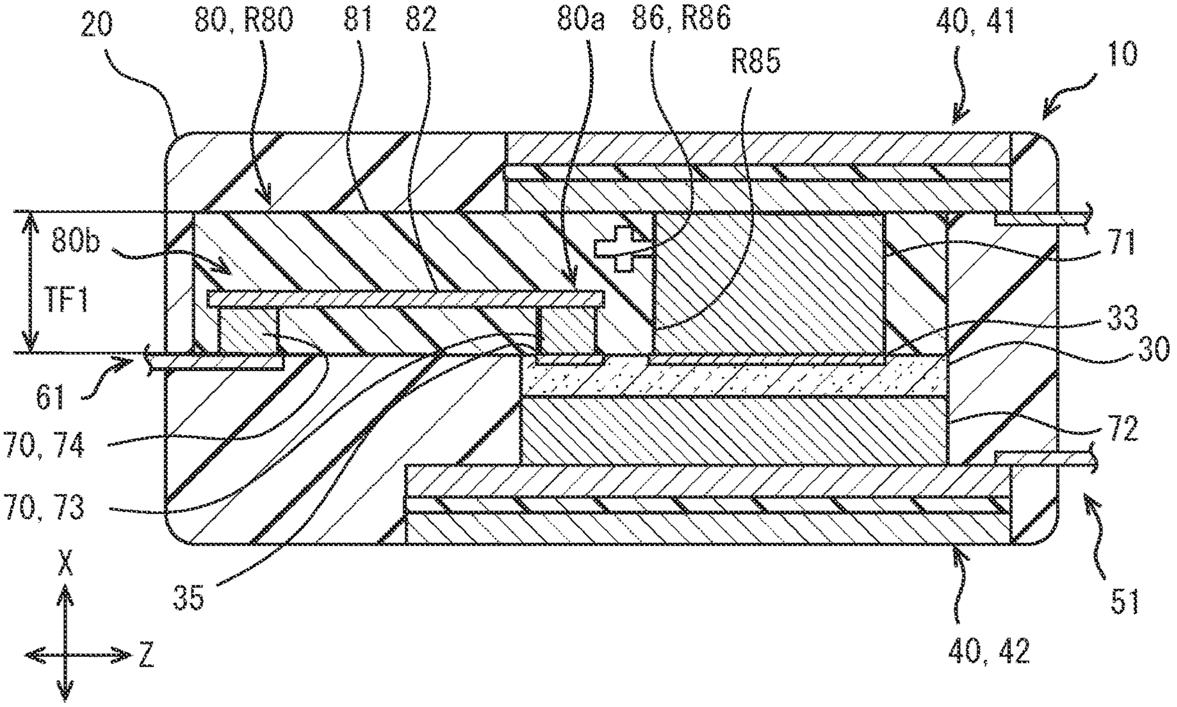
FIG. 34 is a cross-sectional view of a semiconductor module according to a twenty-seventh embodiment.

In FIG. 34, the wiring member 80 is provided by a wiring member R80. The wiring member R80 defines an opening R85 for the first bonding member 71. The wiring member R80 has a recess R86. The recess R86 opens to the inner wall surface of the opening R85. The recess R86 extends in a direction away from the opening R85. The direction away from the opening R85 can also be referred to as the depth direction of the recess R86. Further, the recess R86 has a branch portion branching from the depth direction at a position away from the opening R85. The recess R86 may comprise one or more branches. The branch portion may include an upward branch extending upward in the gravity direction with respect to the posture in the bonding process. In this case, the upward branch may be suitable for use in accumulating a gaseous component. The gas component accumulated in the upward branch may adjust the pressure in the recess R86 and adjust the inflow of the bonding member 70 into the recess R86. The branch portion may include a downward branch extending downward in the gravity direction with respect to the posture in the bonding process. In this case, the downward branch may be suitable for an application of quickly accumulating the bonding member 70 in a fluid state. The downward branch may accumulate the bonding member 70 in an early stage of the bonding process and limit the amount of the bonding member 70 flowing into the recess R86 in a later stage of the bonding process.

Twenty-Eighth Embodiment

The present embodiment is a modification example which is based on the preceding embodiment(s). In the preceding embodiment(s), the bonding member disposed in the opening in the arrangement process may be insufficient more than an appropriate amount. In this case, the bonding member after the bonding process may include voids. The voids may cause current concentration, heat concentration, a decrease in heat transfer amount, a decrease in mechanical strength of the bonding member, stress concentration, and the like in the bonding member. The defects caused by these voids may affect the performance of the semiconductor module 10. The present embodiment suppresses defects caused by a shortage of the bonding member. In the present embodiment, the recess 86 is provided by the recess S86.

Figure 35:
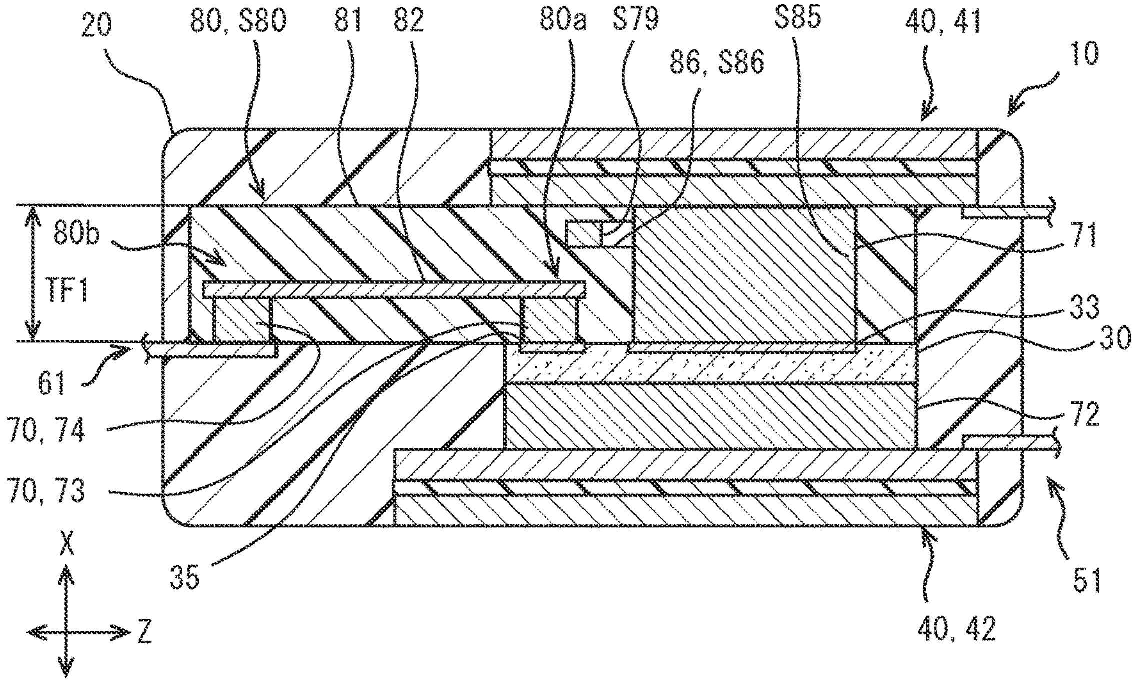
FIG. 35 is a cross-sectional view of a semiconductor module according to a twenty-eighth embodiment.

In FIG. 35, the wiring member S80 defines an opening S85 for the first bonding member 71. The wiring member S80 has a recess S86. The recess S86 accommodates the preliminary bonding member S79. The preliminary bonding member S79 is used for bonding the semiconductor element 30 and the first heat dissipation member 41 when the main first bonding member 71 is insufficient more than an appropriate amount. The preliminary bonding member S79 is a bonding member that is provided in advance in order to supplement the shortage of the main first bonding member 71. In the bonding process of the manufacturing method, the preliminary bonding member S79 may be mixed with the first bonding member 71 to form the continuous bonding member 70. In this case, in the state of the finished product of the semiconductor module 10, the preliminary bonding member S79 does not remain in the recess S86. In rare cases, the preliminary bonding member S79 may remain in the recess S86 in the completed semiconductor module 10. The illustrated example shows a case where the preliminary bonding member S79 remains. Alternatively, it may be understood that the illustrated example shows the preliminary bonding member S79 before melting before the bonding process.

The preliminary bonding member S79 is disposed in the recess S86 before the bonding process in the manufacturing method. In a typical example, the preliminary bonding member S79 is disposed in the recess S86 in the preparation process. The preliminary bonding member S79 is disposed so as not to fill the recess S86 before the bonding process. The preliminary bonding member S79 is disposed so as to leave a cavity inside the recess S86 before the bonding process. When the first bonding member 71 is excessive, the cavity is used to accommodate the excessive portion. The preliminary bonding member S79 is also referred to as a preform bonding member. In the case where the bonding member 70 is solder, the preliminary bonding member S79 is also called preform solder.

In the preparation process or the arrangement process of the manufacturing method, the preliminary bonding member S79 is positioned in the recess S86. In the arrangement process, the preliminary bonding member S79 is arranged so as to face the first bonding member 71 before melting through the recess S86. In this state, the preliminary bonding member S79 and the first bonding member 71 are separate masses of the bonding member 70.

In the first half of the bonding process, the preliminary bonding member S79 and the first bonding member 71 are heated and shifted to a molten state. The molten preliminary bonding member S79 can flow in the recess S86. At the same time, the first bonding member 71 can flow into the recess S86 and flow through the recess S86. When the preliminary bonding member S79 in the fluid state and the first bonding member 71 in the fluid state meet each other, the preliminary bonding member S79 and the first bonding member 71 are mixed with each other and transition to a continuous state. When the preliminary bonding member S79 and the first bonding member 71 are cooled in the latter half of the bonding process, they are cured again.

In the bonding process, when the first bonding member 71 is insufficient more than an appropriate amount, the preliminary bonding member S79 compensates for the insufficiency of the first bonding member 71. As a result, a good bonding state is formed between the semiconductor element 30 and the first heat dissipation member 41. On the other hand, when the first bonding member 71 is excessive, the excessive portion flows into the recess S86. As a result, a good bonding state is formed between the semiconductor element 30 and the first heat dissipation member 41. As described above, according to the present embodiment, even when the first bonding member 71 is excessive or insufficient, a good bonding state can be formed.

Twenty-Ninth Embodiment

The present embodiment is a modification example which is based on the preceding embodiment(s). In the preceding embodiment(s), the recess 86 is provided so as to open to the opening that accommodates the first bonding member 71. The recess 86 may be provided at various positions to absorb an excessive amount of the bonding member 70. The present embodiment shows a non-limiting example of the position where the recess is provided. The recess 86 includes a recess T86*a* that opens to an opening portion that accommodates the third bonding member 73.

Figure 36:
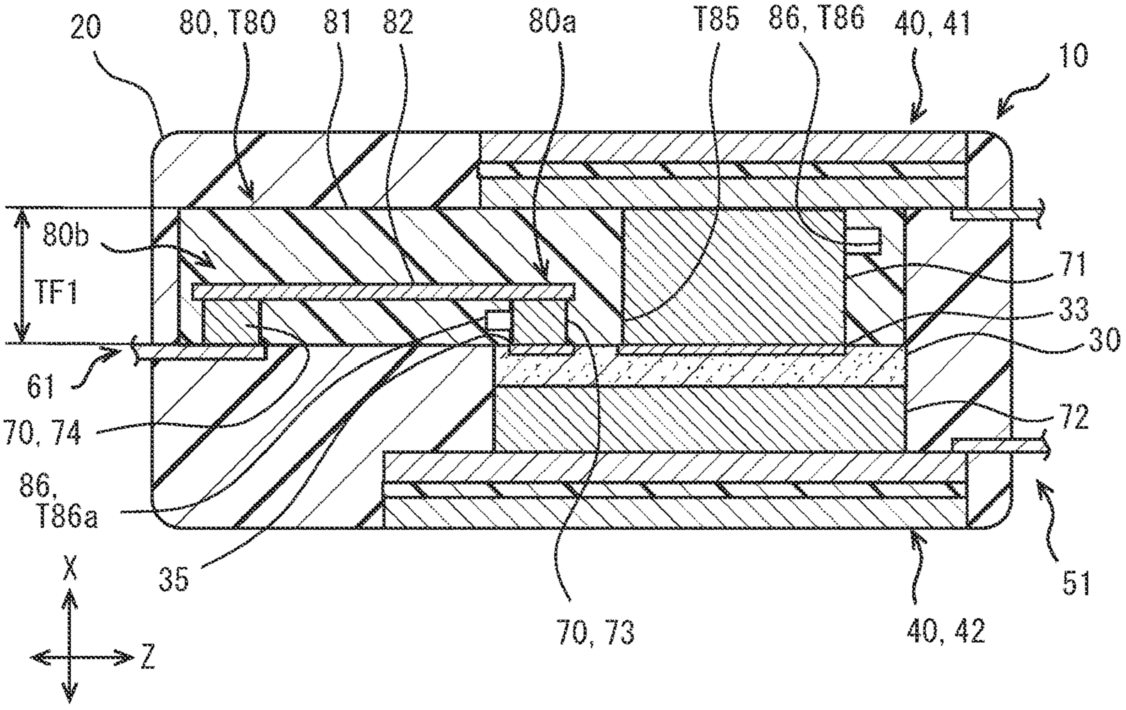
FIG. 36 is a cross-sectional view of a semiconductor module according to a twenty-ninth embodiment.

In FIG. 36, the wiring member 80 is provided by a wiring member T80. The wiring member T80 includes a recess T86. The recess T86 is open to communicate with the opening T85 that accommodates the first bonding member 71. The wiring member T80 further includes a recess T86*a*. The recess T86*a* is open so as to communicate with an opening that accommodates the third bonding member 73. The opening for accommodating the third bonding member 73 is provided by the first bonding portion 80*a* or a window portion formed in the resin layer 81 so as to form the first bonding portion 80*a*. The recess T86*a* can accommodate an excess amount of the third bonding member 73.

Thirtieth Embodiment

The present embodiment is a modification example which is based on the preceding embodiment(s). In the preceding embodiment(s), the resin member 20 completely encloses the wiring member 80 disposed between the signal pad 35 of the semiconductor element 30 and the signal terminal 61. In other words, at least a part of the signal terminal 61 is enclosed in the resin member 20. Alternatively, a part of the wiring member 80 may extend out from the resin member 20.

Figure 37:
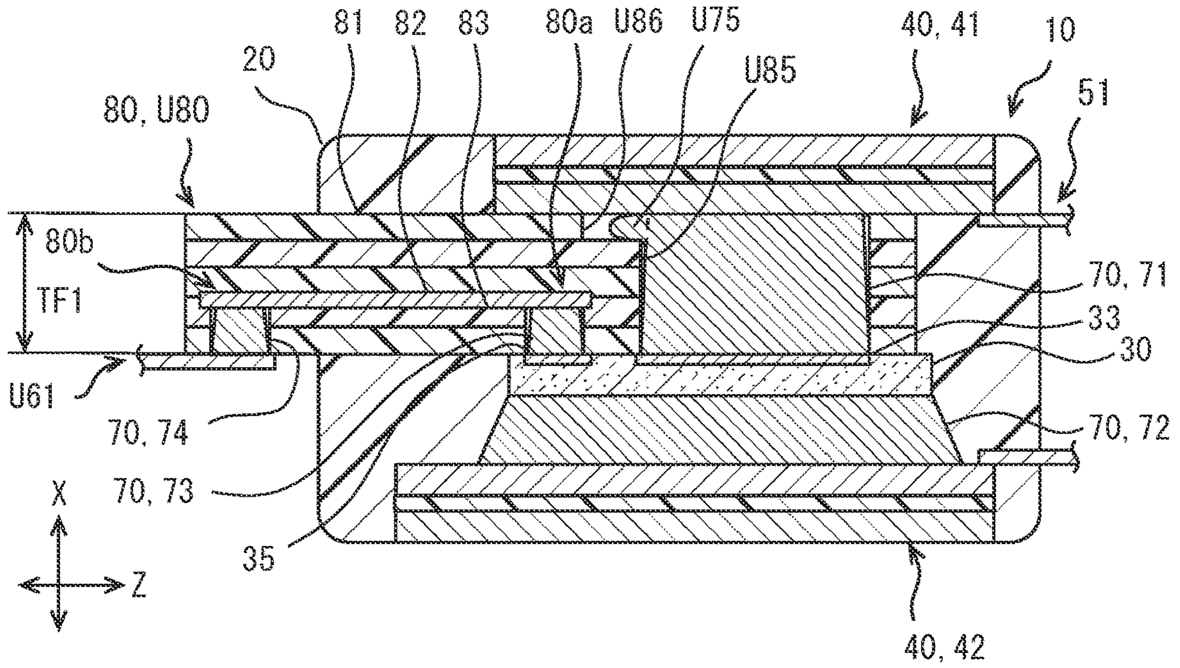
FIG. 37 is a cross-sectional view of a semiconductor module according to a thirtieth embodiment.

In FIG. 37, the wiring member 80 is provided by a wiring member U80. The wiring member U80 extends from the resin member 20. The wiring member U80 is bonded to the signal terminal U61 by the fourth bonding member 74 at the second bonding portion 80*b*. The signal terminal U61 is a terminal that provides a signal path. The signal terminal U61 can be provided by, for example, a terminal provided on the printed circuit board, a land of the printed circuit board, or a covered electric wire connected to the printed circuit board.

Thirty-First Embodiment

The present embodiment is a modification example which is based on the preceding embodiment(s). In the preceding embodiment(s), the signal terminal 61 and the wiring member 80 are arranged in parallel so as to partially overlap the semiconductor element 30. Therefore, the signal terminals 61 extend parallel to the Y-Z plane. Alternatively, the signal terminals 61 may be arranged parallel to the X-Y plane. In this case, the direction of the signal path can be bent inside the resin member 20 by using the flexibility of the wiring member 80.

Figure 38:
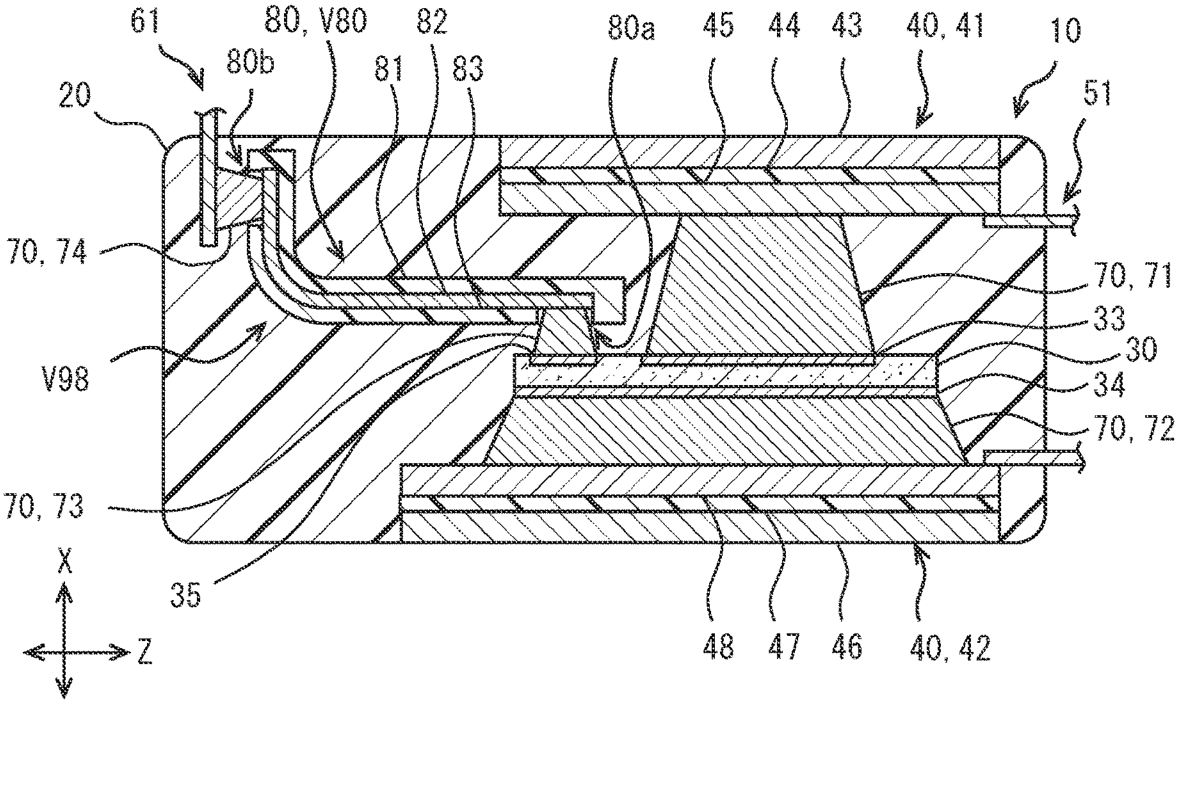
FIG. 38 is a cross-sectional view of a semiconductor module according to a thirty-first embodiment.

In FIG. 38, the wiring member 80 is provided by a wiring member V80. The wiring member V80 has a substantially right-angled bent portion V98 in the resin member 20. The semiconductor module 10 includes a plurality of signal terminals 61. The plurality of signal terminals 61 extend from the resin member 20 in parallel with the X-Y plane. The plurality of signal terminals 61 extend parallel to the X direction. The plurality of signal terminals 61 are arranged in a row along the Y direction. The wiring member 80 is disposed between the plurality of signal pads 35 and the plurality of signal terminals 61 via the bent portion V98. In the present embodiment, the extending direction of the signal terminal 61 can be adjusted inside the resin member 20 by using the flexibility of the wiring member V80.

OTHER EMBODIMENTS

The disclosure in this specification, the drawings, and the like is not limited to the illustrated embodiments. The disclosure includes the illustrated embodiments and variations thereof by those skilled in the art. For example, the present disclosure is not limited to the combinations of components and/or elements shown in the embodiments. The disclosure can be implemented in various combinations. The disclosure may have additional parts that may be added to the embodiments. The disclosure encompasses modifications in which components and/or elements are omitted from the embodiments. The disclosure encompasses the replacement or combination of components and/or elements between one embodiment and another. The disclosed technical scope is not limited to the description of the embodiments. Several technical scopes disclosed are indicated by descriptions in the claims and should be understood to include all modifications within the meaning and scope equivalent to the descriptions in the claims.

The disclosure in the specification, the drawings and the like is not limited by the recitation of the claims. The disclosure in the specification, the drawings, and the like encompasses the technical ideas described in the claims, and further extends to a wider variety of technical ideas than those in the claims. Therefore, various technical ideas can be extracted from the disclosure of the specification, the drawings and the like without being limited to the recitation of the claims.

In the embodiment(s) described in this specification, in the semiconductor module 10, the heat dissipation member 40 is disposed to be exposed on both surfaces of the plate-like outer shape of the semiconductor module 10. Alternatively, the heat dissipation member 40 may be disposed only on one surface of the semiconductor module 10. For example, the semiconductor module 10 may have only the first heat dissipation member 41 or only the second heat dissipation member 42. The heat dissipation member 40 serves as both a member for dissipating heat and a member for providing a power path. Alternatively, the heat dissipation member 40 may be used as a member exclusively responsible for heat dissipation or a member exclusively responsible for a power path. For example, the spacer member D77 can be used as a power terminal.

What is claimed is:

1. A semiconductor module comprising:

a semiconductor device having a signal pad for a signal path and a power pad for a power path that allows an electric power greater than an electric power at the signal pad;

a heat dissipation member thermally bonded to the semiconductor element;

a resin member accommodating the semiconductor element so that a part of the heat dissipation member is exposed;

a signal terminal made of a metal and disposed so as to be exposed from the resin member; and a wiring member accommodated in the resin member, the wiring member being a member more flexible than the signal terminal, the wiring member including an electrically insulating resin layer and a metal layer supported by the resin layer, the wiring member having a first bonding portion at which the metal layer is connected to the signal pad and a second bonding portion at which the metal layer is connected to the signal terminal.

2. The semiconductor module according to claim 1, wherein the semiconductor element includes a plurality of semiconductor elements, and the plurality of semiconductor elements are connected to the signal terminal by the wiring member.

3. The semiconductor module according to claim 1, further comprising:

a bonding member bonding between the semiconductor element and the heat dissipation member and/or between the signal pad and the metal layer, wherein the wiring member defines an opening surrounding the bonding member and has a recess communicating with the opening.

4. The semiconductor module according to claim 1, wherein the wiring member includes a metal layer extending over both the signal pad and the power pad and bonded to the power pad.

5. The semiconductor module according to claim 1, wherein the wiring member includes a communication portion through which the resin member passes.

6. The semiconductor module according to claim 1, wherein the wiring member positions the semiconductor element and the heat dissipation member.

7. The semiconductor module according to claim 1, further comprising:

a pair of power terminals electrically connected to the power pad, wherein the wiring member reaches a position between the pair of power terminals, and positions the pair of power terminals in a stacked manner so as to overlap on opposite surfaces of the wiring member.

8. The semiconductor module according to claim 1, further comprising:

a conductive spacer member disposed between the power pad and the heat dissipation member.

9. The semiconductor module according to claim 1, wherein the wiring member includes an additional metal layer that is insulated from the metal layer as a signal line, and is configured to adjust rigidity of the wiring member.

10. The semiconductor module according to claim 9, wherein the additional metal layer is disposed so as to overlap the metal layer and is grounded to a reference potential of the semiconductor element.

* * * * *